United States Patent [19]

Takasaki

[11] Patent Number: 5,584,020

[45] Date of Patent: *Dec. 10, 1996

[54] FAULT SIMULATOR COMPRISING A SIGNAL GENERATING CIRCUIT AND A SIMULATION CIRCUIT IMPLEMENTED BY HARDWARE

[75] Inventor: Shigeru Takasaki, Tokyo, Japan

[73] Assignee: NEC Corporation, Tokyo, Japan

[ * ] Notice: The term of this patent shall not extend beyond the expiration date of Pat. No. 5,410,678.

[21] Appl. No.: 402,050

[22] Filed: Mar. 10, 1995

Related U.S. Application Data

[63] Continuation of Ser. No. 819,332, Jan. 10, 1992, Pat. No. 5,410,678.

[30] Foreign Application Priority Data

Jan. 6, 1991 [JP] Japan .................................. 4-122
Jan. 11, 1991 [JP] Japan .................................. 3-12613
Feb. 19, 1991 [JP] Japan .................................. 3-24277

[51] Int. Cl.⁶ .................................................... G06F 17/50
[52] U.S. Cl. ...................... 395/500; 364/578; 395/183.09
[58] Field of Search ................................ 395/500, 183.09, 395/183.12; 364/578, 489

[56] References Cited

U.S. PATENT DOCUMENTS 3,614,608  10/1971  Gedd et al. ........................ 324/73.1
3,702,011  10/1972  Armstrong ........................ 395/183.09
3,775,598  11/1973  Chas et al. .............................. 371/23
4,725,975   2/1988  Sasaki ..................................... 395/500
4,763,289   8/1988  Barizilai et al. ........................ 364/578
4,782,440  11/1988  Nomizu et al. ........................ 395/500
4,890,238  12/1989  Klein et al. .............................. 364/491
4,918,594   4/1990  Onizuka ................................. 395/500
4,937,765   6/1990  Shupe et al. ........................... 364/570
5,105,374   4/1992  Yoshida .................................. 364/578

*Primary Examiner*—Parshotam S. Lall
*Assistant Examiner*—Viet Vu
*Attorney, Agent, or Firm*—Foley & Lardner

[57] ABSTRACT

In a fault simulator for simulating a logic circuit model which is operable in response to first through n-th input pattern signals, a signal generating circuit implemented by hardware generates the first through the n-th input pattern signals. The logic circuit model is assorted into first through m-th levels and is defined by first through p-th faults. The fault simulator carries out a plurality of simulations at the same time in each of the first through the m-th levels. When the simulation proceeds to the m-th level, the fault simulator produces a simulation result signal representative of detected faults and a correct value. The fault simulator simulates the first through the p-th faults by the use of each of the first through the n-th input pattern signals.

14 Claims, 35 Drawing Sheets

FIG. 2(a)

| ATGP | P₃ | P₂ | P₁ |     |
|------|----|----|----|-----|
| 1    | 0  | 1  | 0  | → (101) |
| 1    | 0  | 0  | 1  | → (102) |
| 0    | 0  | 0  | 1  | → (103) |
| 1    | 0  | 1  | 0  | → (104) |
| 0    | 1  | 0  | 0  | → (105) |

FIG. 2(b)

| P₃ | P₂ | P₁ |               |
|----|----|----|---------------|
| 1  | 0  | 0  | CORRECT VALUE |
| f₉ | f₃ | f₂ | DETECTED FAULT |
|    | f₅ | f₆ |               |
|    |    | f₁₀|               |

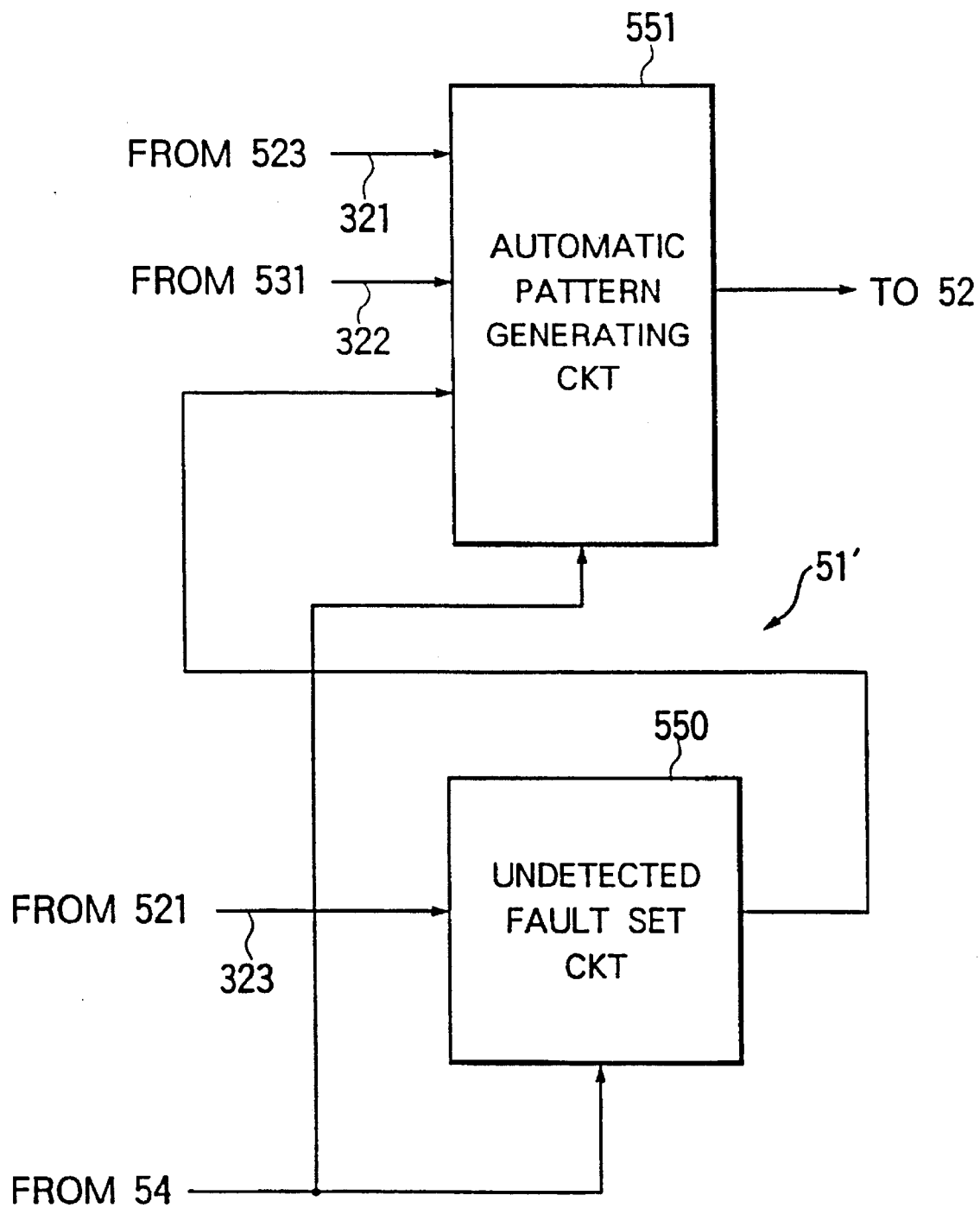
F I G. 12

|    |   |   |   |   |
|----|---|---|---|---|
| D₁ |   |   | 1 | 0 |
| D₂ |   |   | 1 | 0 |
| D₃ |   |   | 1 | 0 |
| D₄ |   |   | 1 | 0 |
| C₁ | 1 | 1 | 0 | 0 |
| C₂ | 1 | 0 | 1 | 0 |

FIG. 16

| P15 | P14 | P13 | P12 | P11 | |
|---|---|---|---|---|---|
| 1 | 1 | 1 | 0 | 0 | CORRECT VALUE |
| f9 | f4 f8 | f1 f7 | f3 f5 | f2 f6 f10 | DETECTED FAULT |

| $P_{15}$ | $P_{14}$ | $P_{13}$ | $P_{12}$ | $P_{11}$ | |
|---|---|---|---|---|---|
| 1<br>1 | 1<br>1 | 1<br>1 | 0<br>0 | 0<br>0 | CORRECT<br>VALUE |
| $f_9$ | $f_4$<br>$f_8$ | $f_1$<br>$f_7$ | $f_3$<br>$f_5$ | $f_2$<br>$f_6$<br>$f_{10}$ | DETECTED FAULT<br>DETECTED<br>FROM 127 |
| | $f_{14}$<br>$f_{18}$ | $f_{11}$<br>$f_{17}$ | $f_{13}$<br>$f_{15}$ | $f_{12}$<br>$f_{16}$<br>$f_{19}$ | DETECTED FAULT<br>DETECTED<br>FROM 128 |

5,584,020

FAULT SIMULATOR COMPRISING A SIGNAL GENERATING CIRCUIT AND A SIMULATION CIRCUIT IMPLEMENTED BY HARDWARE

This application is a continuation of application Ser. No. 07/819,332, filed Jan. 10, 1992, now U.S. Pat. No. 5,410,678.

BACKGROUND OF THE INVENTION

This invention relates to a fault simulator and a simulation method which are for use in simulating a logic circuit model.

A conventional simulation has been proposed by M. A. Breuer and A. D. Friedman in "Diagnosis & Reliable Design of Digital Systems", pages 25–162 and pages 224–241, published by Computer Science Press, Inc. (Maryland) and is carried out by the use of software. When a logic circuit of a large scale is simulated by software in a manner mentioned by M. A. Breuer et al, a very long time is necessary because a simulation time for the simulation is proportional to a square of the scale of the logic circuit, as known in the art.

In U.S. Pat. No. 4,725,975 issued to Tohru Sasaki, assignor to NEC Corporation, a simulator simulates a logic circuit model by dividing the model into logic blocks and classifying the blocks by levels according to flow of signals in the model. The simulations are successively carried out by logic operations of the blocks on each level.

However, the simulation is carried out one by one by supplying a single kind of input logic values or signals to a single model. This means that the single kind of the input logic signals alone is given to simulate the single model. Accordingly, it takes an extremely long time to simulate the fault simulation operations of each model because a wide variety of faults take place at each model.

SUMMARY OF THE INVENTION

It is therefore an object of this invention to provide a fault simulator which can carry out simulations of a logic circuit model at high speed.

Other objects of this invention will become clear as the description proceeds.

On describing the gist of this invention, it is possible to understand that a fault simulator is for use in simulating a logic circuit model which is operable in response to first through n-th input pattern signals where n represents a natural number greater than unity. According to this invention, the fault simulator comprises signal generating means implemented by hardware for generating the first through said n-th input pattern signals, simulation means implemented by hardware and connected to the signal generating means and supplied with the first through the n-th input pattern signals for carrying out first through p-th simulations of the logic circuit model to produce first through p-th simulation result signals which are representative of results of the first through the p-th simulations, respectively, where p represents a natural number greater than unity, each of the first through the p-th simulation result signals comprising correct value data representative of a correct value defined in each of the first through the n-th input pattern signals and detected fault data detected by the first through the p-th simulations, result data memory means connected to the simulation means for memorizing the first through the p-th simulation result signals as first through p-th memorized result signals, and control means implemented by hardware and connected to the signal generating means, the simulation means, and the result data memory means for controlling the signal generating means to make the signal generating means generate the first through the n-th input pattern signals and for controlling the simulation means to make the simulation means carry out the first through the p-th simulations.

BRIEF DESCRIPTION OF THE DRAWING

FIGS. 2a and 2b respectively, show examples of input pattern signals which are applied to a fault simulator according to this invention and an example of detected faults and correct values which are detected by a simulation operation according to this invention;

FIG. 12 is a block diagram of another example of the signal generating circuit illustrated in FIG. 3;

FIG. 16 shows an example of input pattern signals which are supplied to the logic circuit model illustrated in FIG. 15;

DESCRIPTION OF THE PREFERRED EMBODIMENTS

Figure 1:
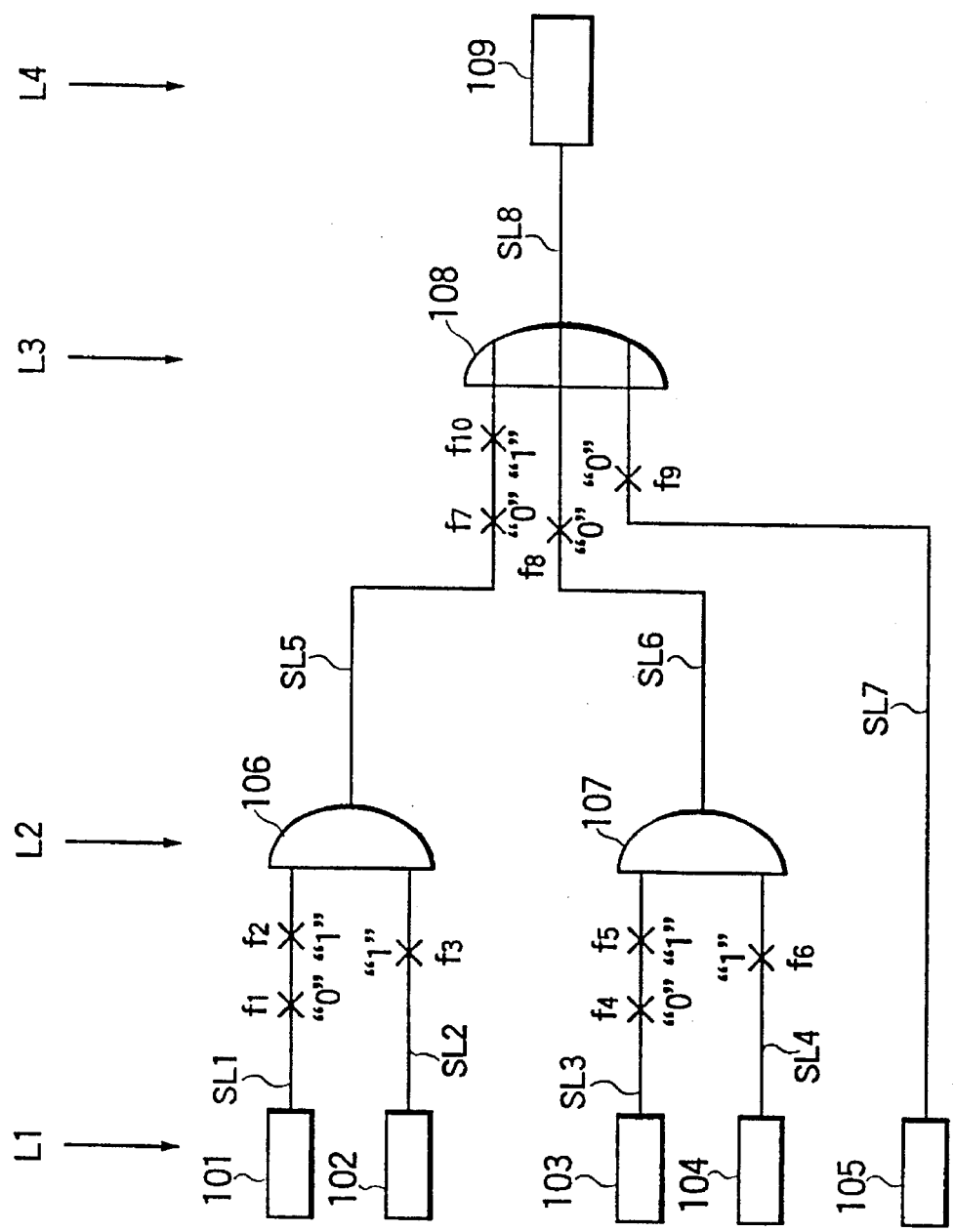
FIG. 1 shows a logic circuit model which is simulated by a fault simulator according to this invention.

Referring to FIG. 1, description will be made as regards a logic circuit model which can be simulated in accordance with this invention. The illustrated logic circuit model comprises first through fifth input terminals 101, 102, 103, 104, and 105, as circuit elements, and a plurality of logic elements. The logic elements are classified into logical types, such as AND, OR, and the like. The logic circuit model comprises, as the logic elements, an AND gate 106 connected to the first and the second input terminals 101 and 102 through first and second signal lines SL1 and SL2, an AND gate 107 connected to third and fourth input terminals 103 and 104 through third and fourth signal lines SL3 and SL4, and an OR gate 108 connected to the AND gates 106 and 107 and the fifth input terminal 105 through fifth through seventh signal lines SL5, SL6, and SL7, respectively. An output terminal 109 is connected to the OR gate 108 through an eighth signal line SL8.

More specifically, the AND gate 106 has first and second input pins (not shown) which are connected to the first and second signals lines SL1 and SL2, respectively, and which are defined by input pin numbers 1 and 2, respectively. The AND gate 106 further has an output pin (not shown) connected to the fifth signal line SL5. Likewise, the AND gate 107 has first and second input pins which are connected to the third and fourth signal lines SL3 and SL4, respectively, and which are defined by input pin numbers 1 and 2, respectively. The AND gate 107 further has an output pin connected to the sixth signal line SL6. The OR gate 108 has first, second, and third input pins which are connected to the seventh, the sixth, and the fifth signal lines SL7, SL6, and SL5, respectively, and which are defined by input pin numbers 1, 2, and 3, respectively. The OR gate 108 further has an output pin connected to the eighth signal line SL8.

In the example being illustrated, the logic circuit model is assorted from the first through the fifth input terminals 101 to 105 to the output terminal 109 into first through fourth levels L1, L2, L3, and L4 according to flow of signals in the logic circuit model. The first through the fifth input terminals 101 to 105 belong to the illustrated first level L1 while the AND gates 106 and 107 belong to the second level L2. Likewise, the OR gate 108 belongs to the third level L3 while the output terminal 109 belongs to the fourth level L4. In addition, the logic circuit model may comprise at least one of flip-flop circuits. If the flop-flop circuit comprises a shift register and has a scan-path construction, the flip-flop circuit is regarded as the input terminal because the simulation is carried out through a scan-path line as known in the art.

As is known in the art, fault simulations are carried out, on the assumption that first through p-th faults take place in the circuit model where p represents a natural number greater than unity. The faults are assorted into a stuck-at-0 and a stuck-at-1 fault which are practically attained by fixedly giving the logic zero level or value and the logic one level or value on the signal lines in question, respectively. In the example being illustrated, let the natural number p be equal to ten. First and second faults of the stuck-at-0 and the stuck-at-1 are hypothetically defined on the first signal line SL1, as symbolized at f1 and f2, respectively, while a third fault of the stuck-at-1 is defined on the second signal line SL2, as shown at f3. Likewise, fourth and fifth faults f4 and f5 are of the stuck-at-0 and the stuck-at-1 faults, respectively, and are defined on the third signal line SL3 while a sixth fault f6 of the stuck-at-1 is defined on the fourth signal line SL4. Each of seventh through ninth faults f7, f8, and f9 is of the stuck-at-0 and is defined on each of the fifth through the seventh signal lines SL5 to SL7. In addition, a tenth fault f10 of the stuck-at-1 is defined on the fifth signal line SL5. As will become clear later, the first through the tenth faults f1 to f10 are defined by fault identification number data comprising pin number data representative of the input pin numbers of each of the AND gates 106 and 107 and the OR gate 108.

Referring to FIG. 2a, on simulating the illustrated logic circuit model, first through third input pattern signals P1, P2, and P3 are given as test patterns from a signal generating circuit (later shown) to the first through the fifth input terminals 101 to 105, respectively. The first input pattern signal P1 has a five-bit pattern of (01100) while the second and the third input pattern signals P2 and P3 have five-bit patterns of (10010) and (00001). Each five-bit pattern is successively numbered from an uppermost bit, namely, a first bit to a lowermost bit, namely, a fifth bit.

Figure 3:
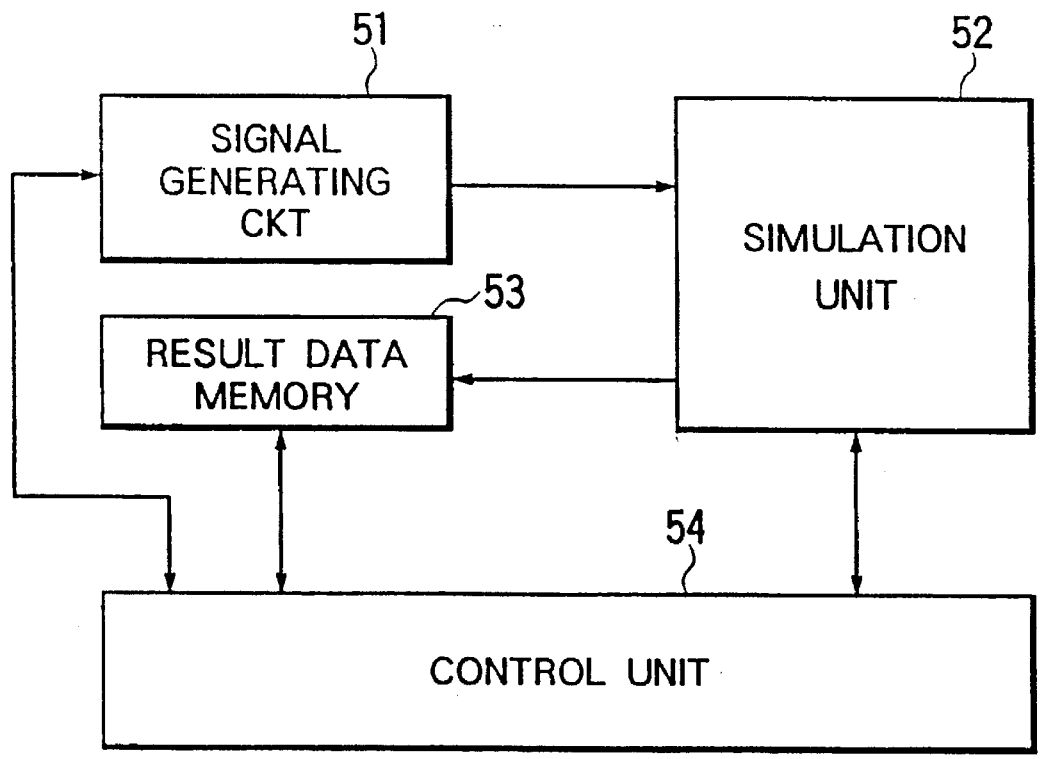
FIG. 3 is a block diagram of a fault simulator according to a first embodiment of this invention.

Referring to FIG. 3, a fault simulator according to a first embodiment of this invention is for simulating the logic circuit model which is operable in response to first through n-th input pattern signals where n represents a natural number greater than unity. In the example, the natural number n is equal to three. The illustrated fault simulator is implemented by hardware as will become clear.

The fault simulator comprises a signal generating circuit 51 implemented by hardware for generating the first through the third input pattern signals P1 to P3 and a simulation unit 52 implemented by hardware and supplied with the first through the third input pattern signals P1 to P3 for carrying out first through p-th simulations of the logic circuit model by the use of the first through the third input pattern signals as will later be described. The simulation unit 52 produces first through p-th simulation result signals which are representative of results of the first through the p-th simulations, respectively. As will become clear, each of the first through the p-th simulation result signals comprises correct value data representative of correct value defined in each of the first through the n-th input pattern signals and detected fault data which are detected by each of the first through the p-th simulations.

The fault simulator further comprises a result data memory 53 connected to the simulation unit 52 for memorizing the first through the p-th simulation result signals as first through p-th memorized result signals. A control unit 54 is connected to the signal generating circuit 51, the simulation unit 52, and the result data memory 53. The control unit 54 is implemented by hardware. The control unit 54 is for controlling the signal generating circuit 51 to make the signal generating circuit 51 generate the first through the third input pattern signals P1 to P3 and is for controlling the simulation unit 52 to make the simulation unit 52 carry out the first through the p-th simulations.

Figure 4:
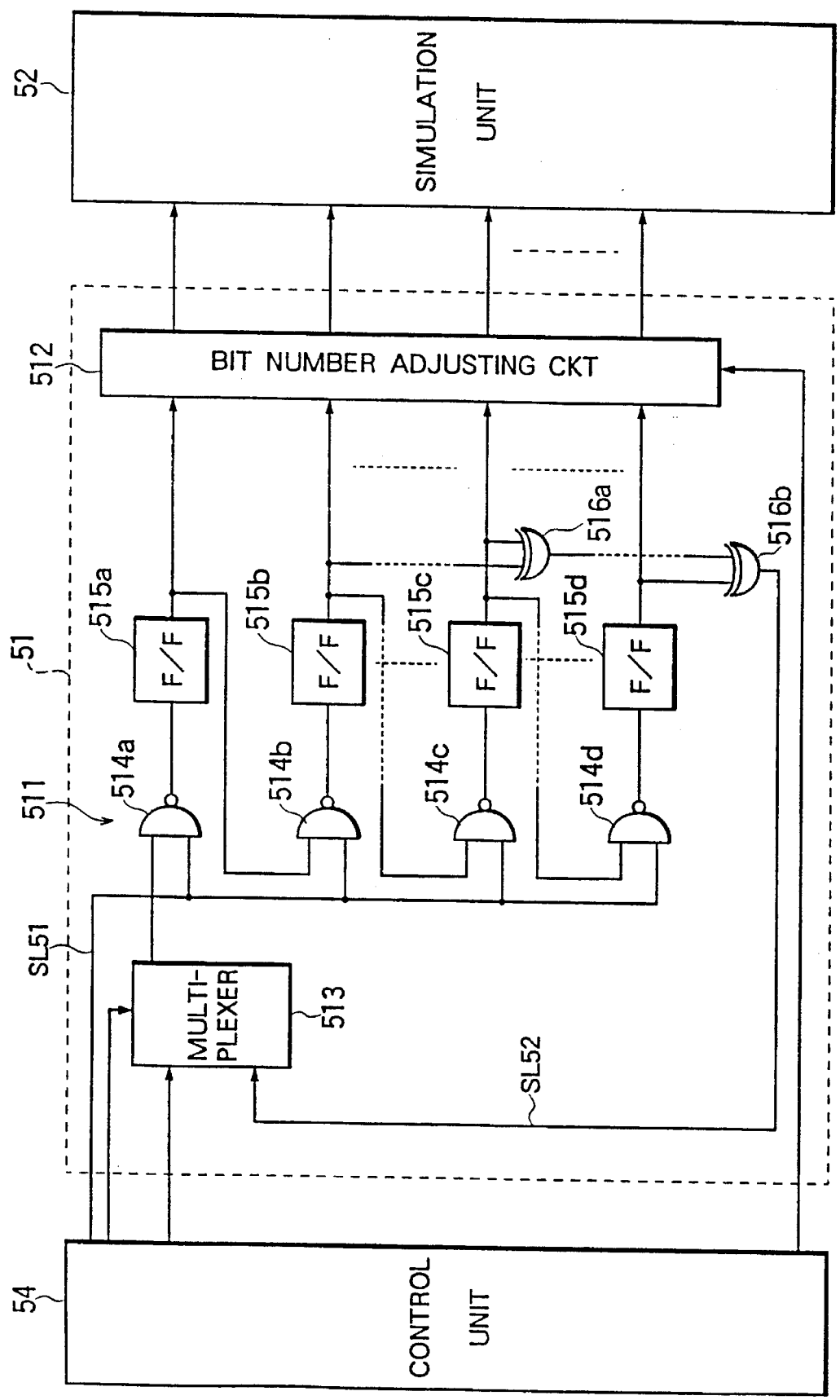
FIG. 4 is a block diagram of a signal generating circuit illustrated in FIG. 3.

Referring to FIG. 4, the description will proceed to the signal generating circuit 51. The signal generating circuit 51 comprises a random pattern generating circuit 511 connected to the control unit 54 for generating a random pattern and a bit number adjusting circuit 512 connected to the random pattern generating circuit 511. The random pattern generating circuit 511 comprises a multiplexer 513, first through fourth NAND gates 514a, 514b, 514c, and 514d, first through fourth flip-flops 515a, 515b, 515c, 515d, and first and second exclusive OR gates 516a and 516b.

In FIG. 4, the random pattern generating circuit 511 generates the random pattern under the control of the control unit 54. Namely, the control unit 54 sets, at first, initial values to the first through the fourth flip-flops 515a to 515d through a signal line SL51. Then, the control unit 54 activates the multiplexer 513 so that the multiplexer 513 receives flip-flop output signals of the first through the fourth flip-flops 515a to 515d through the first and the second exclusive OR gates 516a and 516b and a signal line SL52. As a result, the random pattern generating circuit 511 generates the random pattern having a predetermined pattern length. The bit number adjusting circuit 512 is for adjusting bit number of the random pattern to produce, as one of the first through the third input pattern signals, an adjusted pattern having an adjusted bit number equal to the number of the input terminals 101 to 105 (FIG. 1), namely, five bits.

Figure 5:
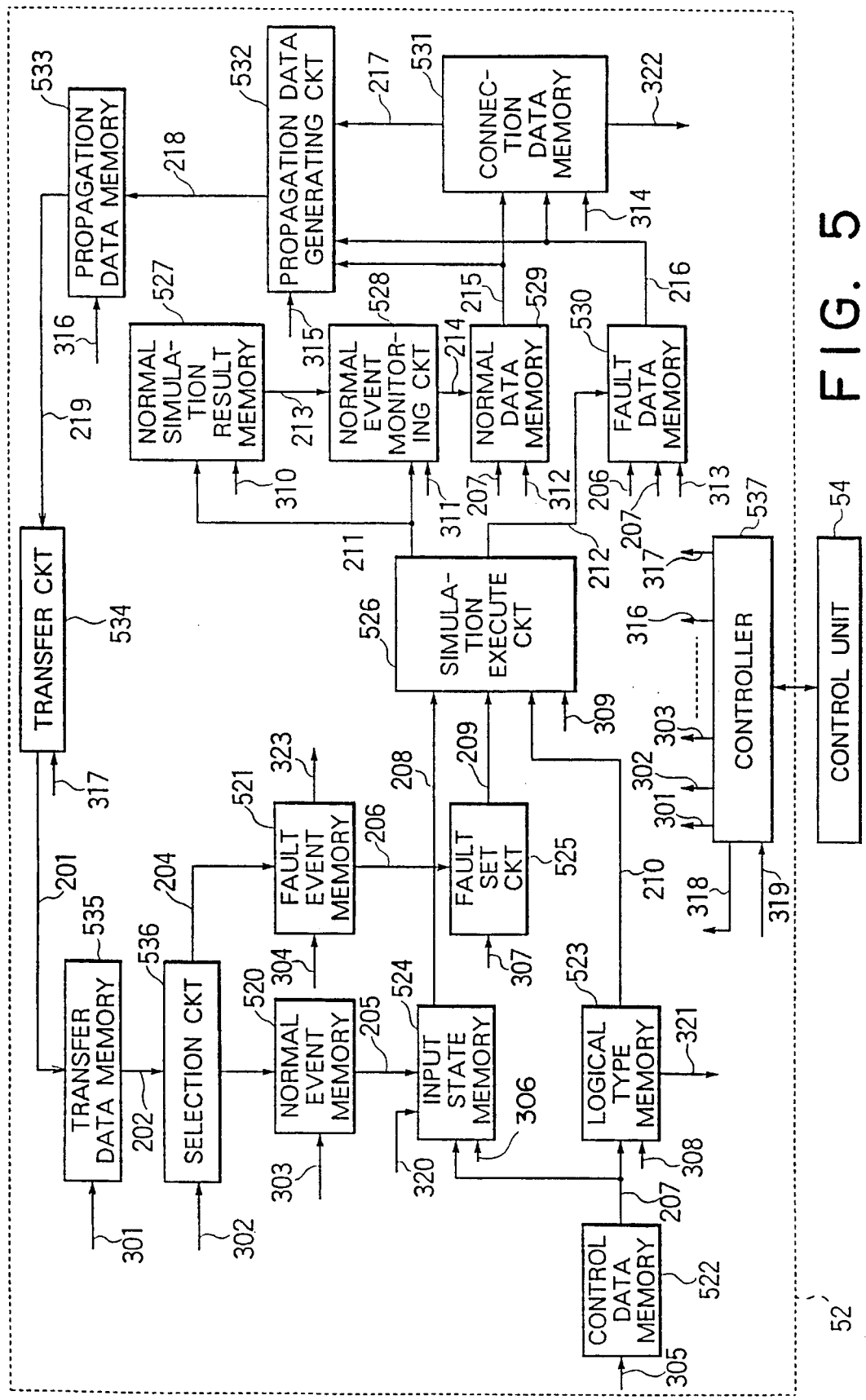
FIG. 5 is a block diagram of a simulation unit illustrated in FIG. 3.

Referring to FIG. 5, the description will proceed to the simulation unit 52 illustrated in FIG. 3. The simulation unit 52 comprises a normal event memory 520 for memorizing normal event data related to the first through the p-th simulations as memorized normal event data and a fault event memory 521 for memorizing fault event data related to the first through the p-th simulations as memorized fault event data. As will become clear later, the normal event data comprise connection data related to element data representative of the logic and the circuit elements of the logic circuit model, pin number data representative of the input pin numbers, and a fault value datum representative of a fault value. The fault event data comprise the connection data related to the element data, the fault identification number data, namely, the detected fault data, the fault value datum, and an event datum representative of one of a normal event and a fault event. As will later be described more in detail, a control data memory 522 is for memorizing level control data related to the first through the fourth levels L1 to L4 together with the element data. A logical type memory 523 is connected to the control data memory 522 through a signal line 207 and is for memorizing, as memorized logical type data, logical types, such as AND, OR, and the like, of each of the logic elements illustrated in FIG. 1. For example, the AND gate is represented by a two bit pattern, such as "00". The OR gate is represented by a two bit pattern, such as "10".

An input state memory 524 is connected to the normal event memory 520 and the control data memory 522 through a signal line 205 and a signal line 207, respectively, and is supplied with the first through the n-th input pattern signals through a signal line 320. As will later be described, the input state memory 524 is for memorizing input states, as memorized input state data, of each of the logic elements illustrated in FIG. 1. A fault set circuit 525 is connected to the fault event memory 521 through a signal line 206 and is for generating fault set data in compliance with the memorized fault event data supplied from the fault event memory 521. In addition, the fault set circuit 525 generates new fault set data without the memorized fault event data as will become clear later. Therefore, the fault set circuit 525 may be called a fault set data generating circuit.

A simulation execute circuit 526 is connected to the logical type memory 523, the input state memory 524, and the fault set circuit 525 through a signal line 210, a signal line 208, and a signal line 209, respectively, and is for executing first through p-th normal simulations and first through p-th fault simulations. The simulation execute circuit 526 produces first through p-th normal result signals which are representative of results of the first through the p-th normal simulations, respectively, and produces first through p-th fault result signals which are representative of results of the first through the p-th fault simulations, respectively.

A normal simulation result memory 527 is connected to the simulation execute circuit 526 through a signal line 211 and memorizes the first through the p-th normal result signals as first through p-th memorized normal result data. A normal event monitoring circuit 528 is connected to the simulation execute circuit 526 and the normal simulation result memory 527 through the signal line 211 and a signal line 213, respectively, and is for monitoring whether or not the normal event occurs or propagates in each of the first through the p-th normal simulations. The normal event monitoring circuit 528 produces a normal event detection signal representative of occurrence of the normal event when the normal event occurs. A normal data memory 529 is connected to the normal event monitoring circuit 528 through a signal line 214. The normal data memory 529 memorizes the data supplied from the control data memory 522 through the signal line 207 when the normal data memory 529 is supplied with the normal event detection signal. The data memorized in the normal data memory 529 will be called normal data.

A fault data memory 530 is connected to the simulation execute circuit 526 through a signal line 212. When the fault data memory 530 is supplied with one of the first through the p-th fault result signals, the fault data memory 530 memorizes the element data supplied from the control data memory 522 through the signal line 207 and memorizes the fault identification number data and the fault value datum as will become clear later. The data memorized in the fault data memory 530 will be called fault data. Each of the normal and the fault data memories 529 and 530 is implemented by a FIFO (first-in first-out) memory.

As will later be described more in detail, a connection data memory 531 is connected to the normal data memory 529 and the fault data memory 530 through signal lines 215 and 216, respectively, and is for memorizing the connection data, as memorized connection data, representative of connection destination of each of the circuit and the logic elements illustrated in FIG. 1. For example, the connection destination of the first input terminal 101 is the AND gate 106 while the connection destination of the AND gate 106 is the OR gate 108. A propagation data generating circuit 532 is connected to the normal data memory 529, the fault data memory 530, and the connection data memory 531 through the signal line 215, the signal line 216, and a signal line 217, respectively. In the manner which will be described later, the propagation data generating circuit 532 generates propagation data by the use of the memorized connection data and at least one of the normal and the fault data read from one of the normal data memory 529 and the fault data memory 530. The propagation data comprise the connection data, at least one of the normal data and the fault data.

A propagation data memory 533 connected to the propagation data generating circuit 532 through a signal line 218 is for memorizing the propagation data as memorized propagation data. A transfer circuit 534 is connected to the propagation data memory 533 through a signal line 219 and is for transferring the memorized propagation data, as transferred data, to a transfer data memory 535 through a signal line 201. The transfer data memory 535 memorizes the transferred data as memorized event data. The memorized event data comprise at least one of the normal data and the fault data. A selection circuit 536 is supplied with the memorized event data through a signal line 202 and selects one of the normal data and the fault data from the memorized event data. When the normal data are selected by the selection circuit 536 as selected normal data, the selected normal data are supplied to the normal event memory 520 as the normal event data. When the fault data are selected by the selection circuit 536 as selected fault data, the selected fault data are supplied to the fault event memory 521 as the fault event data.

A controller 537 connected to the control unit 54 is for controlling the above-mentioned memories and circuits 520 to 536 through control signal lines 301 through 317 (depicted by parallel lines having arrowheads) at various time instants in the manner which will become clear as the description proceeds. On completion of the simulation, the controller 537 reads the fault identification number data out of the fault event memory 521 as readout fault identification number data and supplies the readout identification number data through a signal line 323 to the result data memory 53 as a part of the simulation result signals.

Figure 6:
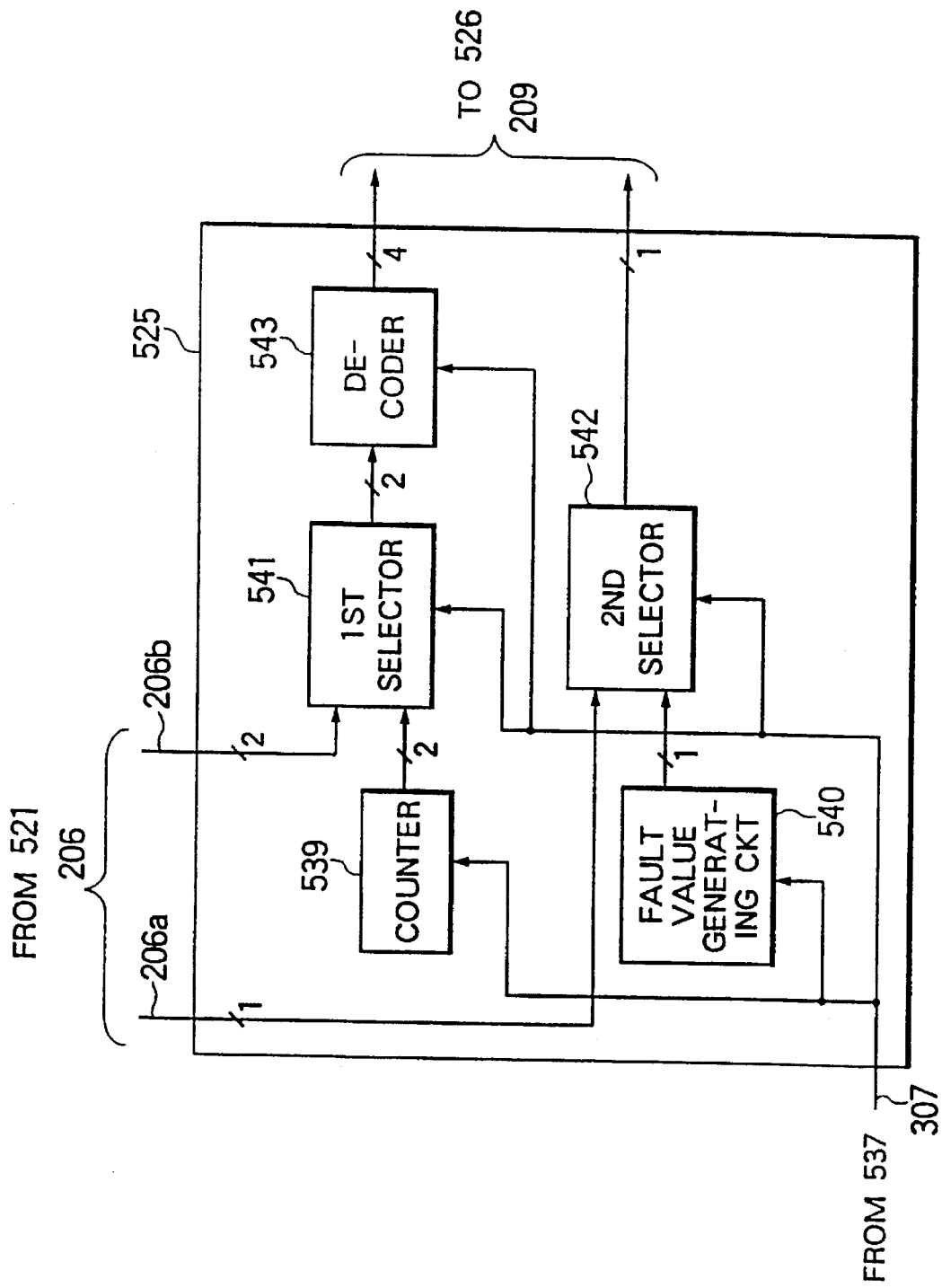
FIG. 6 is a block diagram of a fault set circuit shown in FIG. 5.

Referring to FIG. 6, the description will proceed to the fault set circuit 525 illustrated in FIG. 5. As mentioned in conjunction with FIGS. 1 and 5, the memorized fault event data comprise the fault identification number data comprising the pin number data representative of the input pin numbers of each of the logic elements. The memorized fault event data further comprise the fault value datum representative of the fault value. In the example, the pin number data are represented by two bits while the fault value datum is represented by a single bit, namely, the logic zero value or the logic one value. The fault set circuit 525 is supplied from the fault event memory 521 with the pin number data and the fault value datum through a signal line 206b and a signal line 206a, respectively. The fault set circuit 525 comprises a counter 539 and a fault value generating circuit 540. The counter 539 is for generating new pin number data representative of a new pin number under control of the controller 537 (FIG. 5) through the control signal line 307. Therefore, the counter 539 may be called a pin number data generating circuit. The fault value generating circuit 540 is for generating a new fault value datum representative of a new fault value under control of the controller 537 through the control signal line 307. Under the circumstances, the counter 539 and the fault value generating circuit 540 are used for setting the new fault set data to one of the logic elements in the logic circuit model when the fault event memory 521 has no memorized fault event data.

A first selector 541 is connected to the pin number data generating circuit 539 and is supplied with the pin number data through the signal line 206b. Under control of the controller 537, the first selector 541 selects one of the pin number data and the new pin number data as selected pin number data. A second selector 542 is connected to the fault value generating circuit 540 and is supplied with the fault value datum through the signal line 206a. Under control of the controller 537, the second selector 542 selects one of the fault value datum and the new fault value datum as a selected fault value datum. In accordance with the selected pin number data, a decoder 543 connected to the first selector 541 determines the signal line, namely, the input pin number, to which the fault is set. The decoder 543 produces line identification number data representative of one of the signal lines illustrated in FIG. 1. The fault set circuit 525 supplies the line identification number data and the selected fault value datum as the fault set data to the simulation execute circuit 526 (FIG. 5) through the signal line 209.

Figure 7:
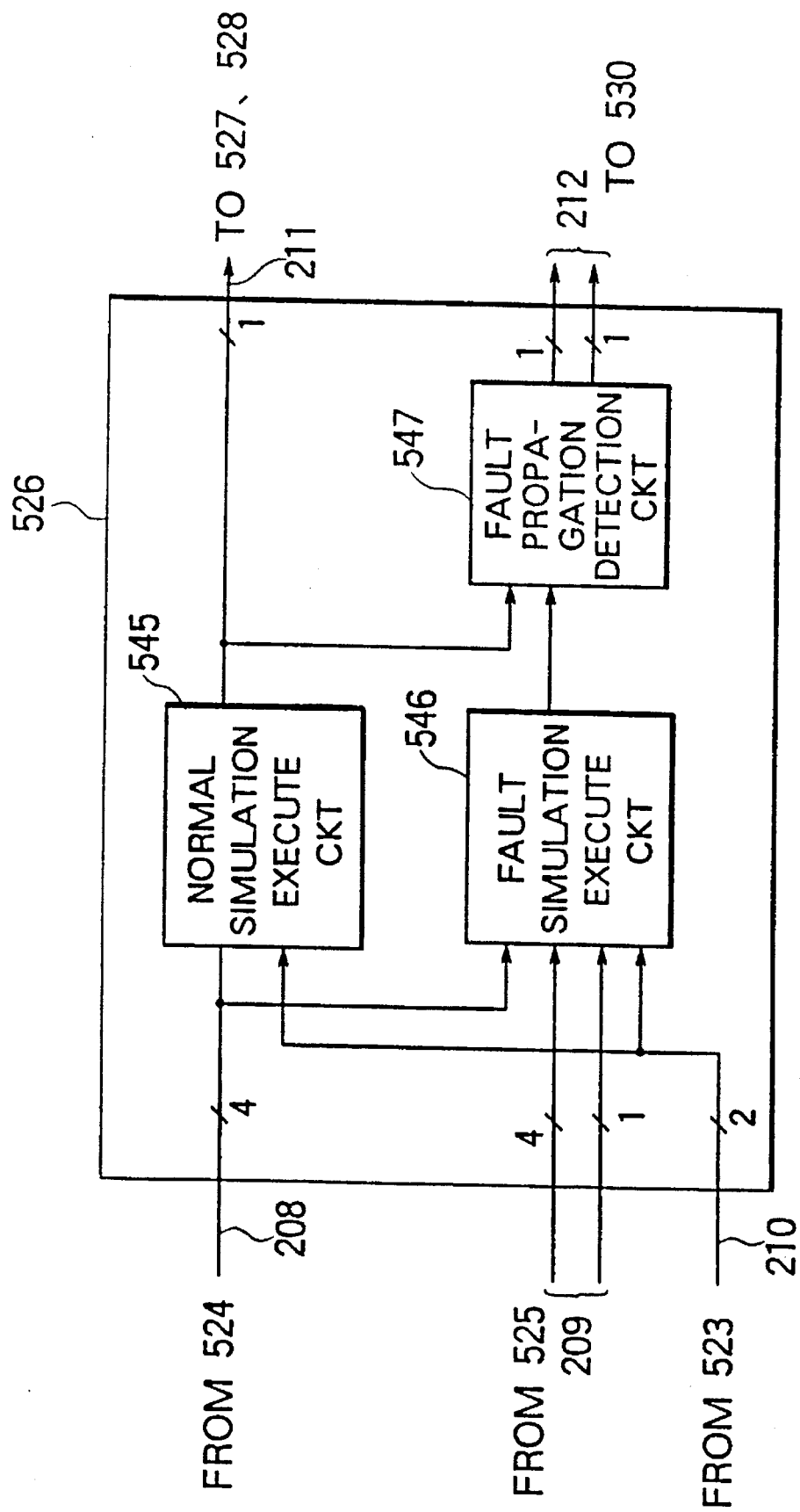
FIG. 7 is a block diagram of a simulation execute circuit illustrated in FIG. 5.

Referring to FIG. 7, the description will be made as regards the simulation execute circuit 526 illustrated in FIG. 5. The simulation execute circuit 526 comprises a normal simulation execute circuit 545, a fault simulation execute circuit 546, and a fault propagation detection circuit 547. The normal simulation execute circuit 545 is supplied with the memorized input state data from the input state memory 524 through the signal line 208. The normal simulation execute circuit 545 is further supplied with the memorized logical type data from the logical type memory 523 through the signal line 210. The fault simulation execute circuit 546 is supplied with the memorized input state data, the fault set data, and the memorized logical type data from the input state memory 524, the fault set circuit 525, and the logical type memory 523 through the signal lines 208, 209, and 210, respectively.

The normal simulation execute circuit 545 is for executing the first through the p-th normal simulations one by one by the use of the memorized input state data and the memorized logical type data. The normal simulation execute circuit 545 delivers the first through the p-th normal result signals as results of the first through the p-th normal simulations to the normal simulation result memory 527 and the normal event monitoring circuit 528 through the signal line 211. The fault simulation execute circuit 546 is for executing the first through the p-th fault simulations one by one in accordance with the memorized input state data, the fault set data, and the memorized logical type data. The fault simulation execute circuit 546 produces first through p-th fault decision signals as results of the first through the p-th fault simulations.

The fault propagation detection circuit 547 is supplied with the first through the p-th normal result signals and the first through the p-th fault decision signals in one-to-one correspondence. The fault propagation detection circuit 547 is for detecting whether or not each of the first through the p-th normal result signals is coincident with each of the first through the p-th fault decision signals. The fault propagation detection circuit 547 produces first through p-th detection signals representative of the fact that propagation of the fault is present. Each of the first through the p-th detection signals is represented by a single bit. The fault propagation detection circuit 547 further produces a fault define signal representative of a fault value when each of the first through the p-th normal result signals does not coincide with each of the first through the p-th fault decision signals, namely, when the propagation of the fault is present. When the propagation of the fault is present, the fault value is defined by the logic one value. The first through the p-th detection signals are supplied from the fault propagation detection circuit 547 to the fault data memory 530 together with the fault define signal as the first through the p-th result signals, respectively.

Referring to FIGS. 8 to 11 together with FIGS. 1 and 5, the description will proceed to operation of the simulation unit 52 which executes the simulation of the circuit model illustrated in FIG. 1. Let the input states of the first through the fifth input terminals 101 to 105 be initialized at all zero.

The operation is started by giving the first input pattern signal P1 to the input state memory 524. The controller 537 detects whether or not each of the input states of the first through the fifth input terminals 101 to 105 of the first level L1 change from zero to one. In the example illustrated in FIG. 1, the input states of the second and the third input terminals 102 and 103 change from zero to one. This means that the normal events occur in the second and the third input terminals 102 and 103. Such normal events propagate to a next following level, namely, the second level L2. In the simulation unit 52, the changes of the input terminals 102 and 103 are transferred from the input state memory 524 to the normal event memory 520 through the simulation execute circuit 526, the normal simulation result memory 527, the normal event monitoring circuit 528, the normal data memory 529, the connection data memory 531, the propagation data generating circuit 532, the propagation data memory 533, the transfer circuit 534, the transfer data memory 535, and the selection circuit 536. Thus, the operation of the first level L1 is completed. The simulation of the logic elements starts from the second level L2.

Figure 8:
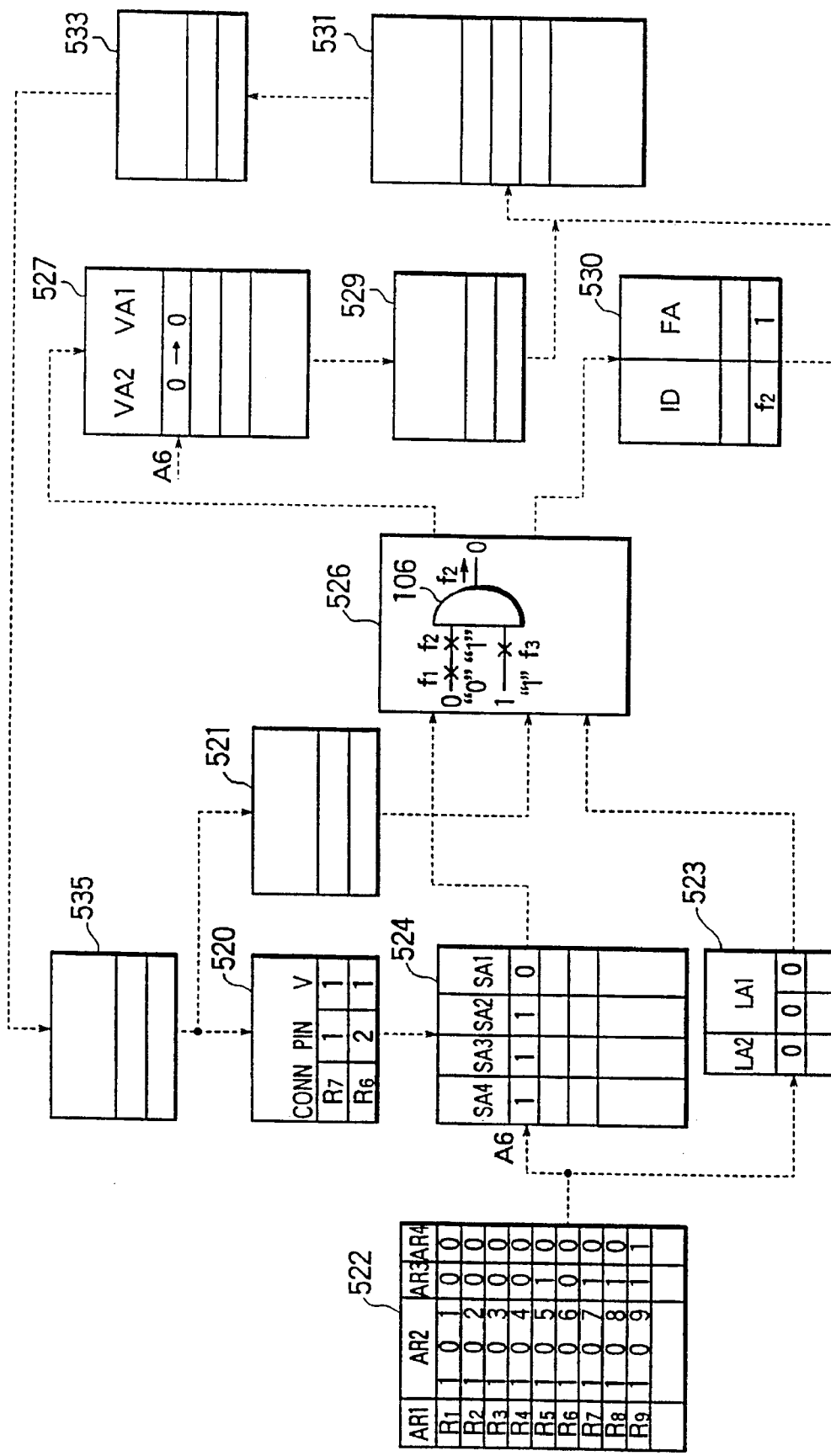
FIG. 8 is a schematic block diagram of the simulation execute circuit for use in describing simulation operation of a logic element illustrated in FIG. 1.

In FIG. 8, the control data memory 522 comprises first through fourth memory areas AR1, AR2, AR3, and AR4. The control data memory 522 memorizes first through ninth element data, as first through ninth memorized element data, in the first memory area AR1 and memorizes first through ninth start addresses, as first through ninth memorized start addresses, in the second area AR2. The first through the ninth memorized element data represent the first through the fifth input terminals 101 to 105, the AND gates 106 and 107, the OR gate 108, and the output terminal 109 in one-to-one correspondence. The first through the ninth memorized element data are symbolically depicted at R1, R2, R3, R4, R5, R6, R7, R8, and R9, respectively. Each of the first through the ninth memorized start addresses is for designating start address of the logical type memory 523, the input state memory 524, and the normal simulation result memory 527. The first through the ninth memorized start addresses are depicted at 101, 102, 103, 104, 105, 106, 107, 108, and 109, respectively, for the sake of convenience.

The control data memory 522 further memorizes first and second completion flags in the third and the fourth memory areas AR3 and AR4, respectively, in one-to-one correspondence to the first through the ninth memorized element data. The first completion flag indicates an end of each of the first through the fourth levels L1 to L4 when the first completion flag has the logic one value. The second completion flag represents an end of the fourth level L4, namely, an end of all levels of the circuit model when the second completion flag has the logic one value. In the example, the first completion flag having the logic one value is given to each of the fifth terminal 105, the AND gate 107, the OR gate 108, and the output terminal 109 illustrated in FIG. 1 while the second completion flag having the logic one value is given to the output terminal 109. The first and the second completion flags may collectively be called the level control data.

The normal event memory 520 memorizes the normal event data occurred in the first level L1. The normal event data are related to the second input terminal 102 connected to the AND gate 106 and the third input terminal 103 connected to the AND gate 107. The normal event data comprise the connection data representative of the connection destination designated by one of the first through the ninth addresses in the control data memory 522, the pin number data which represent the input pin number of the logic element designated by one of the first through the ninth addresses in the control data memory 522, and the fault value datum represented by one of the logic zero and one values which are set to the input pin of the logic element designated by one of the first through the ninth addresses in the control data memory 522.

Under the circumstances, the normal event memory 520 comprises a connection data area CONN for memorizing the connection data, a pin number data area PIN for memorizing the pin number data, and a fault value area V for memorizing the fault value datum. In the example being illustrated, the normal event memory 520 memorizes the connection data, as first connection data, in the connection data area CONN, which is related to the sixth memorized element data R6 and which designates the sixth memorized start address 106 in the control data memory 522. Furthermore, the normal event memory 520 memorizes the connection data, as second connection data, in the connection data area CONN, which is related to the seventh memorized element data R7 and which designates the seventh memorized start address 107 in the control data memory 522. This is because the normal event occurred in the second and the third input terminals 102 and 103 in the first level L1 as mentioned before.

The normal event memory 520 further memorizes the pin number data, as first memorized pin number data, in the pin number data area PIN, which represents the number 2 of the second input pin of the AND gate 106 and which is related to the first connection data. The normal event memory 520 also memorizes the pin number data, as second memorized pin number data, in the pin number data area PIN, which represents the number 1 of the first input pin of the AND gate 107 and which is related to the second connection data. The normal event memory 520 still further memorizes the fault value datum, as a first memorized fault value datum, in the fault value area V, which is represented by the logic one value and which is related to the first connection data and memorizes the fault value datum, as a second memorized fault value datum, in the fault value area V, which is represented by the logic one value and which is related to the second connection data. The first memorized connection data, the first memorized pin number data, and the first memorized fault value datum may collectively be called primary normal event data while the second memorized connection data, the second memorized pin number data, and the second memorized fault value datum may collectively be called secondary normal event data.

The input state memory 524 is for memorizing the input states of the input pins of each of the logic elements in the logic circuit model. For brevity, it will be assumed that each of the logic elements has first through fourth input pins and a single output pin. Under the circumstances, the input state memory 524 comprises first through fourth state areas SA1, SA2, SA3, and SA4 for memorizing the input states of each of the first through the fourth input pins, respectively. For example, if the logic element is the AND gate, the input state memory 524 memorizes the logic zero value in the first and the second state areas SA1 and SA2 and memorizes the logic one value in the third and the fourth state areas SA3 and SA4, respectively, as an initial state. This is because the AND gate has first and second input pins and has no third and fourth input pins. The input state memory 524 memorizes first through ninth input state data, as first through ninth memorized input state data, in one-to-one correspondence to the first through the ninth element data R1 to R9. The first through the ninth memorized input state data are given by first through ninth addresses, respectively, which are in one-to-one correspondence to the first through the ninth start addresses, respectively, in the control data memory 522.

The logical type memory 523 is for memorizing the logical type data, as memorized logical type data, representative of the logical type of each of the logic elements and an output value datum representative of an output value of each of the logic elements. For example, the AND gate is represented by two bits, such as "00" while the OR gate is represented by two bits, such as "10", as mentioned before. In addition, an EXOR (exclusive OR) gate is represented by two bits, such as "01". The output value datum is represented by a single bit. For example, the output value datum having the logic zero value indicates a true output produced from the AND gate. The output value datum having the logic one value indicates an inverted output produced from the NAND gate. Under the circumstances, the logical type memory 523 comprises a first type area LA1 for memorizing the logical type data and a second type area LA2 for memorizing the output value datum. The logical type memory 523 memorizes first through ninth logical type data, as first through ninth memorized logical type data, in one-to-one correspondence to the first through the ninth element data R1 to R9 and first through ninth output value data, as first through ninth memorized output value data, in one-to-one correspondence to the first through the ninth element data R1 to R9. The first through the ninth memorized logical type data are given by first through ninth start addresses, respectively, which are in one-to-one correspondence to the first through the ninth start addresses in the control data memory 522. This is applied to the first through the ninth memorized output value data.

In FIG. 8, the normal simulation result memory 527 comprises a new value area VA1 for memorizing a new normal event value and a preceding value area VA2 for memorizing a preceding normal event value preceding the new normal event value. Each of the new value area VA1 and the preceding value area VA2 is defined by first through ninth addresses in one-to-one correspondence to the first through the ninth start addresses of the control data memory 522.

The fault data memory 530 comprises a fault value area FA for memorizing the fault value and a fault identification number area ID for memorizing the fault identification number of the fault. The fault value and the fault identification number data will collectively be called the fault data. Although the fault data memory 530 further comprises an element data area for memorizing the first through the ninth element data in one-to-one correspondence to the first through the ninth element data R1 to R9, the element data area is not shown for convenience.

Taking the above into consideration, the description will proceed to the simulation of the logic elements. At first, the controller 537 (FIG. 5) searches the normal event memory 520 to detect whether or not the normal event data are memorized in the normal event memory 520. As a result of the search, the controller 537 detects the primary normal event data related to the sixth element data R6, namely, the AND gate 106 and then searches the control data memory 522 to detect the sixth start address in the control data memory 522. Subsequently, the controller 537 searches the sixth address depicted at A6 in the input state memory 524 in accordance with the sixth start address detected from the control data memory 522. In the sixth address of the input state memory 524, the logic zero value has already been memorized in the first and the second input state areas SA1 and SA2 and the logic one value has already been memorized in the third and the fourth input state areas SA3 and SA4 as the initial state of the input state data related to the AND gate 106. Next, the controller 537 changes the logic zero value of the second input state area SA2 to the logic one value in accordance with the primary normal event data which are related to the AND gate 106 and which include the pin number data representative of the number 2 of the second input pin of the AND gate 106. In the sixth address of the logical type memory 523, the logical type data "00" indicative of the AND gate have already been memorized in the first type area LA1 and the output value datum represented by the logic zero value has already been memorized in the second type area LA2. The logical type data and the output value datum may collectively be called type data. In the description mentioned above, the sixth address 106 in the second memory area AR2 of the control data memory 522 is equivalent to the sixth address depicted at A6.

The simulation execute circuit 526 is supplied with the type data, the input state data, and the fault set data, from the logical type memory 523, the input state memory 524, and the fault set circuit 525 (FIG. 5), respectively, and carries out the first normal simulation and the first fault simulation. In addition, the fault set circuit 525 sets the new fault set data to the simulation execute circuit 526 because the fault never propagates from the first level L1 to the first and the second input pins of the AND gate 106. In other words, the fault event memory 521 has no data. At first, the fault set circuit 525 generates the new fault set data, as first new fault set data, related to the first fault f1 and supplies the first new fault set data to the simulation execute circuit 526. As mentioned in conjunction with FIG. 7, the simulation execute circuit 526 executes the first normal simulation and the first fault simulation in relation to the first fault f1. In this event, the normal simulation execute circuit 545 produces the first normal result signal having the logic zero value while the fault simulation execute circuit 546 produces the first fault decision signal having the logic zero value. This means that the first fault f1 never propagates to the third level L3 because the first fault decision signal has the logic zero value equal to those of the first normal result signal. In addition, the first normal result signal indicates the correct value of the output of the AND gate 106. The correct value of the AND gate 106 is memorized in the new value area VA1 of the sixth address in the normal simulation result memory 527.

Then, the fault set circuit 525 generates the new fault set data, as second new fault set data, related to the second fault f2 and supplies the new second fault set data to the simulation execute circuit 526. The simulation execute circuit 526 executes the second normal simulation and the second fault simulation in relation to the second fault f2. In this event, the normal simulation execute circuit 545 produces the second normal result signal having the logic zero value while the fault simulation execute circuit 546 produces the second fault decision signal having the logic one value. This means that the second fault f2 propagates to the third level L3 because the second fault decision signal has the logic one value different from those of the second normal result signal. In this event, the fault propagation detection circuit 547 produces the fault define signal having the fault value datum represented by the logic one value.

Subsequently, the fault set circuit 525 generates the new fault set data, as third new fault set data, related to the third fault f3 and supplies the new third fault set data to the simulation execute circuit 526. The simulation execute circuit 526 executes the third normal simulation and the third fault simulation in conjunction with the third fault f3. In this event, the normal simulation execute circuit 545 produces the third normal result signal having the logic zero value while the fault simulation execute circuit 546 produces the third fault decision signal having the logic zero value. This means that the third fault f3 never propagates to the third level L3.

Thus, it is recognized that the second fault f2 propagates to the third level L3. The fault value datum given by the logic one value and the fault identification number data related to the second fault f2 are memorized in the fault value area FA and the fault identification number area ID, respectively, in the fault data memory 530. The fault value datum and the fault identification number data related to the second fault f2 will collectively be called primary fault data. In addition, when the simulation related to the AND gate 106 is completed, the primary normal event data are deleted from the normal event memory 520 under control of the controller 537.

The operation is succeeded by the simulation of the AND gate 107. The controller 537 searches the normal event memory 520 to detect whether or not the normal event data are further memorized in the normal event memory 520. As a result of the search, the controller 537 detects the normal event data related to the seventh element data R7, namely, the AND gate 107 and then searches the control data memory 522 to detect the seventh start address in the control data memory 522. In this event, the controller 537 detects the fact that the first completion flag in the third memory area AR3 has the logic one level. This means that the simulation reaches the last of the second level L2.

Figure 9:
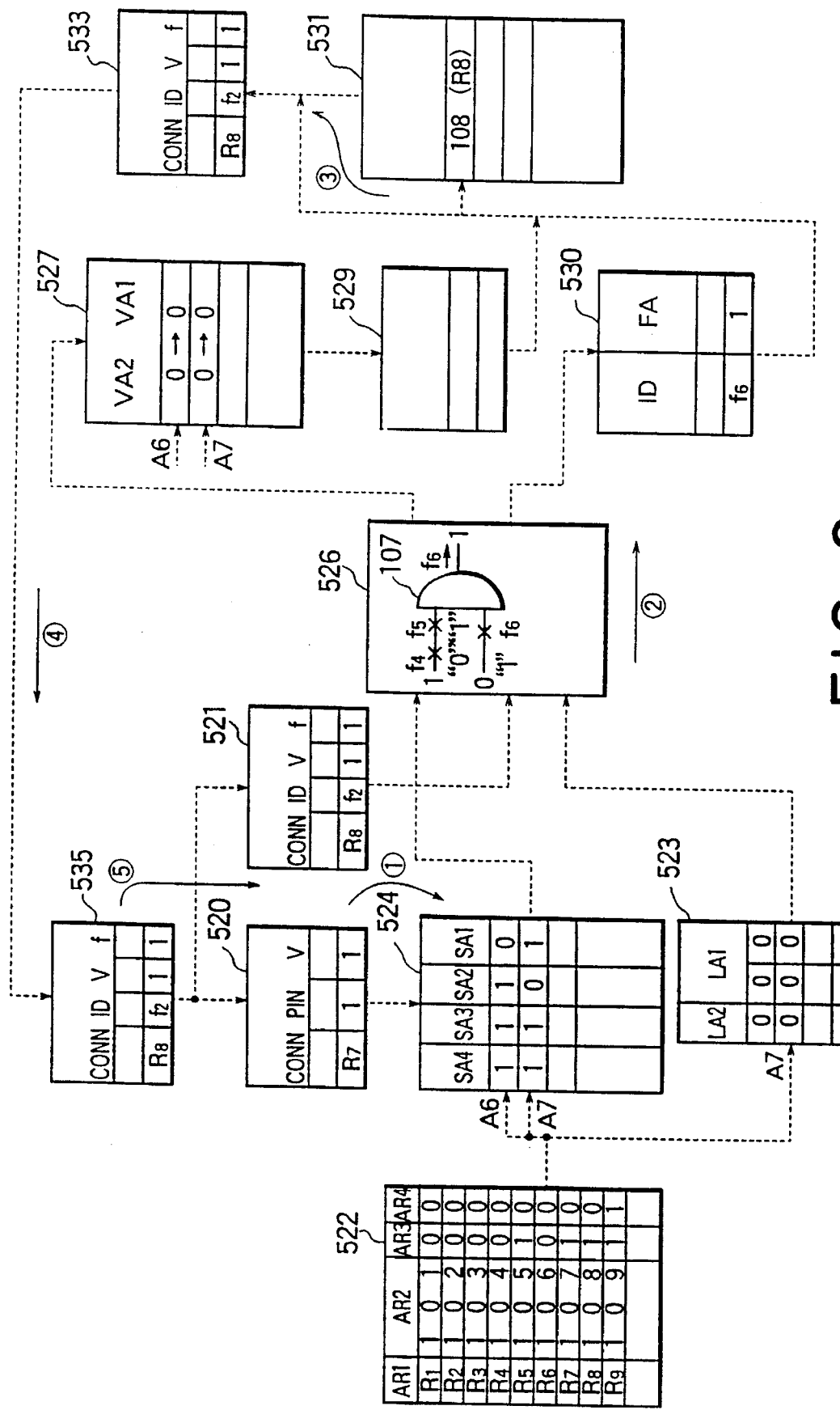
FIG. 9 is a schematic block diagram of the simulation execute circuit for use in describing simulation operation of another logic element shown in FIG. 1.

Turning to FIG. 9, the controller 537 searches the seventh address depicted at A7 in the input state memory 524 in accordance with the seventh start address detected from the control data memory 522. In the seventh address of the input state memory 524, the logic zero value has already been memorized in the first and the second input state areas SA1 and SA2 and the logic one value has already been memorized in the third and the fourth input state areas SA3 and SA4 as the initial state of the input state data related to the AND gate 107. Next, the controller 537 changes the logic zero value of the first input state area SA1 to the logic one value in accordance with the secondary normal event data which is related to the AND gate 107 and which include the pin number data representative of the number 1 of the first input pin of the AND gate 107. In the seventh address of the logical type memory 523, the logical type data "00" indicative of the AND gate have already been memorized in the first type area LA1 and the output value datum represented by the logic zero value has already been memorized in the second type area LA2. In the description mentioned above, the seventh address 107 in the second memory area AR2 of the control data memory 522 is equivalent to the seventh address depicted at A7.

The simulation execute circuit 526 is supplied with the type data, the input state data, and the fault set data, from the logical type memory 523, the input state memory 524, and the fault set circuit 525, respectively, and carries out the fourth normal simulation and the fourth fault simulation. In addition, the fault set circuit 525 sets again the new fault set data to the simulation execute circuit 526 because the fault never propagates from the first level L1 to the first and the second input pins of the AND gate 107. The fault set circuit 525 generates the new fault set data, as fourth new fault set data, related to the fourth fault f4 and supplies the fourth new fault set data to the simulation execute circuit 526. As mentioned in conjunction with FIG. 8, the simulation execute circuit 526 executes the fourth normal simulation and the fourth fault simulation in relation to the fourth fault f4. In this event, the normal simulation execute circuit 545 produces the fourth normal result signal having the logic zero value while the fault simulation execute circuit 546 produces the fourth fault decision signal having the logic zero value. This means that the fourth fault f4 never propagates to the third level L3. The correct value of the AND gate 107 is represented by the fourth normal result signal and is memorized in the new value area VA1 of the seventh address in the normal simulation result memory 527.

Then, the fault set circuit 525 generates fifth new fault set data related to the fifth fault f5 and supplies the fifth new fault set data to the simulation execute circuit 526. The simulation execute circuit 526 executes the fifth normal simulation and the fifth fault simulation in relation to the fifth fault f5. In this event, the normal simulation execute circuit 545 produces the fifth normal result signal having the logic zero value while the fault simulation execute circuit 546 produces the fifth fault decision signal having the logic zero value. This means that the fifth fault f5 never propagates to the third level L3.

Subsequently, the fault set circuit 525 generates sixth new fault set data related to the sixth fault f6 and supplies the new sixth fault set data to the simulation execute circuit 526. The simulation execute circuit 526 executes the sixth normal simulation and the sixth fault simulation in conjunction with the sixth fault f6. In this event, the normal simulation execute circuit 545 produces the sixth normal result signal having the logic zero value while the fault simulation execute circuit 546 produces the sixth fault decision signal having the logic one value. This shows that the sixth fault f6 propagates to the third level L3. Accordingly, the fault propagation detection circuit 547 produces the fault define signal having the fault value datum represented by the logic one value.

Thus, it is recognized that the sixth fault f6 also propagates to the third level L3. The fault value datum given by the logic one value and the fault identification number data related to the sixth fault f6 are memorized in the fault value area FA and the fault identification number area ID, respectively, in the fault data memory 530. The fault value datum and the fault identification number data related to the sixth fault f6 will collectively be called secondary fault data. The secondary normal event data are deleted from the normal event memory 520.

In FIG. 9, the connection data memory 531 memorizes the connection data representative of the connection destination from one of the logic elements to another one of the logic elements as mentioned in conjunction with FIG. 5. For example, the connection destination of the AND gate 106 (FIG. 1) is the OR gate 108 (FIG. 1). The connection destination of the OR gate 108 is the output terminal 109.

The following operation is carried out during the simulation related to the AND gate 107. Namely, the primary fault data related to the second fault f2 (FIG. 8) are read by the controller 537 out of the fault data memory 530. With reference to the primary fault data read from the fault data memory 530, the controller 537 searches the connection data memory 531 and detects the connection data representative of the connection destination of the AND gate 106. It is to be noted here that the AND gate 106 is connected to the OR gate 108. Accordingly, the connection destination of the AND gate 106 is the OR gate 108 and is symbolically depicted at 108 (R8) in a box depicted at 531 (FIG. 9).

Turning back to FIG. 5, the propagation data generating circuit 532 is supplied with the primary fault data and the connection data from the fault data memory 530 and the connection data memory 531, respectively, and generates the propagation data. The propagation data comprise the connection data, the fault identification number data, the fault value datum, and an event value datum. The event value datum is for representing a kind of event by a single bit. Namely, the normal event is represented by the logic zero value while the fault event is represented by the logic one value.

In the example illustrated in FIG. 9, the connection data represent the connection destination 108, namely, the element data R8 of the eighth start address in the control memory 522. The fault identification number data represent the second fault f2. The fault value datum is represented by the logic one value. The event value datum is represented by the logic one value. The propagation data are supplied to the propagation data memory 533. The propagation data memory 533 memorizes the propagation data as memorized propagation data.

Under the circumstances, the propagation data memory 533 comprises a connection data area CONN for memorizing the connection data, an identification number area ID for memorizing the fault identification number data, a fault value area V for memorizing the fault value datum, and an event value area f for memorizing the event value datum. In the example being illustrated, the connection data related to the element data R8 are memorized in the connection data area CONN. The fault identification number data representing the fault identification number f2 are memorized in the identification number area ID. The fault value datum and the event value datum which are represented by the logic one value are memorized in the fault value area V and the event value area f, respectively. The above-mentioned memorized propagation data will be called primary propagation data.

Temporarily turning back to FIG. 5, the primary propagation data are supplied, as primary transferred data, to the transfer data memory 535 through the transfer circuit 534. The transfer data memory 535 memorizes the primary transferred data, as primary memorized event data. The primary memorized event data have the same content with the primary propagation data. Therefore, the transfer data memory 535 is similar to the propagation data memory 533 as shown in FIG. 9. The primary memorized event data are supplied to the selection circuit 536 under control of the controller 537. The selection circuit 536 selects the primary memorized event data as primary selected data and supplies the primary selected data to the fault event memory 521. This is because the primary memorized event data include the event value datum of the logic one value that represents the fault event. The fault event-memory 521 memorizes the primary selected data as primary fault event data. The fault event memory 521 is similar to the transfer data memory 535 as shown in FIG. 9. Thus, the simulation related to the second level L2 is completed. It should be noted here that the operation described above can be achieved by a pipeline process, if the data are current through first through fifth lines which have arrowheads and which are designated by ①, ②, ③, ④, and ⑤, respectively. This means that the time duration for the simulation can be reduced.

In FIG. 9, the controller 537 searches the normal event memory 520 and the fault event memory 521 and detects the fact that the fault event memory 521 already memorizes the primary fault event data, as primary memorized fault event data, related to the eighth element data R8, namely, the OR gate 108. Subsequently, the controller 537 searches the control data memory 522 to detect the eighth address in the control data memory 522. Prior to the simulation in relation to the OR gate 108, the simulation execute circuit 526 executes the simulations relates to the second and the sixth faults f2 and f6.

Temporarily turning back to FIG. 6, the fault set circuit 525 selects the primary memorized fault event data, as primary selected fault event data, by the selection operation of the first and the second selectors 541 and 542. The primary selected fault event data are supplied to the simulation execute circuit 526.

Figure 10:
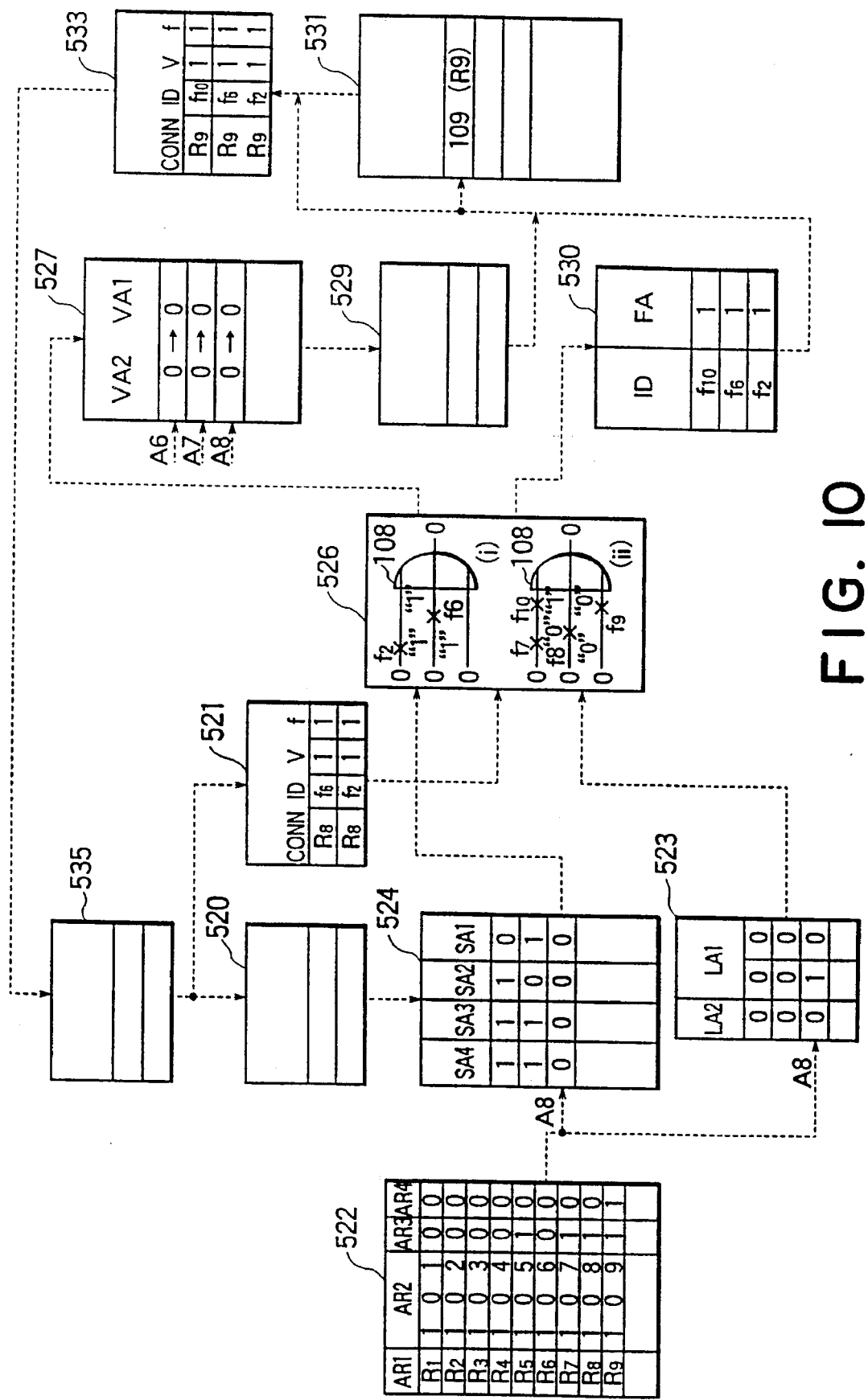
FIG. 10 is a schematic block diagram of the simulation execute circuit for use in describing simulation operation of still another logic element shown in FIG. 1.

As will later be shown (FIG. 10), the simulation execute circuit 526 executes the second normal simulation and the second fault simulation through the OR gate 108 in the manner mentioned before. As a result of the second normal and the second fault simulations, the second fault f2 propagates to the fourth level L4. Accordingly, the fault value given by the logic one value and the fault identification number of the second fault f2 are memorized in the fault data memory 530 as will later be shown (FIG. 10). During the second normal and the second fault simulations, the secondary fault data related to the sixth fault f6 are read by the controller 537 out of the fault data memory 530.

The secondary fault data related to the sixth fault f6 are transferred to the fault event memory 521 through the connection data memory 531, the propagation data generating circuit 532, the propagation data memory 533, the transfer circuit 534, the transfer memory 535, and the selection circuit 536 in the manner mentioned before. The fault event memory 521 memorizes the secondary fault data related to the sixth fault f6 as secondary fault event data as will later be shown (FIG. 10). In the manner similar to the second normal and the second fault simulations mentioned before, the simulation execute circuit 526 executes, through the OR gate 108, the sixth normal simulation and the sixth fault simulation which are related to the sixth fault f6. As a result of the sixth normal and the sixth fault simulations, the sixth fault f6 propagates to the fourth level L4. Accordingly, the fault value given by the logic one value and the fault identification number of the sixth fault f6 are also memorized in the fault data memory 530 as will later be shown (FIG. 10).

When the second normal and the second fault simulations and the third normal and the third fault simulations are completed, the controller 537 controls the fault set circuit 525 to make the fault set circuit 525 generate the new fault set data related to the OR gate 108.

Referring to FIG. 10, the description will proceed to the simulation of the OR gate 108 in the third level L3. The controller 537 searches the fault event memory 521 to detect whether or not the fault event data are further memorized in the fault event memory 521. As a result of the search, the controller 537 detects the secondary fault event data related to the eighth element data R8, namely, the OR gate 108 and then searches the control data memory 522 to detect the eighth start address in the control data memory 522. In this event, the controller 537 detects the fact that the first completion flag in the third memory area AR3 has the logic one value. This means that the simulation should be carried out in relation to the OR gate 108 only. The controller 537 further searches the eighth address depicted at A8 in the input state memory 524 in accordance with the eighth start address detected from the control data memory 522. In the eighth address of the input state memory 524, the logic zero value has already been memorized in the first through the fourth input state areas SA1 to SA4 as the initial state of the input state data related to the OR gate 108.

In the eighth address of the logical type memory 523, the logical type data "10" representative of the OR gate have already been memorized in the first type area LA1 and the output value datum represented by the logic zero value has already been memorized in the second type area LA2. In the description mentioned above, the eighth address 108 in the second memory area AR2 of the control data memory 522 is equivalent to the eighth address depicted at A8.

Turning back to FIG. 7, the simulation execute circuit 526 is supplied with the type data, the input state data, and the new fault set data, from the logical type memory 523, the input state memory 524, and the fault set circuit 525, respectively, and carries out the normal simulation and the fault simulation. The fault set circuit 525 generates, at first, the new fault set data, as seventh new fault set data, related to the seventh fault f7 and supplies the new seventh fault set data to the simulation execute circuit 526. In the manner mentioned in conjunction with FIG. 8, the simulation execute circuit 526 executes the seventh normal simulation and the seventh fault simulation in relation to the seventh fault f7. In this event, the normal simulation execute circuit 545 produces the seventh normal result signal having the logic zero value while the fault simulation execute circuit 546 produces the seventh fault decision signal having the logic zero value. This means that the seventh fault f7 never propagates to the fourth level L4. The correct value of the OR gate 108 is represented by the logic zero value and is memorized in the new value area VA1 of the eighth address of the normal simulation result memory 527.

Then, the fault set circuit 525 generates eighth new fault set data related to the eighth fault f8 and supplies the new eighth fault set data to the simulation execute circuit 526. The simulation execute circuit 526 executes the eighth normal simulation and the eighth fault simulation in relation to the eighth fault f8. In this event, the normal simulation execute circuit 545 produces the eighth normal result signal having the logic zero value while the fault simulation execute circuit 546 produces the eighth fault decision signal having the logic zero value. This means that the eighth fault f8 never propagates to the fourth level L4.

Subsequently, the fault set circuit 525 generates ninth fault set data related to the ninth fault f9 and supplies the ninth fault set data to the simulation execute circuit 526. The simulation execute circuit 526 executes the ninth normal simulation and the ninth fault simulation in conjunction with the ninth fault f9. In this event, the normal simulation execute circuit 545 produces the ninth normal result signal having the logic zero value while the fault simulation execute circuit 546 produces the ninth fault decision signal having the logic zero value. This shows that the ninth fault f9 never propagates to the fourth level L4.

Subsequently, the fault set circuit 525 generates tenth new fault set data related to the tenth fault f10 and supplies the new tenth fault set data to the simulation execute circuit 526. The simulation execute circuit 526 executes the tenth normal simulation and the tenth fault simulation in conjunction with the tenth fault f10. In this event, the normal simulation execute circuit 545 produces the tenth normal result signal having the logic zero value while the fault simulation execute circuit 546 produces the tenth fault decision signal having the logic one value. This shows that the tenth fault f10 propagates to the fourth level L4.

Thus, it is recognized that the tenth fault f10 propagates to the fourth level L4. As shown in FIG. 10, the fault value datum given by the logic one value and the fault identification number data related to the tenth fault f10 are memorized in the fault value area FA and the identification number area ID, respectively, in the fault data memory 530. The fault value datum and the fault identification number data related to the tenth fault f10 will be called tertiary fault data.

The tertiary fault data are read by the controller 537 out of the fault data memory 530. With reference to the tertiary fault data read from the fault data memory 530, the controller 537 searches the connection data memory 531 and detects the connection data representative of the connection destination of the OR gate 108. It is to be noted here that the OR gate 108 is connected to the output terminal 109. Accordingly, the connection destination of the OR gate 108 is the output terminal 109 and is symbolically depicted as 109 (R9) in the block depicted at 531.

The propagation data generating circuit 532 is supplied with the tertiary fault data together with the primary and the secondary fault data and the connection data related to the element data R9, namely, the output terminal 109, from the fault data memory 530 and the connection data memory 531, respectively, and generates tertiary propagation data related to the output terminal 109 in the manner mentioned in conjunction with FIG. 9. The tertiary propagation data are supplied to the propagation data memory 533. The propagation data memory 533 memorizes the tertiary propagation data comprising the primary, the secondary, and the tertiary fault data as tertiary memorized propagation data.

Figure 11:
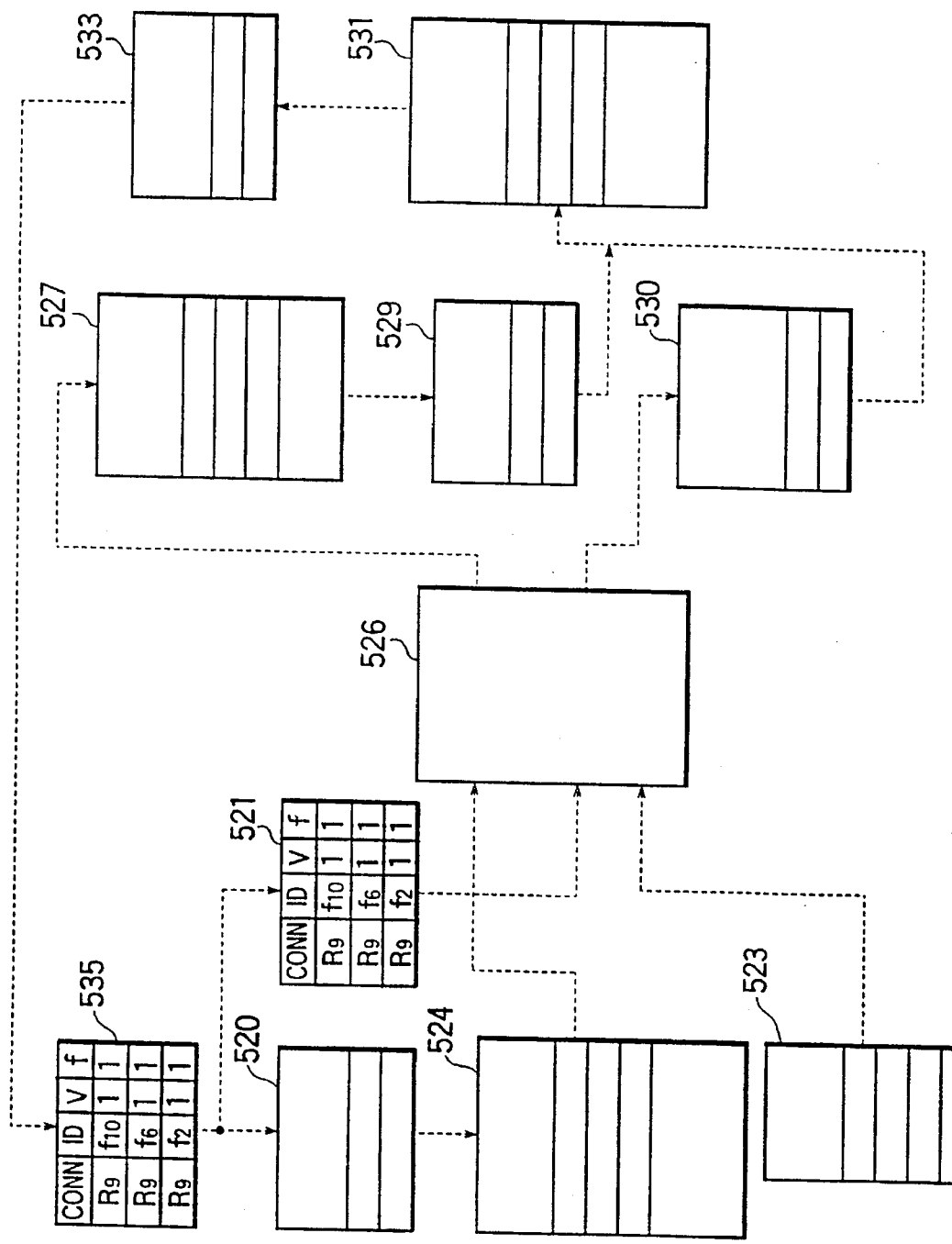
FIG. 11 is a schematic block diagram of the simulation execute circuit for use in describing data flow of detected faults in the simulation operation.

Temporarily turning back to FIG. 5, the tertiary memorized propagation data are supplied, as tertiary transferred data, to the transfer data memory 535 through the transfer circuit 534. The transfer data memory 535 memorizes the tertiary transferred data, as tertiary memorized data. The tertiary memorized data have the same content with the tertiary memorized propagation data. Therefore, the content of the transfer data memory 535 is similar to that of the propagation data memory 533 as shown in FIG. 11. The tertiary memorized data are supplied to the selection circuit 536 under control of the controller 537. The selection circuit 536 selects the tertiary memorized data as tertiary selected data and supplies the tertiary selected data to the fault event memory 521. The fault event memory 521 memorizes the tertiary selected data as tertiary fault event data. The content of fault event memory 521 is similar to that of the transfer data memory 535 as shown in FIG. 11.

Next, the controller 537 searches the fault event memory 521 to detect whether or not the fault event data are memorized in the fault event memory 521. As a result of the search, the controller 537 detects the tertiary fault event data related to the ninth element data R9, namely, the output terminal 109 and then searches the control data memory 522 to detect the ninth start address in the control data memory 522. In this event, the controller 537 detects the fact that the second completion flag in the fourth memory area AR4 has the logic one level. This means that the simulation reaches the fourth level, namely, the last level of the circuit model. Accordingly, the simulation related to the first input pattern signal P1 is completed. The controller 537 reads the fault event data representative of the second, the sixth, and the tenth faults f2, f6, and f10 out of the fault event memory 521 and supplies a fault data signal representative of the fault event data to the result data memory 53 (FIG. 3) as a part of the simulation result signal. The controller 537 further reads the correct value data out of the normal simulation result memory 527 and supplies a correct value signal representative of the correct value to the result data memory 53 as another part of the simulation result signal. Therefore, the fault data signal and the correct value signal may collectively be called the simulation result signal. Thus, the fault event data representative of the second, the sixth, and the tenth faults f2, f6, and f10 are memorized, as detected fault data, in the result data memory 53 together with the correct value as illustrated in FIG. 2b. In addition, the control unit 54 detects whether or not all of the first through the tenth faults are detected or whether or not a detection rate of the fault becomes equal to a predetermined detection rate. When all of the faults are detected or when the detection rate becomes equal to the predetermined detection rate, the simulation is completed. Otherwise, the simulation is repeated by the use of the second and the third input pattern signals.

Next, the simulation unit 52 carries out the first through the ninth normal simulations and the first through the ninth fault simulations by the use of the second input pattern signal P2 (FIG. 2a) in the manner mentioned in conjunction with FIGS. 8 to 11. As a result, the simulation unit 52 detects the third and the fifth faults f3 and f5. In addition, the correct value related to the second input pattern signal P2 has the logic zero value. The third and the fifth faults f3 and f5 are memorized, as the detected faults, in the result data memory 53 (FIG. 3) together with the correct value as shown in FIG. 2b.

Furthermore, the simulation unit 52 carries out the first through the ninth normal simulations and the first through the ninth fault simulations by the use of the third input pattern signal P3 (FIG. 2a) in the manner mentioned before. As a result of the simulations, the ninth fault f9 is detected. In this event, the correct value related to the third input pattern signal P3 has the logic one value. The ninth fault f9 is also memorized in the result data memory 53 together with the correct value as illustrated in FIG. 2b.

By the way, the simulation unit 52 detects the second, the third, the fifth, the ninth, and the tenth faults f2, f3, f5, f6, f9, and f10, as detected faults, by the use of the first through the third input pattern signals P1 to P3. However, the first, the fourth, the seventh, and the eighth faults f1, f4, f7, and f8 are not yet detected. Each of the faults f1, f4, f7, and f8 will be called an undetected fault. These undetected faults can be detected by using other input pattern signals.

Referring to FIG. 12, the description will be made as regards another example for generating the other input pattern signals instead of the signal generating circuit 51 illustrated in FIG. 4.

In FIG. 12, a signal generating circuit 51' comprises an undetected fault set circuit 550 and an automatic pattern generating circuit 551. The undetected fault set circuit 550 is supplied with detected fault data representative of the detected faults from the fault event memory 521 in the simulation unit 52 through a signal line 323. By the use of defined data representative of the first through the tenth faults f1 to f10 and the detected fault data, the undetected fault set circuit 550 decides the undetected fault under control of the control unit 54 and supplies undetected fault data representative of the undetected faults to the automatic pattern generating circuit 551. The automatic pattern generating circuit 551 is supplied with the logical type data and the connection data, in addition to the undetected fault data, from the logical type memory 523 and the connection data memory 531 through signal lines 321 and 322, respectively. The automatic pattern generating circuit 551 generates other input pattern signals for detecting the undetected faults.

Let the signal generating circuit 51' generate the other input pattern signal for detecting the first fault f1 as the undetected fault. At first, the undetected fault set circuit 550 detects the fact that the first, the fourth, the seventh, and the eighth faults f1, f4, f7, and f8 are not yet detected in accordance with the detected fault data representative of the detected faults f2, f3, f5, f6, f9, and f10, which are supplied from the fault event memory 521 through the signal line 323. Then, the undetected fault set circuit 550 selects the first fault f1 from the first, the fourth, the seventh, and the eighth faults f1, f4, f7, and f8 as a selected fault and supplies the selected fault f1 to the automatic pattern generating circuit 551.

Temporarily referring to FIG. 1 together with FIG. 12, when supplied with the selected fault f1, the automatic pattern generating circuit 551 sets the logic one value to the second input terminal 102 in accordance with the logical type data and the connection data which are supplied from the logical type memory 523 and the connection data memory 531 through signal lines 321 and 322, respectively. The automatic pattern generating circuit 551 sets the logic one value to the first input terminal 101 because the first fault f1 on the first signal line SL1 is the stuck-at-0 fault. In order to propagate the first fault f1 to the output terminal 109, it is necessary to give the logic zero value to the first and the second input pins of the OR gate 108, namely, the seventh and the sixth signal lines SL7 and SL6. For this purpose, the automatic pattern generating circuit 551 sets the logic zero value to at least one of the third and the fourth input terminals 103 and 104 and sets the logic zero value to the fifth input terminal 105. In the manner mentioned above, the first fault f1 propagates to the output terminal 109 and therefore the first fault f1 can be detected. Taking the above into consideration, the automatic pattern generating circuit 551 generates the other input pattern signal, as an additional input pattern signal, having a five bit pattern of "11010". Such a five bit pattern is shown by ATGP in FIG. 2a.

Figure 13:
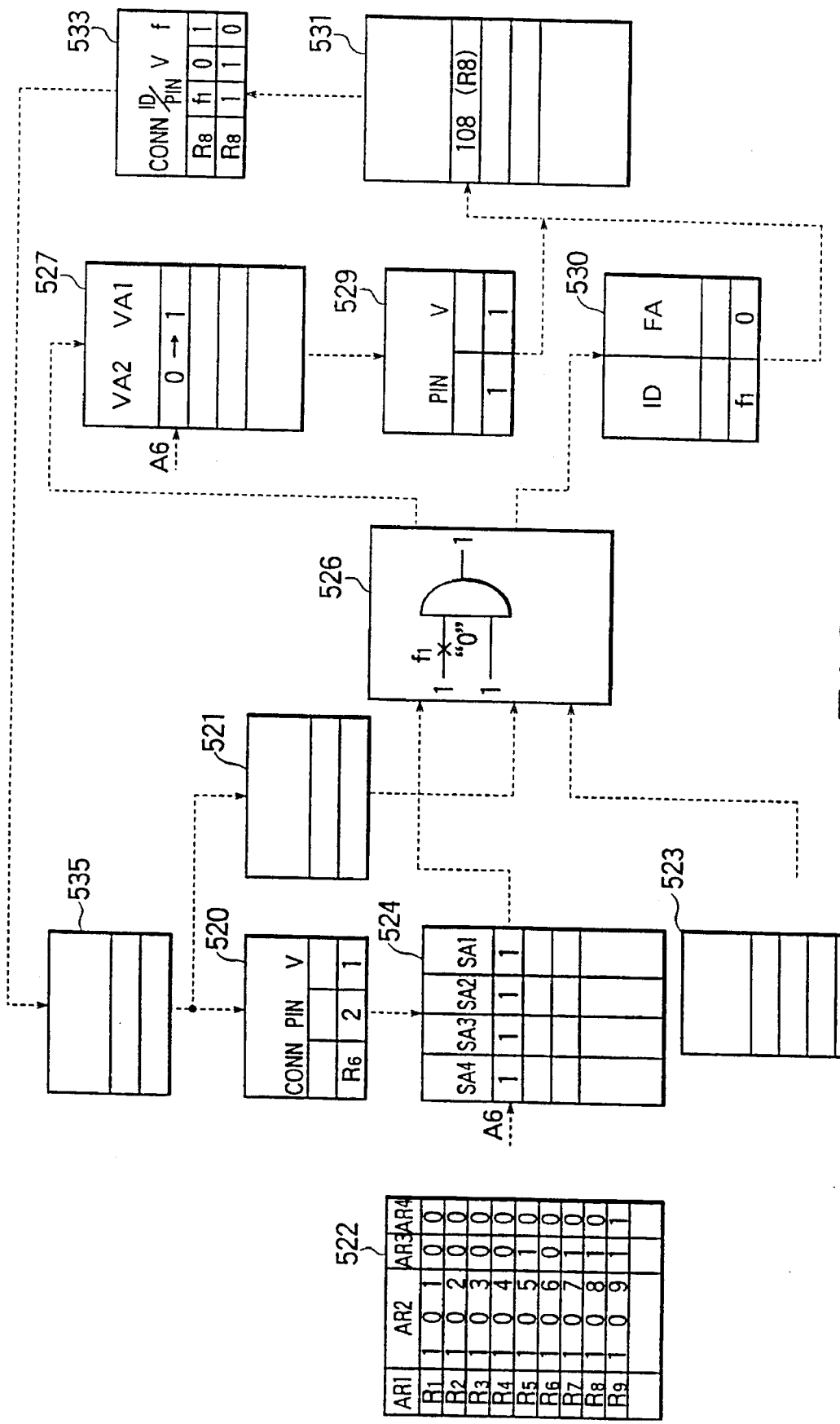
FIG. 13 is a schematic block diagram of the simulation execute circuit for use in describing simulation operation by the use of an additional input pattern signal.

The additional input pattern signal is supplied to the simulation unit 52. The simulation unit 52 carries out the simulation related to the first fault f1 by the use of the additional input pattern signal. In this event, both the normal event and the fault event occur in the simulation as illustrated in FIG. 13. In the input state memory 524, the logic zero value of the first and the second input state areas SA1 and SA2 are changed to the logic one value under control of the controller 537. In the simulation execute circuit 526, the normal simulation execute circuit 545 produces the normal result signal having the logic one value while the fault simulation execute circuit 546 produces the fault decision signal having the logic zero value. This means that the first fault f1 propagates to the third level L3. In this event, the correct value of the AND gate 106 is the logic one value. The correct value of the AND gate 106 is memorized in the new value area VA1 of the sixth address in the normal simulation result memory 527. The normal event monitoring circuit 528 detects the fact that the normal event occurs in the normal simulation and produces the normal event detection signal. This is because the correct value memorized in the new value area VA1 is different from the correct value memorized in the preceding value area VA2. The normal data memory 529 memorizes the fault value datum represented by the logic one value and the pin number data representative of the input pin number 1 of the AND gate 106.

As described above, since the fault simulation execute circuit 546 produces the fault decision signal having the logic zero value, the first fault f1 propagates to the third level L3. In this event, the fault propagation detection circuit 547 produces the fault define signal having the fault value datum represented by the logic zero value. Accordingly, the fault data memory 530 memorizes the fault value datum represented by the logic zero value and the fault identification number data representative of the first fault f1. In the manner mentioned above, the controller 537 searches the connection data memory 531 and detects the connection data representative of the connection destination of the AND gate 106. The connection destination of the AND gate 106 is the OR gate 108. The propagation data generating circuit 532 is supplied with the normal data read from the normal data memory 529 and the fault data read from the fault data memory 530 and generates the propagation data in the manner mentioned before. The propagation data comprise the normal data and the fault data. The normal data comprise the event value datum memorized in the event value area f and is represented by the logic zero value. The fault data comprise the fault value datum memorized in the fault value area v and is represented by the logic one value.

In addition, the simulation unit 52 further carries out the simulations related to the fourth, the seventh, and the eighth faults f4, f7, and f8 by the use of the additional input pattern signal. As a result of the simulations related to the fourth, the seventh, and the eighth faults f4, f7, and f8, if the undetected fault yet remains, the signal generating unit 51' further generates other input pattern signals in the manner mentioned above.

Figure 14:
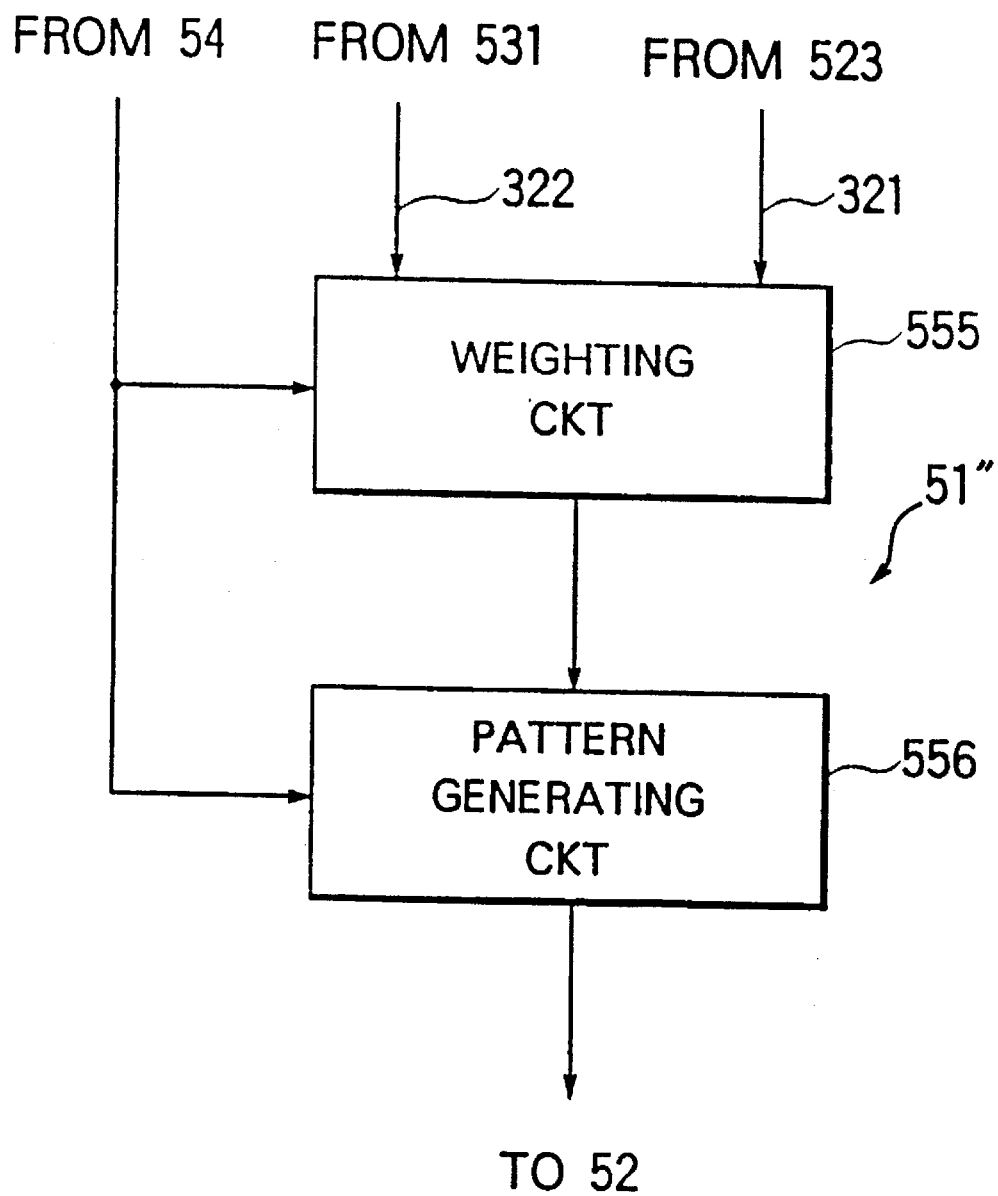
FIG. 14 is a block diagram of still another example of the signal generating circuit illustrated in FIG. 3.

Referring to FIG. 14, the description will proceed to still another example for generating the other input pattern signals instead of the signal generating circuit 51 illustrated in FIG. 4.

In FIG. 14, a signal generating circuit 51" comprises a weighting circuit 555 and a pattern generating circuit 556. The weighting circuit 555 is supplied with the logical type data and the connection data from the logical type memory 523 and the connection data memory 531, respectively. In the manner known in the art, the weighting circuit 555 carries out tracing operation from the output terminal of the logic circuit model to the input pins of the logic elements in the logic circuit model by the use of the logical type data and the connection data and carries out weighting operation in accordance with a predetermined evaluation standard to produce a weight signal. The weight signal is for weighting the bit pattern to be generated by the pattern generating circuit 556. The pattern generating circuit 556 generates the other input pattern signal, as a specific input pattern signal, in accordance with the weight signal.

Figure 15:
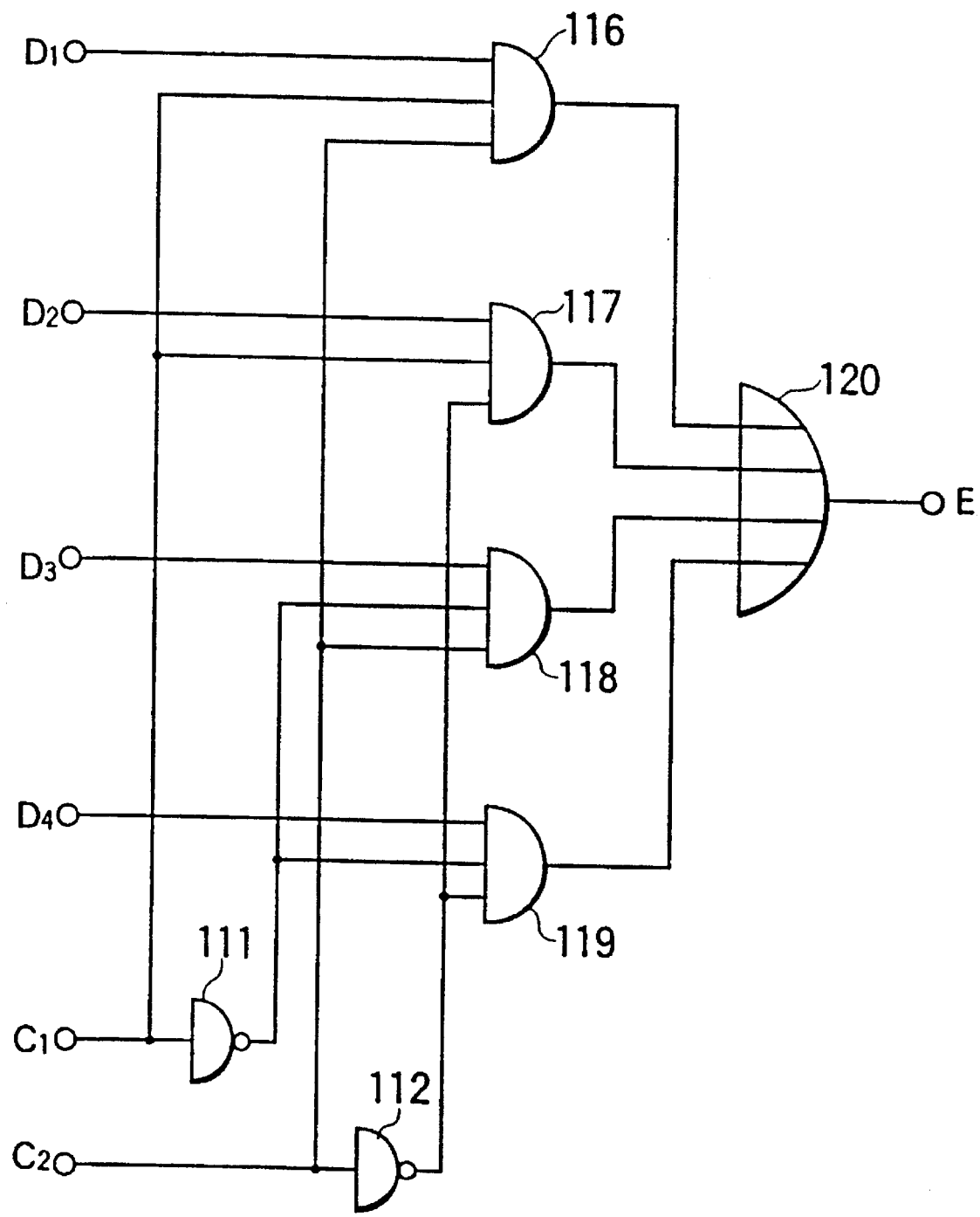
FIG. 15 shows another logic circuit model for use in describing signal generating operation of the signal generating circuit shown in FIG. 14.

Referring to FIG. 15, the description will be made as regards another example of the logic circuit model. An illustrated logic circuit model comprises first through fourth data input terminals D1, D2, D3, and D4, first and second inverter gates 111 and 112, first through fourth AND gates 116, 117, 118, and 119, an OR gate 120 and a data output terminal E. The logic circuit model is supplied with first through fourth input data signals through the first through the fourth data input terminals D1 to D4, respectively, and supplied with first and second control signals through the first and the second control signal input terminals C1 and C2, respectively. The logic circuit model is for selecting one of the first through the fourth input data signals in accordance with the first and the second control signals.

Let the logic circuit model shown in FIG. 15 be applied to the fault simulator according to this invention. Taking the fact into consideration, let the signal generating circuit 51" generate the specific input pattern signal which is suitable for the illustrated logic circuit model. When the weighting circuit 555 is supplied with the logical type data and the connection data under control of the control unit 54, the weighting circuit 555 searches the logic circuit model by carrying out the tracing operation from the data output terminal E to each of the input pins of the OR gate 120 and detects the OR gate 120. Then, the weighting circuit 555 further searches the logic circuit model by carrying out the tracing operation from the OR gate 120 to fan-in side of the logic circuit model and detects the first through the fourth AND gates 116 to 119. In such a tracing operation, the weighting circuit 555 detects, in accordance with the predetermined evaluation standard, whether or not a test pattern can be generated easily. For example, as an example of the predetermined evaluation standard, the weighting circuit 555 detects the fact whether or not the fan-in side receives signals from a common logic element.

In the example being illustrated, the weighting circuit 555 never detects the above-mentioned fact in the tracing operation from the OR gate 120 to each of the first through the fourth AND gates 116 to 119. However, the weighting circuit 555 detects the above-mentioned fact in the tracing operation from each of the first through the fourth AND gates 116 to 119 to the fan-in side. For example, the weighting circuit 555 detects the second inverter gate 112 either when the weighting circuit 555 carries out the tracing operation from the second AND gate 117 to the fan-in side, or when the weighting circuit 555 carries out the tracing operation from the fourth AND gate 119 to the fan-in side. This means that an output signal of the second inverter gate 112 is used in common in the second and the fourth AND gates 117 and 119. In this event, it is necessary to weight the test pattern for the second inverter gate 112. Likewise, it is necessary to weight the test pattern for the first inverter gate 111. Taking the above into consideration, the weighting circuit 555 generates the weighting signal.

Next, the pattern generating circuit 556 generates the specific input pattern signal, as the test pattern, in accordance with the weighting signal. For example, the pattern generating circuit 556 generates the specific input pattern signal having a comprehensive pattern for the first and the second control signals supplied through the first and the second control signal input terminals C1 and C2 because the first and the second control signals should be weighted. The pattern generating circuit 556 generates the specific input pattern signal having a typical pattern for the first through the fourth input data signals supplied through the first through the fourth data input terminals D1 to D4. Such a comprehensive pattern and a typical pattern are illustrated in FIG. 16.

Figure 16:
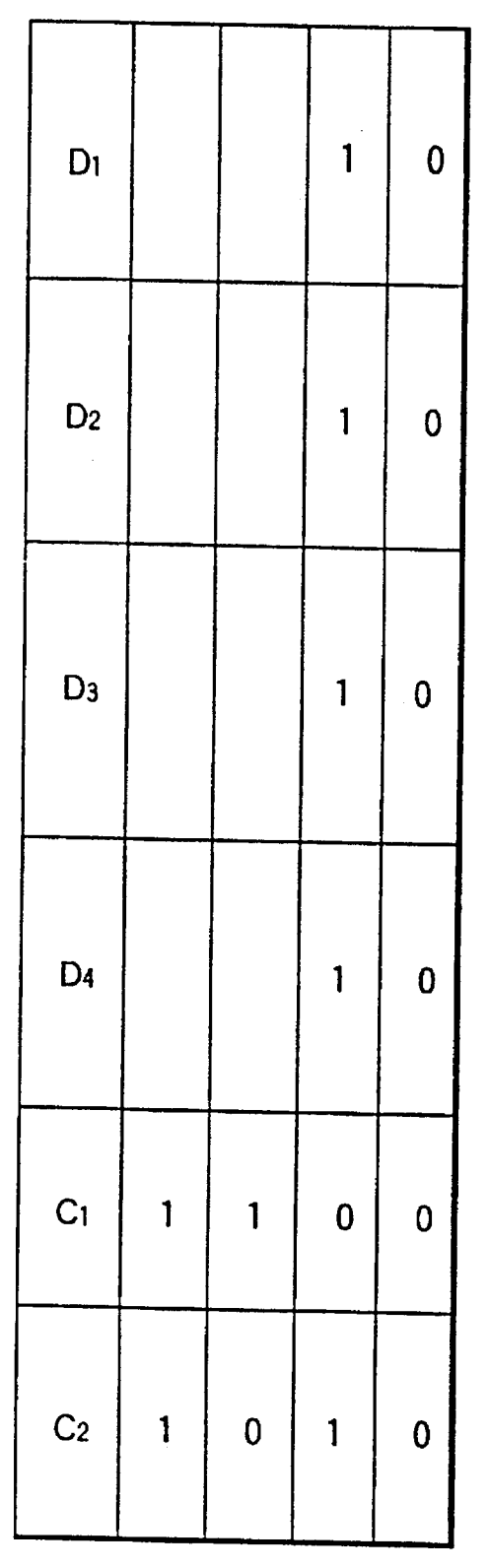

In FIG. 16, the first and the second control signal input terminals C1 and C2 are supplied with the comprehensive pattern which is given by the bit patterns of "00", "01", "10", and "11". The first through the fourth data input terminals D1 to D4 are supplied with the typical pattern which is given by the bit patterns of "0000" and "1111". Accordingly, the number of the bit pattern of the specific input pattern signal becomes equal to eight (4×2). In the logic circuit model illustrated in FIG. 15, if the specific input pattern signal is generated without the above-mentioned weighting operation, the number of the bit pattern becomes equal to sixty-four ($2^6$). This means that the number of the bit pattern can be reduced by one eighth by carrying out the weighting operation. In the illustrated logic circuit model, if the first and the second control signal input terminals C1 and C2 are supplied with the above-mentioned four bit patterns of "00", "01", "10", and "11", all of the first through the fourth data input terminals D1 to D4 are activated and all of the faults can be detected.

Figure 17:
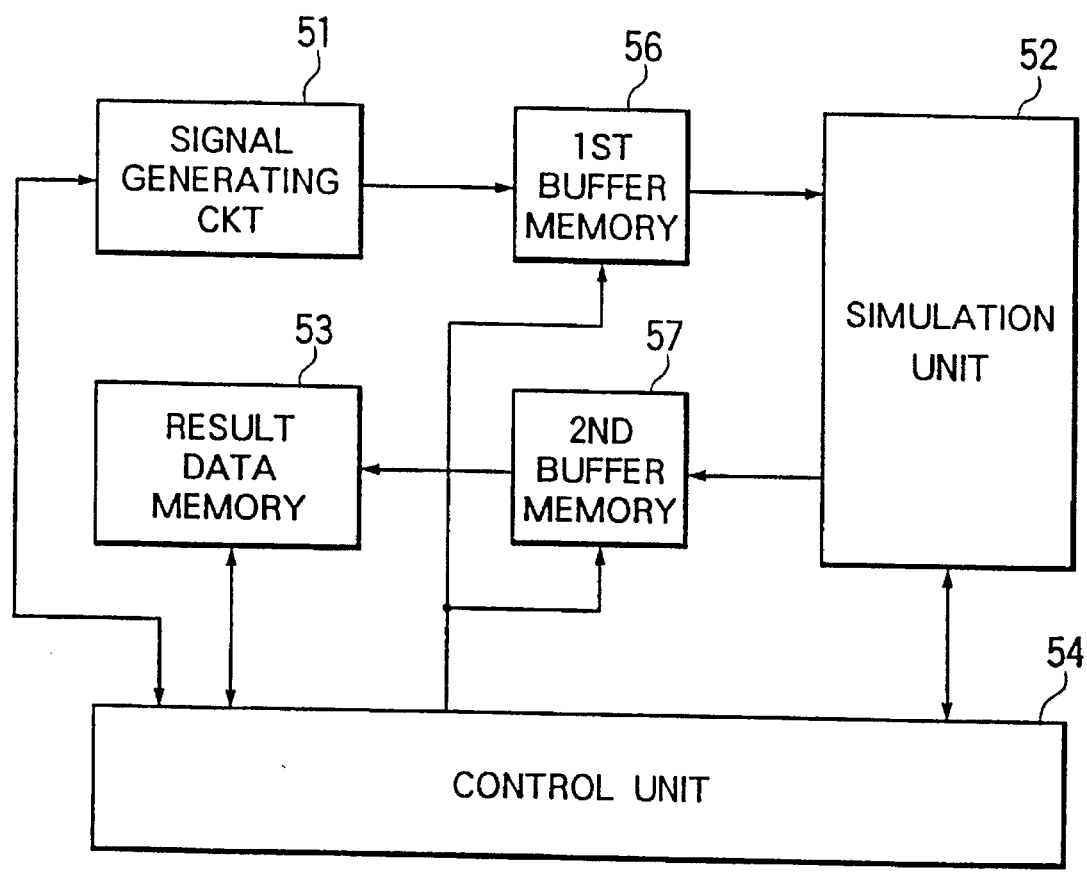
FIG. 17 is a block diagram of a fault simulator according to a second embodiment of this invention.

Referring to FIG. 17, the description will proceed to a fault simulator of a second embodiment according to this invention. The fault simulator is similar to that illustrated in FIG. 3 except for first and second buffer memories 56 and 57.

In FIG. 17, the first buffer memory 56 is connected between the signal generating circuit 51 and the simulation unit 52 and is connected to the control unit 54. The first buffer memory 56 is for memorizing the first through the n-th input pattern signals as first through n-th memorized input pattern signals. The second buffer memory 57 is connected between the simulation unit 52 and the result data memory 53 and is connected to the control unit 54. The second buffer memory 57 is for memorizing the detected faults and the correct values as memorized buffer data. The control unit 54 accesses the first buffer memory 56 to make the first buffer memory 56 supply the first through the n-th memorized input pattern signals one by one to the simulation unit 52 and accesses the second buffer memory 57 to make the second buffer memory 57 supply the memorized buffer data one by one to the result data memory 53.

According to this structure, the fault simulator can carry out generating operation of the input pattern signals, memorizing operation thereof, and simulation operation of the logic circuit model at the same time. For example, when the signal generating circuit 51 generates the first input pattern signal, the first input pattern signal is memorized in the first buffer memory 56. Subsequently, the signal generating circuit 51 can carry out the generating operation of the next input pattern signal, namely, the second input pattern signal. On the other hand, when the simulation related to the first memorized input pattern signal is completed, the simulation unit 52 supplies the detected faults and the correct value, both of which are related to the first memorized input pattern signal, to the second buffer memory 57. Subsequently, the simulation unit 52 can carry out the simulation operation by the use of the second memorized input pattern signal supplied from the first buffer memory 56. Thus, the simulation unit 52 can carry out the simulation operation in parallel with the generation of the input pattern signals. This means that the necessary time duration for the simulation operation can be reduced.

Figure 18:
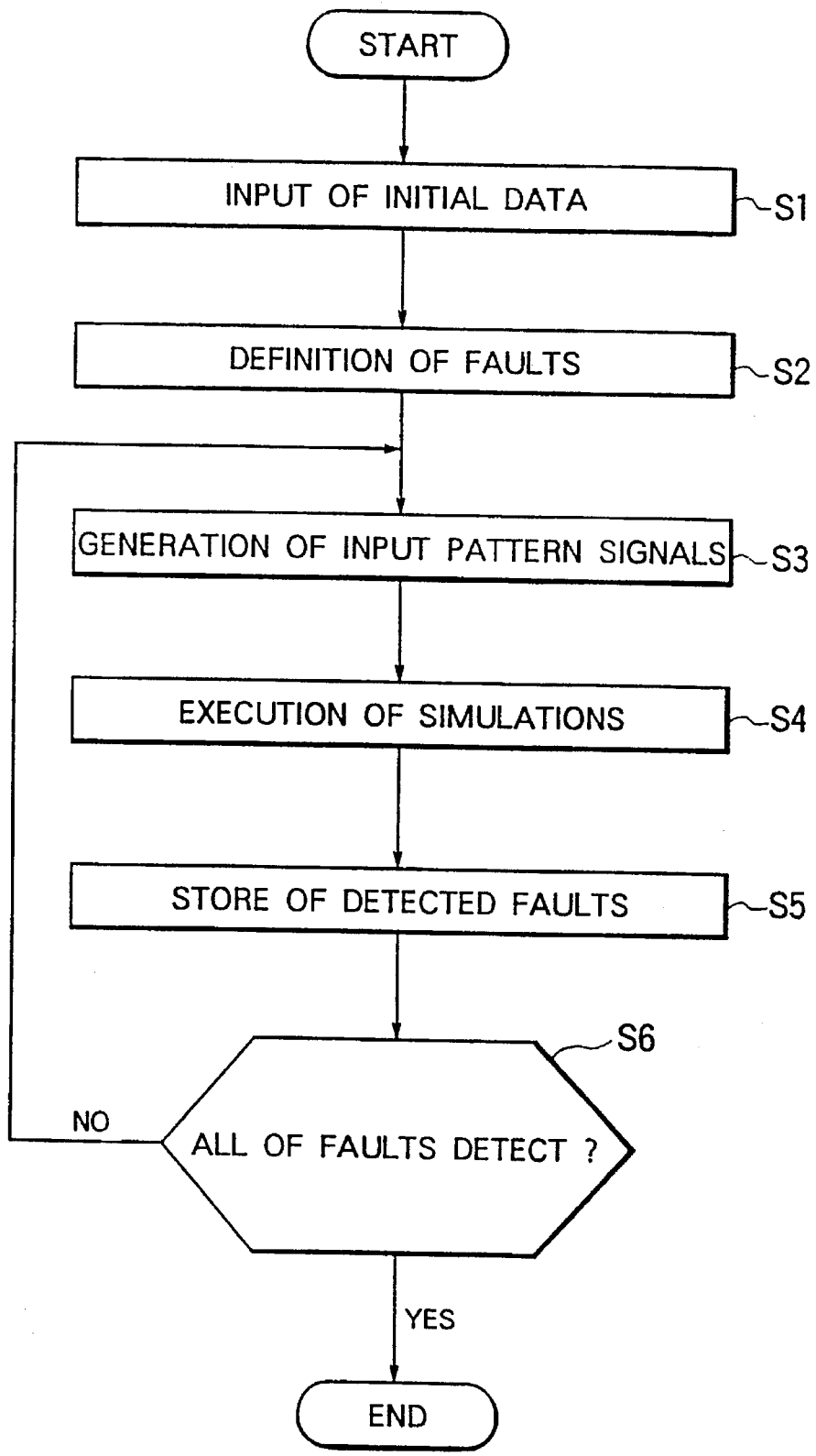
FIG. 18 shows a flow chart for use in describing the simulation operation illustrated in FIG. 3.

Referring to FIG. 18, the above-described simulations are characterized by the following steps.

At a first step S1, the logical type data, the connection data, the initial states of each of the logic elements, and the like are memorized, as initial data, in the logical type memory 523, the connection data memory 531, the input state memory 524, and the like. At a second step S2, the first through the tenth faults f1 to f10 are defined. At a third step S3, the signal generating circuit 51 generates the first input pattern signal.

At a fourth step S4, the simulation unit 52 simulates the logic circuit model by the use of the first input pattern signal. As a result of the simulation, the second, the sixth, and the tenth faults f2, f6, and f10 are detected. At a fifth step f5, these detected faults f2, f6, and f10 are memorized in the result data memory 53 together with the correct values as illustrated in FIG. 2b.

At a sixth stage S6, the control unit 54 detects whether or not all of the first through the tenth faults are detected or whether or not the detection rate of the fault becomes equal to the predetermined detection rate. When all of the first through the tenth faults are detected or when the detection rate of the fault becomes equal to the predetermined detection rate, the simulation is completed. Otherwise, operation turns back to the third step S3. At the third step S3, the signal generating circuit 51 generates the second input pattern signal. Then, the third through the sixth steps S3 to S6 are repeated until all of the first through the tenth faults are detected or until the detection rate of the fault becomes equal to the predetermined detection rate.

Figure 19:
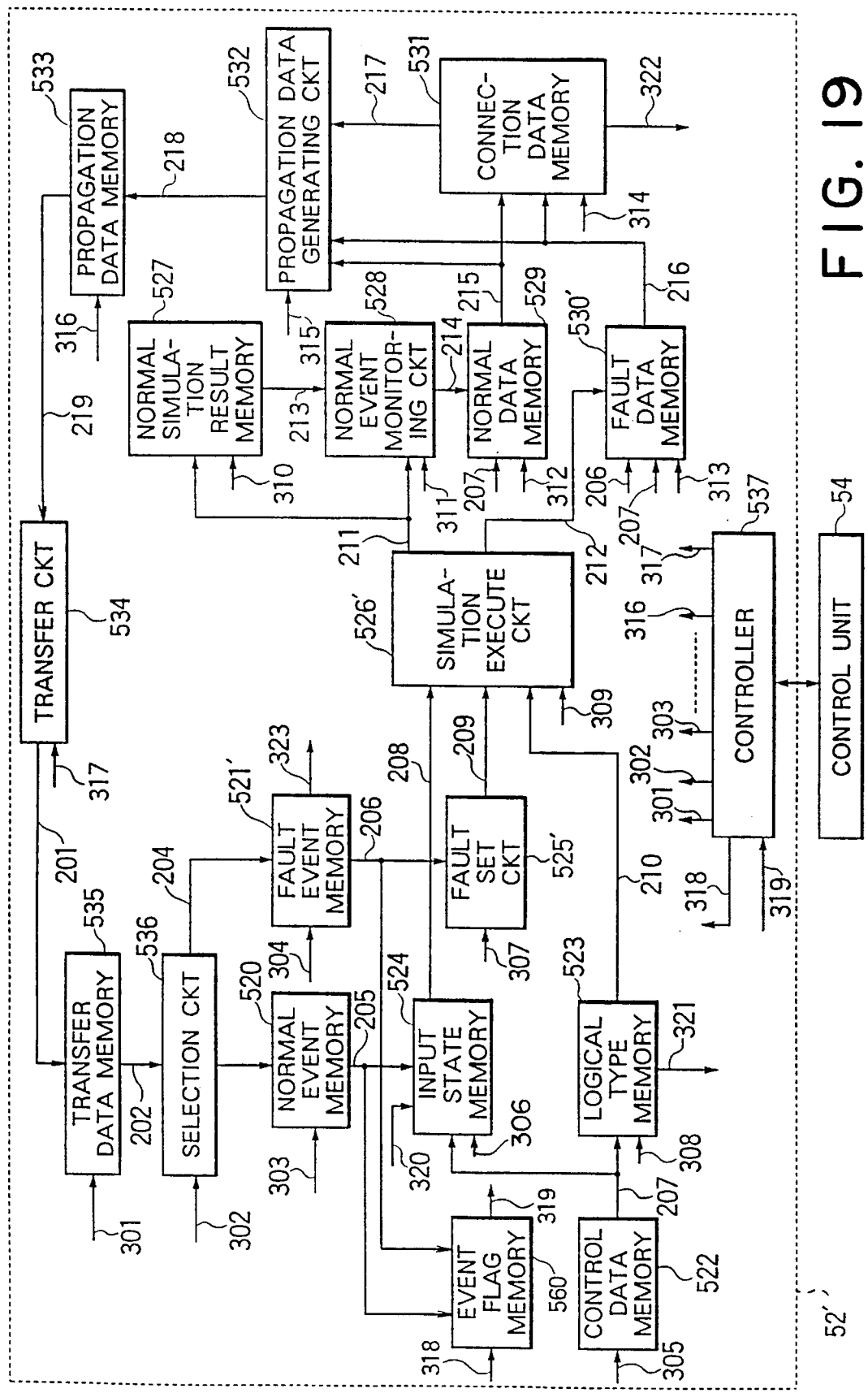
FIG. 19 is a block diagram of another example of the simulation unit illustrated in FIG. 3.

Referring to FIG. 19, the description will proceed to another example for carrying out the simulations instead of the simulation unit 52 illustrated in FIG. 5. A simulation unit 52' comprises similar parts designated by like reference numerals except for a fault event memory 521', a fault set circuit 525', a simulation execute circuit 526', a fault data memory 530', and an event flag memory 560. As will later be described, the event flag memory 560 is connected to the normal event memory 520 and the fault event memory 521' and is for memorizing flags indicative of whether the normal event or the fault event takes place in each of the logic elements.

Figure 20:
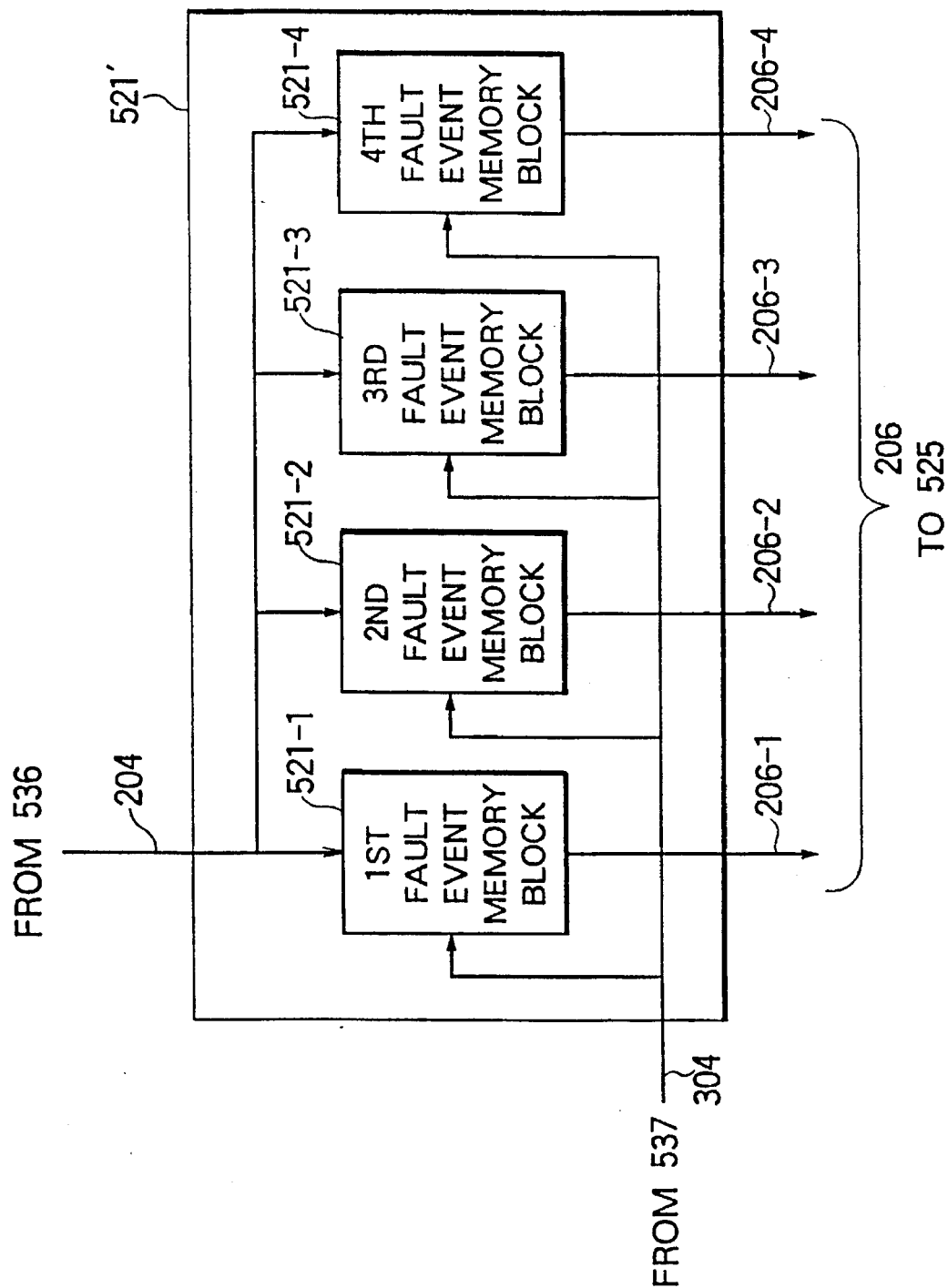
FIG. 20 is a block diagram of a fault event memory illustrated in FIG. 19.

Referring to FIG. 20, the description will proceed to the fault event memory 521'. The fault event memory 521' comprises first through fourth fault event memory blocks 521-1, 521-2, 521-3, and 521-4 which are connected in parallel to each other and which are the same in structure with each other. According to this structure, the first through the fourth fault event memory blocks 521-1 to 521-4 are supplied with first through fourth fault event data from the selection circuit 536 through the signal line 204 and can memorize the first through the fourth fault event data, respectively, in the same address as first through fourth memorized fault event data. Furthermore, the first through the fourth memorized fault event data can be simultaneously read out of the first through the fourth fault event memory blocks 521-1 to 521-4, respectively, as first through fourth read-out fault event data under control of the controller 537. The first through the fourth read-out fault event data are supplied to the fault set circuit 525' through the signal line 206 at the same time. In addition, the number of the fault event memory blocks is not limited to four.

Figure 21:
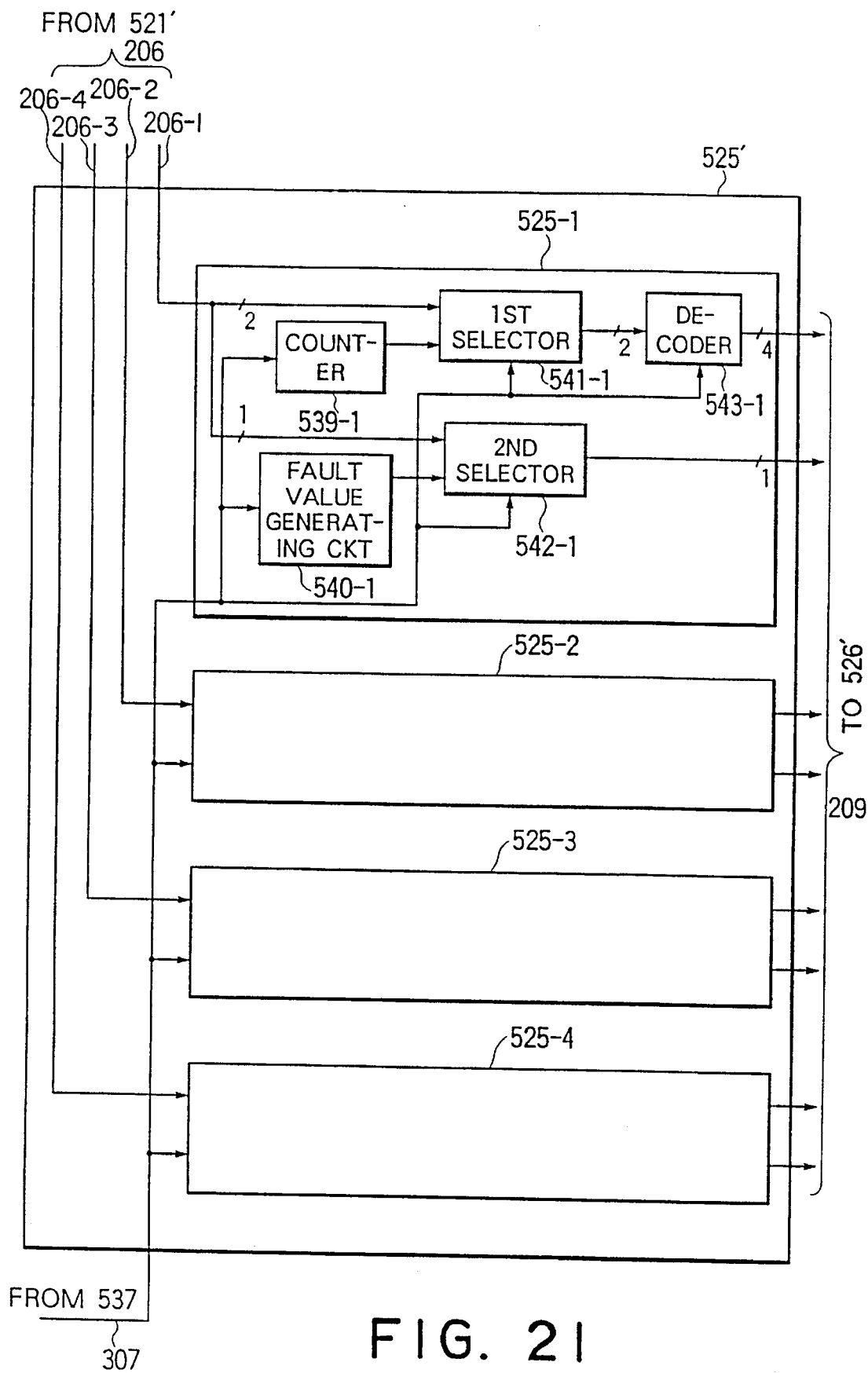
FIG. 21 is a block diagram of a fault set circuit shown in FIG. 19.

Referring to FIG. 21, the description will be made as regards the fault set circuit 525'. The fault set circuit 525' is for generating first through fourth fault set data at the same time and comprises first through fourth fault set circuit blocks 525-1, 525-2, 525-3, and 525-4 which are connected in parallel to each other and which are the same in structure with each other. The number of the fault set circuit blocks is equal to that of the fault event memory blocks illustrated in FIG. 20. For example, the first fault set circuit block 525-1 comprises a counter 539-1, a fault value generating circuit 540-1, first and second selectors 541-1 and 542-1, and a decoder 543-1 and is the same in structure with the fault set circuit 525 shown in FIG. 6. Therefore, operation of the first fault set circuit block 525-1 is similar to that-illustrated in FIG. 6. Each of the second through the fourth fault set circuit blocks 525-2 to 525-4 is the same in structure with the first fault set circuit block 525-1. Therefore, the structure of each of the second through the fourth fault set circuit blocks 525-2 to 525-4 are omitted. At any rate, the first through the fourth fault set circuit blocks 525-1 to 525-4 are supplied with the first through the fourth read-out fault event data, respectively, from the fault event memory 521' through the signal line 206. The first through the fourth fault set circuit blocks 525-1 to 525-4 supply the first through the fourth fault set data, respectively, to the simulation execute circuit 526' through the signal line 209.

Figure 22:
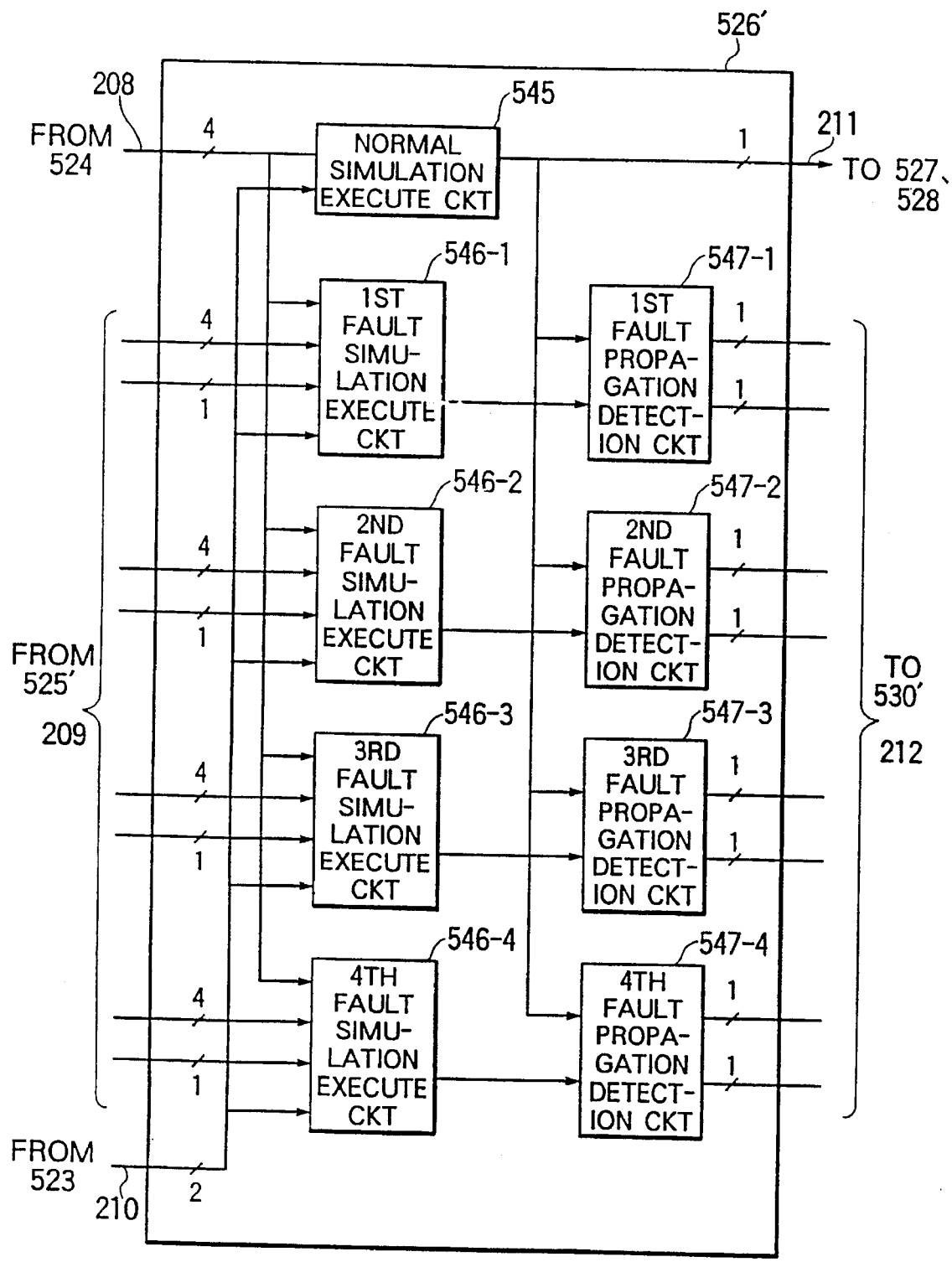
FIG. 22 is a block diagram of a simulation execute circuit shown in FIG. 19.

Referring to FIG. 22, the description will proceed to the simulation execute circuit 526'. The simulation execute circuit 526' is for executing the normal simulation and four kinds of fault simulations at the same time by the use of the first through the fourth fault set data supplied from the first through the fourth fault set circuit blocks 525-1 to 525-4. The simulation execute circuit 526' comprises the normal simulation execute circuit 545 similar to that illustrated in FIG. 7, first through fourth fault simulation execute circuits 546-1, 546-2, 546-3, and 546-4 and first through fourth fault propagation detection circuits 547-1, 547-2, 547-3, and 547-4. The number of the fault simulation execute circuits and the number of the propagation detection circuits are equal to the number of the fault set circuit blocks illustrated in FIG. 21. Operation of each of the first through the fourth simulation circuits 546-1 to 546-4 is similar to the fault simulation execute circuit 546 illustrated in FIG. 7. Likewise, operation of each of the first through the fourth propagation detection circuits 547-1 to 547-4 is similar to the fault propagation detection circuit 547 illustrated in FIG. 7.

Figure 23:
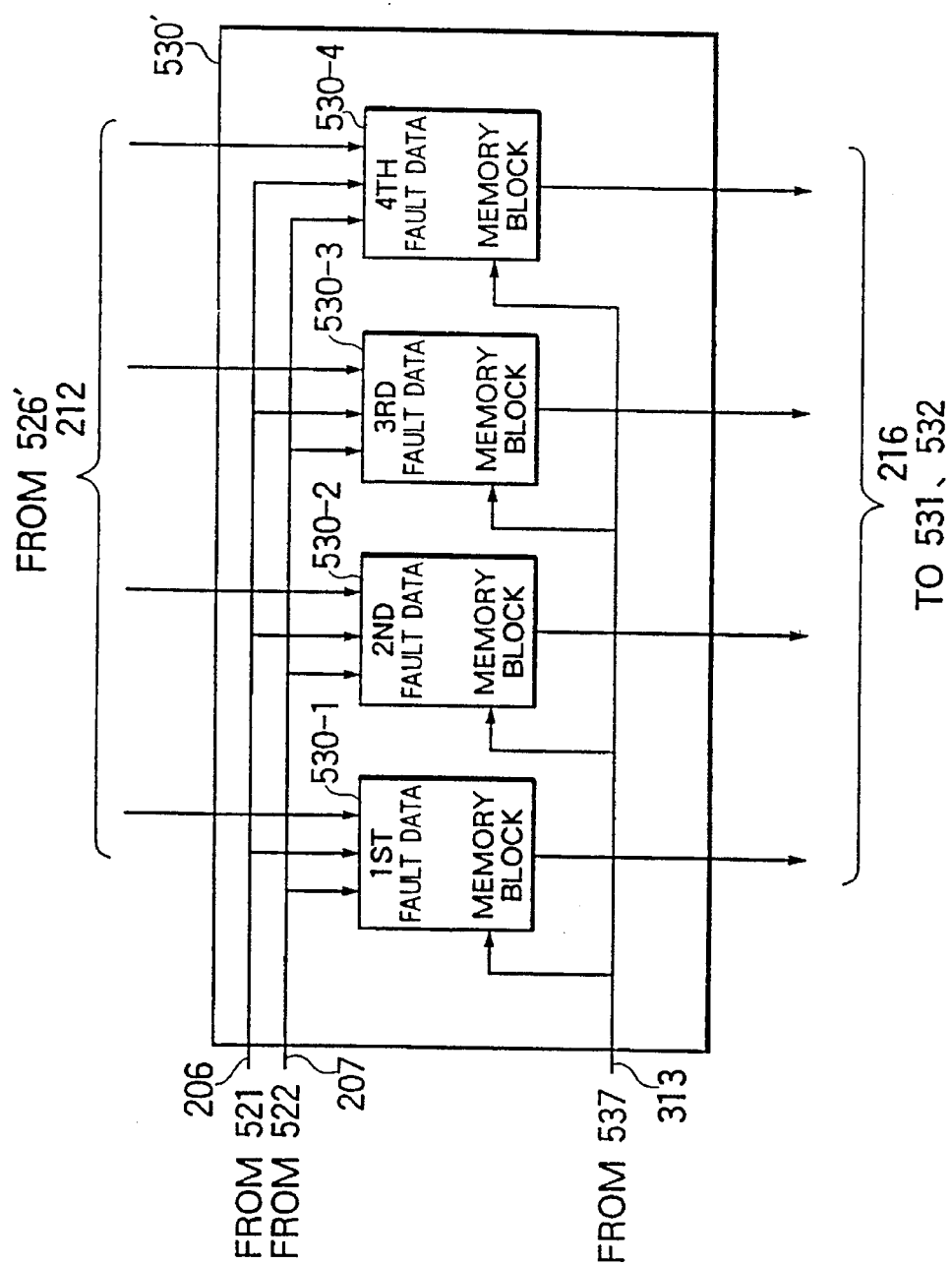
FIG. 23 is a block diagram of a fault data memory illustrated in FIG. 19.

Referring to FIG. 23, the fault data memory 530' comprises first through fourth fault data memory blocks 530-1 to 530-4 which are connected to the first through the fourth fault propagation detection circuits 547-1 to 547-4, respectively. As will later be described, the first through the fourth fault data memory blocks 530-1 to 530-4 memorize the element data supplied from the control data memory 522 and memorize the output data supplied from the first through the fourth fault propagation detection circuits 547-1 to 547-4. Each of the data memorized in each of the first through the fourth fault data memories 530-1 to 530-4 will be called first through fourth fault data, respectively. Each of the first through the fourth fault data are supplied to the connection data memory 531 and the propagation data generating circuit 532 through the signal line 216.

Referring to FIGS. 24 to 27 together with FIG. 19, the description will proceed to operation of the simulation unit 52' which executes the simulation of the circuit model illustrated in FIG. 1. Let the input states of the first through the fifth input terminals 101 to 105 be initialized at all zero.

Figure 24:
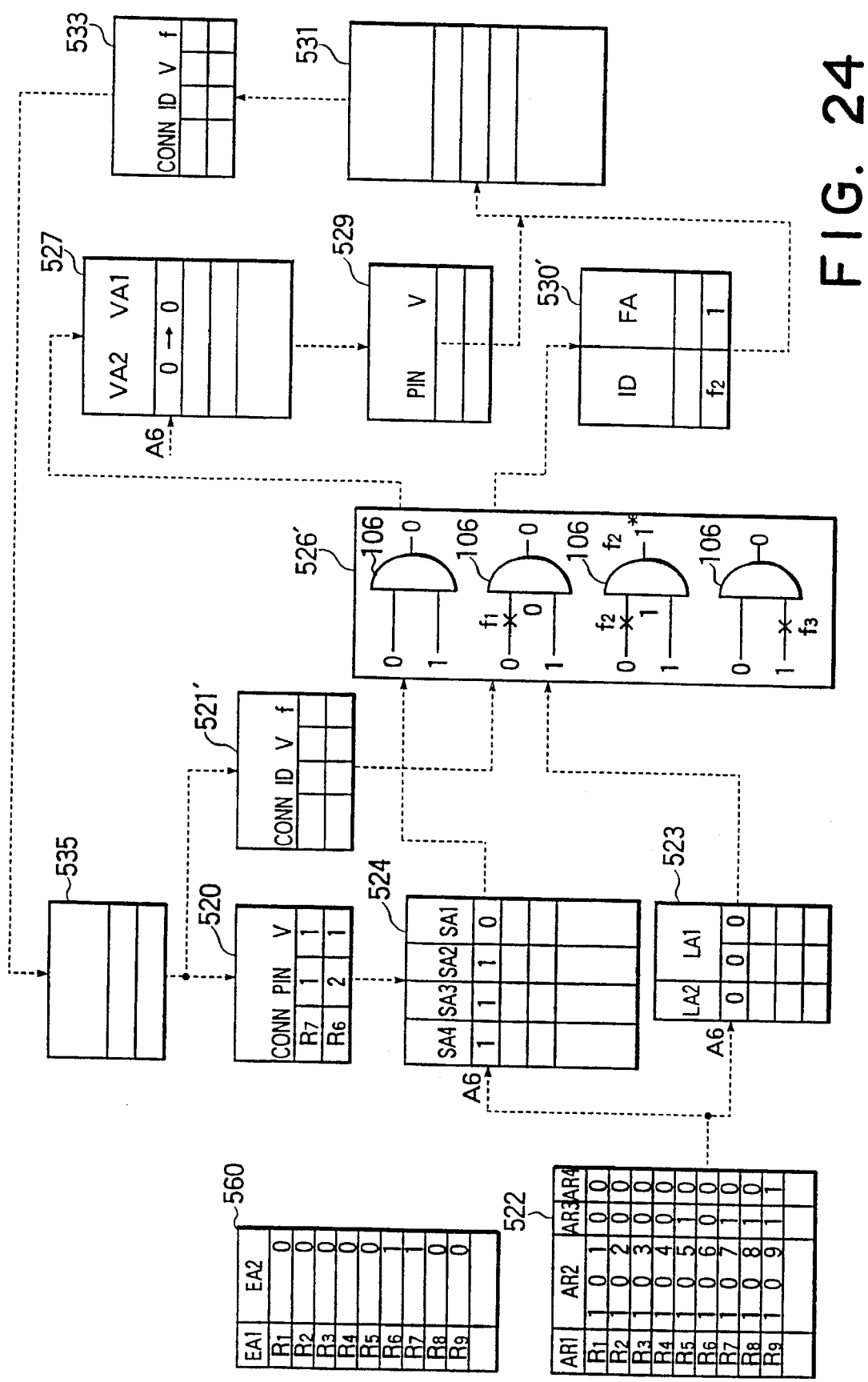
FIG. 24 is a schematic block diagram of the simulation execute circuit shown in FIG. 19 for use in describing simulation operation of the logic element illustrated in FIG. 1.

In FIG. 24, the event flag memory 560 comprises first and second memory areas EA1 and EA2. Like the control data memory 522, the event flag memory 560 memorizes the first through the ninth element data in the first memory area EA1 as the first through the ninth memorized element data which are symbolically depicted as R1 to R9. The event flag memory 560 further memorizes first through ninth event flags in the second memory area EA2 in one-to-one correspondence to the first through the ninth element data. Each of the event flags indicates whether either of the normal event or the fault event takes place in each of the circuit and the logic elements. When the event flag has the logic one value, it means that one of the normal event or the fault event occurs.

The operation is started by giving the first input pattern signal P1 to the input state memory 524. The controller 537 detects whether or not each of the input states of the first through the fifth input terminals 101 to 105 of the first level L1 changes from zero to one. In the example illustrated in FIG. 1, the input states of the second and the third input terminals 102 and 103 change from zero to one. This means that the normal events occur in the second and the third input terminals 102 and 103. Such normal events propagate to a next following level, namely, the second level L2. In the simulation unit 52', the changes of the input terminals 102 and 103 are transferred from the input state memory 524 to the normal event memory 520 through the simulation execute circuit 526', the normal simulation result memory 527, the normal event monitoring circuit 528, the normal data memory 529, the connection data memory 531, the propagation data generating circuit 532, the propagation data memory 533, the transfer circuit 534, the transfer data memory 535, and the selection circuit 536. Thus, the operation of the first level L1 is completed. The simulation of the logic elements starts from the second level L2.

In FIG. 24, the control data memory 522 memorizes the first through the ninth element data, as the first through the ninth memorized element data R1 to R9, in the first memory area AR1 and memorizes the first through the ninth start addresses 101 to 109, as the first through the ninth memorized start addresses, in the second area AR2 as described in conjunction with FIG. 8. The first through the ninth memorized element data represent the first through the fifth input terminals 101 to 105, the AND gates 106 and 107, the OR gate 108, and the output terminal 109 in one-to-one correspondence. Each of the first through the ninth memorized start addresses is for designating start address of the logical type memory 523, the input state memory 524, and the normal simulation result memory 527.

The control data memory 522 further memorizes the first and the second completion flags in the third and the fourth memory areas AR3 and AR4, respectively, in one-to-one correspondence to the first through the ninth memorized element data. In the example, the first completion flag having the logic one value is given to each of the fifth terminal 105, the AND gate 107, the OR gate 108, and the output terminal 109 illustrated in FIG. 1 while the second completion flag having the logic one value is given to the output terminal 109.

The normal event memory 520 memorizes the normal event data occurred in the first level L1. The normal event data are related to the second input terminal 102 connected to the AND gate 106 and the third input terminal 103 connected to the AND gate 107. The normal event data comprise the connection data representative of the connection destination designated by one of the first through the ninth addresses in the control data memory 522, the pin number data which represent the input pin number of the logic element designated by one of the first through the ninth addresses in the control data memory 522, and the fault value datum represented by one of the logic zero and one values which are set to the input pin of the logic element designated by one of the first through the ninth addresses in the control data memory 522.

In the example being illustrated, the normal event memory 520 memorizes the connection data, as the first connection data, in the connection data area CONN, which is related to the sixth memorized element data R6 and which designates the sixth memorized start address 106 in the control data memory 522. Furthermore, the normal event memory 520 memorizes the connection data, as the second connection data, in the connection data area CONN, which is related to the seventh memorized element data R7 and which designates the seventh memorized start address 107 in the control data memory 522. This is because the normal event already occurred in the second and the third input terminals 102 and 103 in the first level L1 as mentioned before.

The normal event memory 520 further memorizes the pin number data, as the first memorized pin number data, in the pin number data PIN, which represents the number 2 of the second input pin of the AND gate 106 and which is related to the first connection data. The normal event memory 520 also memorizes the pin number data, as the second memorized pin number data, in the pin number data area PIN, which represents the number 1 of the first input pin of the AND gate 107 and which is related to the second connection data. The normal event memory 520 still further memorizes the fault value datum, as the first memorized fault value datum, in the fault value area V, which is represented by the logic one value and which is related to the first connection data and memorizes the fault value datum, as the second memorized fault value datum, in the fault value area V, which is represented by the logic one value and which is related to the second connection data. The first memorized connection data, the first memorized pin number data, and the first memorized fault value datum will collectively be called the primary normal event data while the second memorized connection data, the second memorized pin number data, and the second memorized fault value datum will collectively be called the secondary normal event data. In accordance with the primary and the secondary normal event data, the controller 537 changes the sixth and the seventh event flags from the logic zero value to the logic one value as shown in FIG. 24.

As mentioned in conjunction with FIG. 8, the input state memory 524 memorizes the first through the ninth input state data, as the first through the ninth memorized input state data, in one-to-one correspondence to the first through the ninth element data R1 to R9. The logical type memory 523 memorizes the first through the ninth logical type data in one-to-one correspondence to the first through the ninth element data R1 to R9 and the first through the ninth output type data in one-to-one correspondence to the first through the ninth element data R1 to R9.

Taking the above into consideration, the controller 537 (FIG. 19) searches the event flag memory 560 to detect whether or not the event flag having the logic one value is memorized in the event flag memory 560. As a result of the search, the controller 537 detects the fact that the sixth event flag has the logic one value. The sixth event flag is related to the sixth element data R6, namely, the AND gate 106. In accordance with the fact, the controller 537 searches the control data memory 522 to detect the sixth start address in the control data memory 522. Subsequently, the controller 537 searches the sixth address depicted at A6 in the input state memory 524 in accordance with the sixth start address detected from the control data memory 522. In the sixth address of the input state memory 524, the logic zero value has already been memorized in the first and the second input state areas SA1 and SA2 and the logic one value has already been memorized in the third and the fourth input state areas SA3 and SA4 as the initial state of the input state data related to the AND gate 106. Next, the controller 537 changes the logic zero value of the second input state area SA2 to the logic one value in accordance with the primary normal event data which is related to the AND gate 106 and which include the pin number data representative of the number 2 of the second input pin of the AND gate 106. In the sixth address of the logical type memory 523, the logical type data "00" indicative of the AND gate have already been memorized in the first type area LA1 and the output value datum represented by the logic zero value has already been memorized in the second type area LA2. The logical type data and the output value datum will collectively be called the type data.

It is to be noted here that the first through the third faults f1 to f3 are given to the AND gate 106 as shown in FIG. 1. For this purpose, the fault set circuit 525' generates first through third new fault set data at the same time by the use of the first through the third fault set circuit blocks 525-1 to 525-3 illustrated in FIG. 21.

The simulation execute circuit 526' is supplied with the type data, the input state data, and the first through the third new fault set data, from the logical type memory 523, the input state memory 524, and the fault set circuit 525', respectively. As illustrated at a first stage, namely, an uppermost stage, in a box depicted at 526', the simulation execute circuit 526' carries out the normal simulation of the AND gate 106 by the use of the normal simulation execute circuit 545 illustrated in FIG. 22. Simultaneously, as illustrated at second through fourth stages in the box depicted at 526', the simulation execute circuit 525' carries out the first through the third fault simulations of the AND gate 106 at the same time by the use of the first through the third fault simulation execute circuits 546-1 to 546-3, respectively, illustrated in FIG. 22. The first through the third fault simulations are for the first through the third faults f1 to f3, respectively.

As mentioned in conjunction with FIG. 8, the normal simulation execute circuit 545 produces the normal result signal having the logic zero value. The logic zero value given by the normal result signal is the correct value of the output of the AND gate 106 and is memorized in the new value area VA1 of the sixth address in the normal simulation result memory 527. The first fault simulation execute circuit 546-1 produces the first fault decision signal having the logic zero value. This means that the first fault f1 never propagates to the third level L3 because the first fault decision signal has the logic zero value equal to those of the normal result signal. The second fault simulation execute circuit 546-2 produces the second fault decision signal having the logic one value. This means that the second fault f2 propagates to the third level L3 because the second fault decision signal has the logic one value different from those of the normal result signal. The third fault simulation execute circuit 546-3 produces the third fault decision signal having the logic zero value. This means that the third fault f3 never propagates to the third level L3.

Thus, it is recognized that the second fault f2 propagates to the third level L3. The fault value datum given by the logic one value and the fault identification number data related to the second fault f2 are memorized in the fault value area FA and the fault identification number area ID, respectively, in the first fault data memory block 530-1 (FIG. 23) of the fault data memory 530'. The fault value datum and the fault identification number data related to the second fault f2 will collectively be called the primary fault data. When the simulation related to the AND gate 106 is completed, the primary normal event data are deleted from the normal event memory 520 under control of the controller 537. Furthermore, the controller 537 changes the sixth event flag in the event flag memory 560 from the logic one value to the logic zero value.

Figure 25:
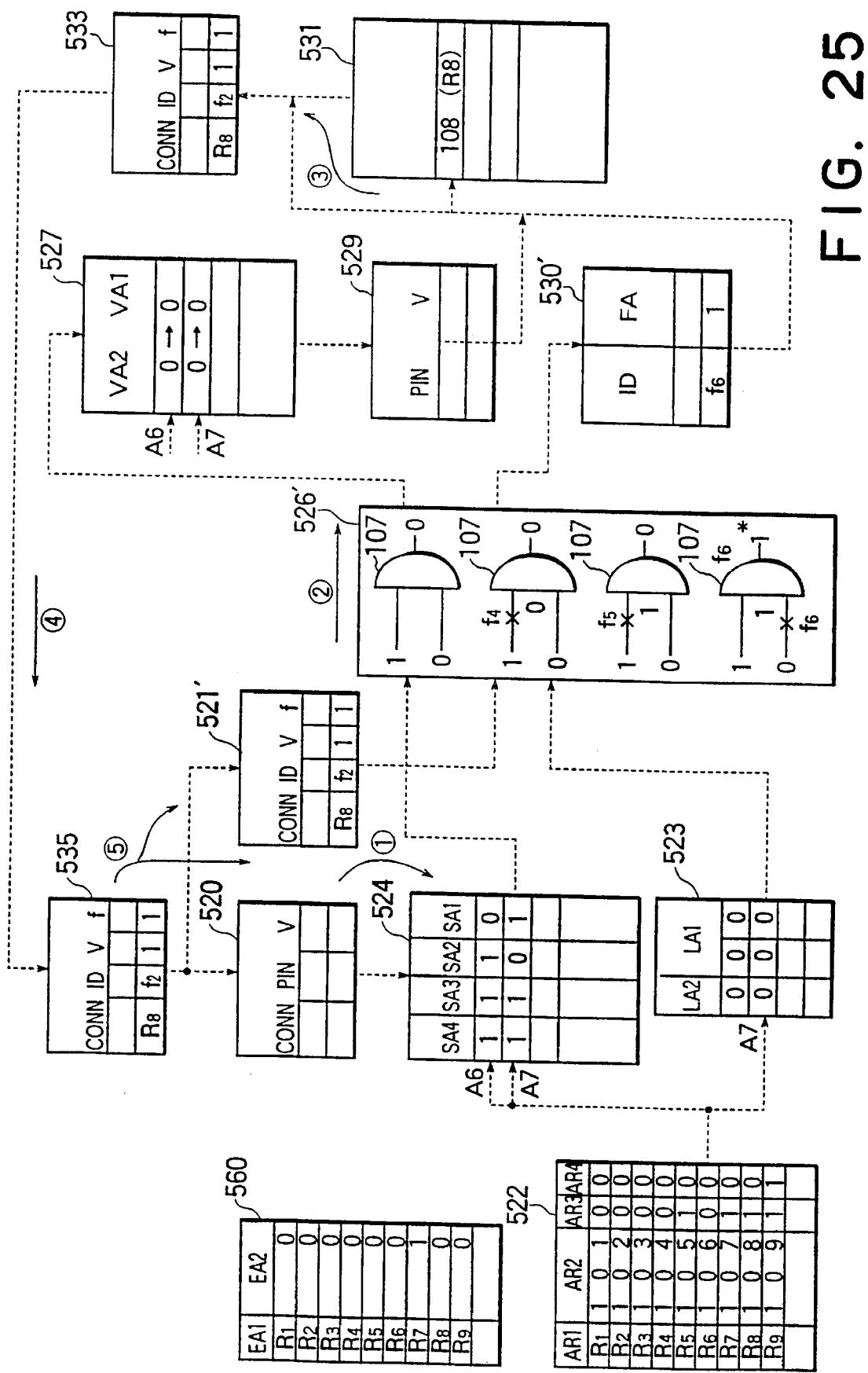
FIG. 25 is a schematic block diagram of the simulation execute circuit illustrated in FIG. 19 for use in describing simulation operation of another logic element shown in FIG. 1.

Turning to FIG. 25, the operation is succeeded by the simulation of the AND gate 107. The controller 537 searches the event flag memory 560 to detect whether or not the event flag having the logic one value is further memorized in the event flag memory 560. As a result of the search, the controller 537 detects the fact that the seventh event flag has the logic one value. The seventh event flag is related to the seventh element data R7, namely, the AND gate 107. In accordance with the fact, the controller 537 searches the control data memory 522 to detect the seventh start-address in the control data memory 522. Subsequently, the controller 537 searches the seventh address depicted at A7 in the input state memory 524 in accordance with the seventh start address detected from the control data memory 522. In the seventh address of the input state memory 524, the logic zero value has already been memorized in the first and the second input state areas SA1 and SA2 and the logic one value has already been memorized in the third and the fourth input state areas SA3 and SA4 as the initial state of the input state data related to the AND gate 107. Next, the controller 537 changes the logic zero value of the first input state area SA1 to the logic one value in accordance with the secondary normal event data which is related to the AND gate 107 and which include the pin number data representative of the number 1 of the first input pin of the AND gate 107. In the seventh address of the logical type memory 523, the logical type data "00" indicative of the AND gate have already been memorized in the first type area LA1 and the output value datum represented by the logic zero value has already been memorized in the second type area LA2.

It is to be noted here that the fourth through the sixth faults f4 to f6 are given to the AND gate 107 as shown in FIG. 1. For this purpose, the fault set circuit 525' generates fourth through sixth new fault set data at the same time by the use of the first through the third fault set circuit blocks 525-1 to 525-3 illustrated in FIG. 21.

The simulation execute circuit 526' is supplied with the type data, the input state data, and the fourth through the sixth new fault set data, from the logical type memory 523, the input state memory 524, and the fault set circuit 525', respectively. As illustrated at a first stage, namely, an uppermost stage, in a box depicted at 526', the simulation execute circuit 525' carries out the normal simulation of the AND gate 107 by the use of the normal simulation execute circuit 545 illustrated in FIG. 22. Simultaneously, as illustrated at second through fourth stages in the box depicted at 526', the simulation execute circuit 525' carries out the fourth through the sixth fault simulations of the AND gate 107 at the same time by the use of the first through the third fault simulation execute circuits 546-1 to 546-3, respectively, illustrated in FIG. 22. The fourth through the sixth fault simulations are for the fourth through the sixth faults f4 to f6, respectively.

As mentioned in conjunction with FIG. 9, the normal simulation execute circuit 545 produces the normal result signal having the logic zero value. The logic zero value given by the normal result signal is the correct value of the output of the AND gate 107 and is memorized in the new value area VA1 of the seventh address in the normal simulation result memory 527. The first fault simulation execute circuit 546-1 produces the fourth fault decision signal having the logic zero value. This means that the fourth fault f4 never propagates to the third level L3 because the fourth fault decision signal has the logic zero value equal to those of the normal result signal. The second fault simulation execute circuit 546-2 produces the fifth fault decision signal having the logic zero value. This means that the fifth fault f5 never propagates to the third level L3. The third fault simulation execute circuit 546-3 produces the sixth fault decision signal having the logic one value. This means that the sixth fault f6 propagates to the third level L3.

Thus, it is recognized that the sixth fault f6 propagates to the third level L3. The fault value datum given by the logic one value and the fault identification number data related to the sixth fault f6 are memorized in the fault value area FA and the fault identification number area ID, respectively, in the second fault data memory block 530-2 (FIG. 23) of the fault data memory 530'. The fault value datum and the fault identification number data related to the sixth fault f6 will collectively be called the secondary fault data. When the simulation related to the AND gate 107 is completed, the secondary normal event data are deleted from the normal event memory 520 under control of the controller 537. Furthermore, the controller 537 changes the seventh event flag in the event flag memory 560 from the logic one value to the logic zero value.

In FIG. 25, the connection data memory 531 memorizes the connection data representative of the connection destination from one of the logic elements to another one of the logic elements as mentioned in conjunction with FIG. 9. The following operation is carried out during the simulation related to the AND gate 107. Namely, the primary fault data related to the second fault f2 (FIG. 24) are read by the controller 537 out of the first fault data memory block 530-1. With reference to the primary fault data read from the first fault data memory block 530-1, the controller 537 searches the connection data memory 531 and detects the connection data representative of the connection destination of the AND gate 106. It is to be noted here that the AND gate 106 is connected to the OR gate 108. Accordingly, the connection destination of the AND gate 106 is the OR gate 108 and is symbolically depicted as 108 (R8) in a box depicted at 531.

As mentioned in conjunction with FIG. 9, the propagation data generating circuit 532 generates the propagation data. The propagation data comprise the connection data, the fault identification number data, the fault value datum, and the event value and are memorized in the propagation data memory 533 as the memorized propagation data. In the example illustrated in FIG. 25, the connection data memorized in the connection data area CONN represent the connection destination 108, namely, the element data R8 of the eighth start address in the control data memory 522. The fault identification number data memorized in the identification number area ID represent the second fault f2. The fault value datum memorized in the fault value area V is represented by the logic one value. The event value datum memorized in the event value area f is represented by the logic one value. The memorized propagation data will be called the primary propagation data.

Figure 26:
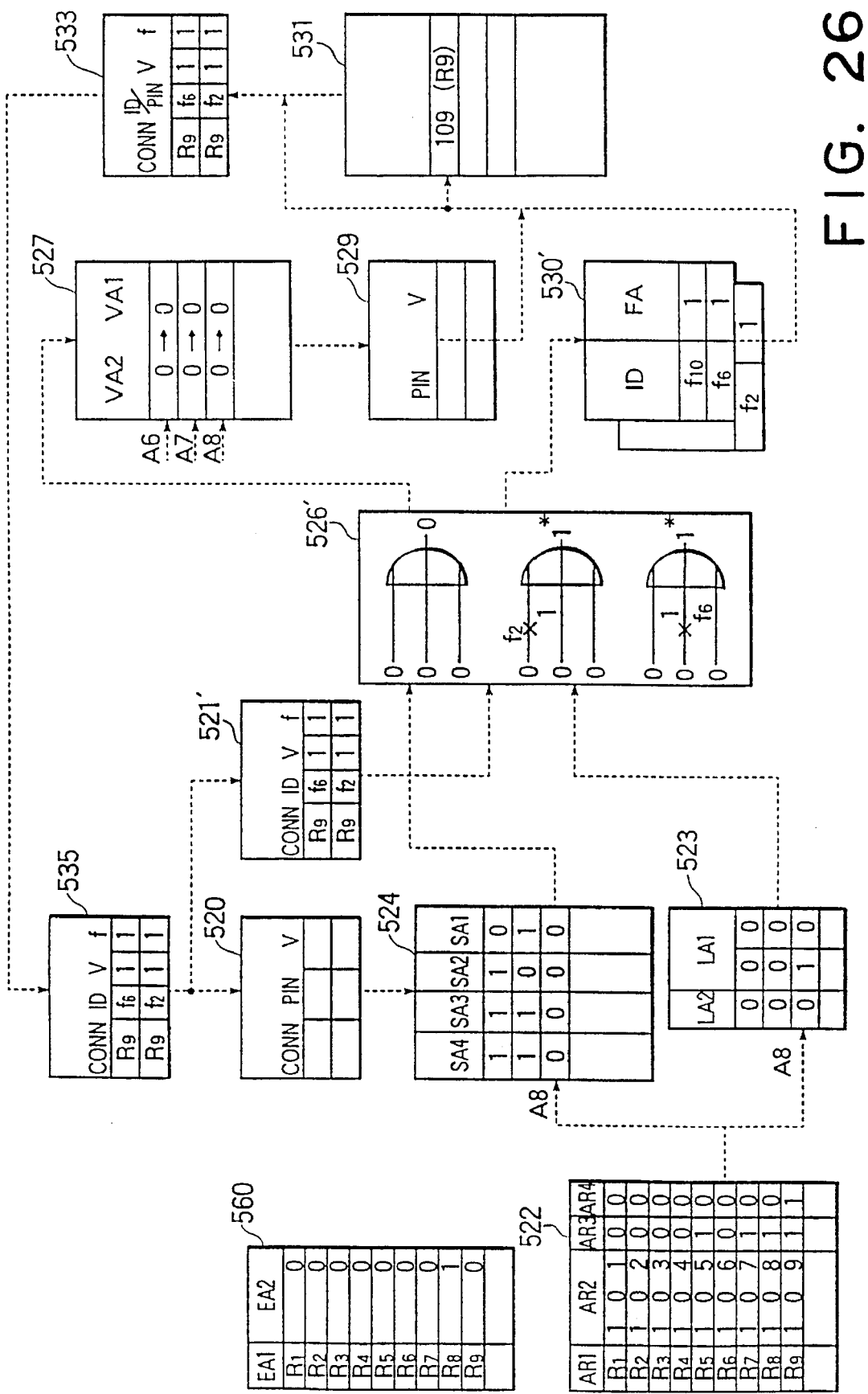
FIG. 26 is a schematic block diagram of the simulation execute circuit shown in FIG. 19 for use in describing simulation operation of still another logic element shown in FIG. 1.

Temporarily turning back to FIG. 19, the primary propagation data are supplied, as the primary transferred data, to the transfer data memory 535 through the transfer circuit 534. The transfer data memory 535 memorizes the primary transferred data, as the primary memorized event data. The primary memorized event data has the same content with the primary propagation data. The primary memorized event data are supplied to the selection circuit 536 under control of the controller 537. The selection circuit 536 selects the primary memorized event data as the primary selected data and supplies the primary selected data to the fault event memory 521. This is because the primary memorized event data include the event value datum of the logic one value that represents the fault event. The fault event memory 521 memorizes the primary selected data as the primary fault event data. In accordance with the primary fault event data, the controller 537 changes the eighth event flag in the event flag memory 560 from the logic zero value to the logic one value as shown later (FIG. 26). Thus, the simulation related to the second level L2 is completed. It should be again noted here that the operation described above can be achieved by the pipeline process, if the data are current through first through fifth lines which have arrowheads and which are designated by ①, ②, ③, ④, and ⑤, respectively. In addition, the secondary fault data are transferred to the fault event memory 521' in the manner mentioned above and memorized in the fault event memory 521' as the secondary fault event data.

Turning to FIG. 26, the description will proceed to the simulation of the third level L3. The controller 537 searches the event flag memory 560 and detects the fact that the eighth event flag having the logic one value is memorized in the event flag memory 560. The eighth event flag is related to the eighth element data R8, namely, the OR gate 108. Prior to the simulation in relation to the OR gate 108, the simulation execute circuit 526' executes the simulations related to the second and the sixth faults f2 and f6 as mentioned in conjunction with FIG. 10.

Temporarily turning back to FIG. 21, the fault set circuit 525' selects the primary fault event data and the secondary fault event data, as the primary selected fault event data and the secondary selected fault event data, by the use of the first and the second fault set circuit blocks 525-1 and 525-2. The primary and the secondary selected fault event data are supplied to the simulation execute circuit 526'. Supplied with the primary and the secondary selected fault event data, the simulation execute circuit 526' executes the normal simulation and the fault simulations, through the OR gate 108, related to the second and the sixth faults f2 and f6 in the manner mentioned before.

Turning back to FIG. 26, as a result of the normal and the fault simulations, the second and the sixth faults f2 and f6 propagate to the fourth level L4. Accordingly, the fault value given by the logic one value and the fault identification number of the second fault f2 are memorized in the fault data memory 530' as primary reconfirmed fault data. The fault value given by the logic one value and the fault identification number of the sixth fault f6 are also memorized in the fault data memory 530' as secondary reconfirmed fault data. The primary and the secondary reconfirmed fault data are transferred to the fault event memory 521' in the manner mentioned above and memorized in the fault event memory 521' as primary and secondary reconfirmed fault event data as shown in a box depicted at 521'. In addition, each of the primary and the secondary reconfirmed fault event data include the connection data related to ninth elements R9, namely, the output terminal 109.

When the simulations related to the second and the sixth faults f2 and f6 are completed, the controller 537 controls the fault set circuit 525' to make the fault set circuit 525' generate new fault set data related to the OR gate 108. The description will proceed to the simulation of the OR gate 108 in the third level L3. Then, the controller 537 searches the control data memory 522 to detect the eighth start address in the control data memory 522 in accordance with the eighth event flag having the logic one value. Subsequently, the controller 537 searches the eighth address depicted at A8 in the input state memory 524 in accordance with the eighth start address detected from the control data memory 522.

In the eighth address of the input state memory 524, the logic zero value has already been memorized in the first through the fourth input state areas SA1 to SA4 as the initial state of the input state data related to the OR gate 108.

In the eighth address of the logical type memory 523, the logical type data "10" representative of the OR gate have already been memorized in the first type area LA1 and the output type datum "0" has already been memorized in the second type area LA2. In the description mentioned above, the eighth address 108 in the second memory area AR2 of the control data memory 522 is equivalent to the eighth address depicted at A8.

It is to be noted here that the seventh through the tenth faults f7 to f10 are given to the OR gate 108 as shown in FIG. 1. For this purpose, the fault set circuit 525' generates seventh through tenth new fault set data at the same time by the use of the first through the fourth fault set circuit blocks 525-1 to 525-4 illustrated in FIG. 21.

The simulation execute circuit 526' is supplied with the type data, the input state data, and the seventh through the tenth new fault set data, from the logical type memory 523, the input state memory 524, and the fault set circuit 525', respectively, and carries out the normal simulation and the fault simulation. The simulation execute circuit 526' carries out the normal simulation of the OR gate 108 by the use of the normal simulation execute circuit 545 illustrated in FIG. 22. Simultaneously, the simulation execute circuit 526' carries out the seventh through the tenth fault simulations of the OR gate 108 at the same time by the use of the first through the fourth fault simulation execute circuits 546-1 to 546-4, respectively, illustrated in FIG. 22. The seventh through the tenth fault simulations are for the seventh through the tenth faults f7 to f10, respectively.

As mentioned in conjunction with FIG. 10, the normal simulation execute circuit 545 produces the normal result signal having the logic zero value. The logic zero value given by the normal result signal is the correct value of the output of the OR gate 108 and is memorized in the new value area VA1 of the eighth address in the normal simulation result memory 527. The first fault simulation execute circuit 546-1 produces the seventh fault decision signal having the logic zero value. This means that the seventh fault f7 never propagates to the fourth level L4 because the seventh fault decision signal has the logic zero value equal to those of the normal result signal. The second fault simulation execute circuit 546-2 produces the eighth fault decision signal having the logic zero value. this means that the eighth fault f8 never propagates to the fourth level L4. The third fault simulation execute circuit 546-3 produces the ninth fault decision signal having the logic zero value. Accordingly, the ninth fault f9 never propagates to the fourth level L4. The fourth fault simulation execute circuit 546-4 produces the tenth fault decision signal having the logic one value. This shows that the tenth fault f10 propagates to the fourth level L4.

Thus, it is recognized that the tenth fault f10 propagates to the fourth level L4. The fault value datum given by the logic one value and the fault identification number of the tenth fault f10 are memorized in the fault data memory 530' as the tertiary fault data. The tertiary fault data related to the tenth fault f10 are read by the controller 537 out of the fault data memory 530'. With reference to the tertiary fault data of the tenth fault f10 read from the fault data memory 530', the controller 537 searches the connection data memory 531 and detects the connection data representative of the connection destination of the OR gate 108. It is to be noted here that the OR gate 108 is connected to the output terminal 109. Accordingly, the connection destination of the OR gate 108 is the output terminal 109 and is symbolically depicted at 109 (R9) in the block of the connection data memory 531.

Turning back to FIG. 19, the propagation data generating circuit 532 is supplied with the tertiary fault data and the connection data related to the OR gage 108 from the fault data memory 530' and the connection data memory 531, respectively, and generates tertiary propagation data related to the output terminal 109 in the manner mentioned before. The tertiary propagation data are supplied to the propagation data memory 533. The propagation data memory 533 memorizes the tertiary propagation data related to the second fault f2, the sixth fault f6, and the tenth fault f10 as tertiary memorized propagation data.

Figure 27:
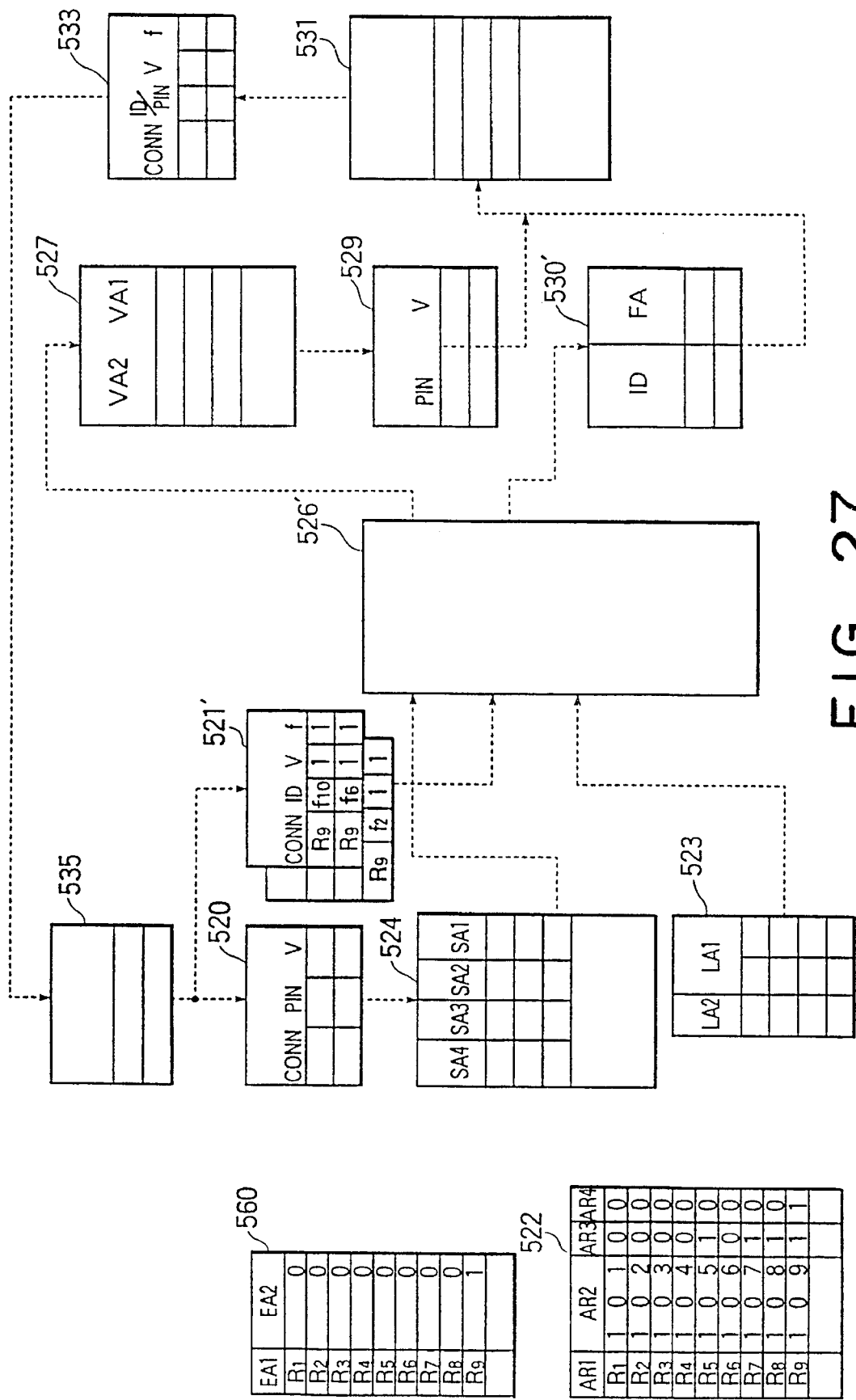
FIG. 27 is a schematic block diagram of the simulation execute circuit shown in FIG. 19 for use in describing the data flow of detected faults in simulation operation.

The tertiary memorized propagation data are supplied, as tertiary transferred data, to the transfer data memory 535 through the transfer circuit 534. The transfer data memory 535 memorizes the tertiary transferred data, as tertiary memorized data. The tertiary memorized data have the same content with the tertiary propagation data. The tertiary memorized data are supplied to the selection circuit 536 under control of the controller 537. The selection circuit 536 selects the tertiary memorized data as tertiary selected data and supplies the tertiary selected data to the fault event memory 521'. The fault event memory 521' memorizes the tertiary selected data as tertiary fault event data as shown in FIG. 27. In accordance with the tertiary fault event data, the controller 537 changes the eighth event flag from the logic one value to the logic zero value and changes the ninth event flag from the logic zero value to the logic one value as shown in FIG. 27. Thus, the simulation of the third level L3 is completed.

The controller 537 searches the event flag memory 560 to detect whether or not event flag having the logic one value is memorized in the event flag memory 560. As a result of the search, the controller 537 detects the fact that the ninth event flag has the logic one value. The ninth event flag is related to the ninth element data, namely, the output terminal 109. Then, the controller 537 searches the control data memory 522 to detect the ninth start address in the control data memory 522. In this event, the controller 537 detects the fact that the second completion flag in the fourth memory area AR4 has the logic one level. This means that the simulation reaches the fourth level L4, namely, the last level of the logic circuit model. Accordingly, the simulation related to the first input pattern signal P1 is completed. In addition, the second, the sixth, and the tenth faults f2, f6, and f10 are memorized, as the detected faults, in the result data memory 53 (FIG. 3) together with the correct value as illustrated in FIG. 2b.

In addition, the undetected faults f1, f3, f4, f5, f7 to f9 can be detected in the manner described in conjunction with FIG. 12.

Figure 28:
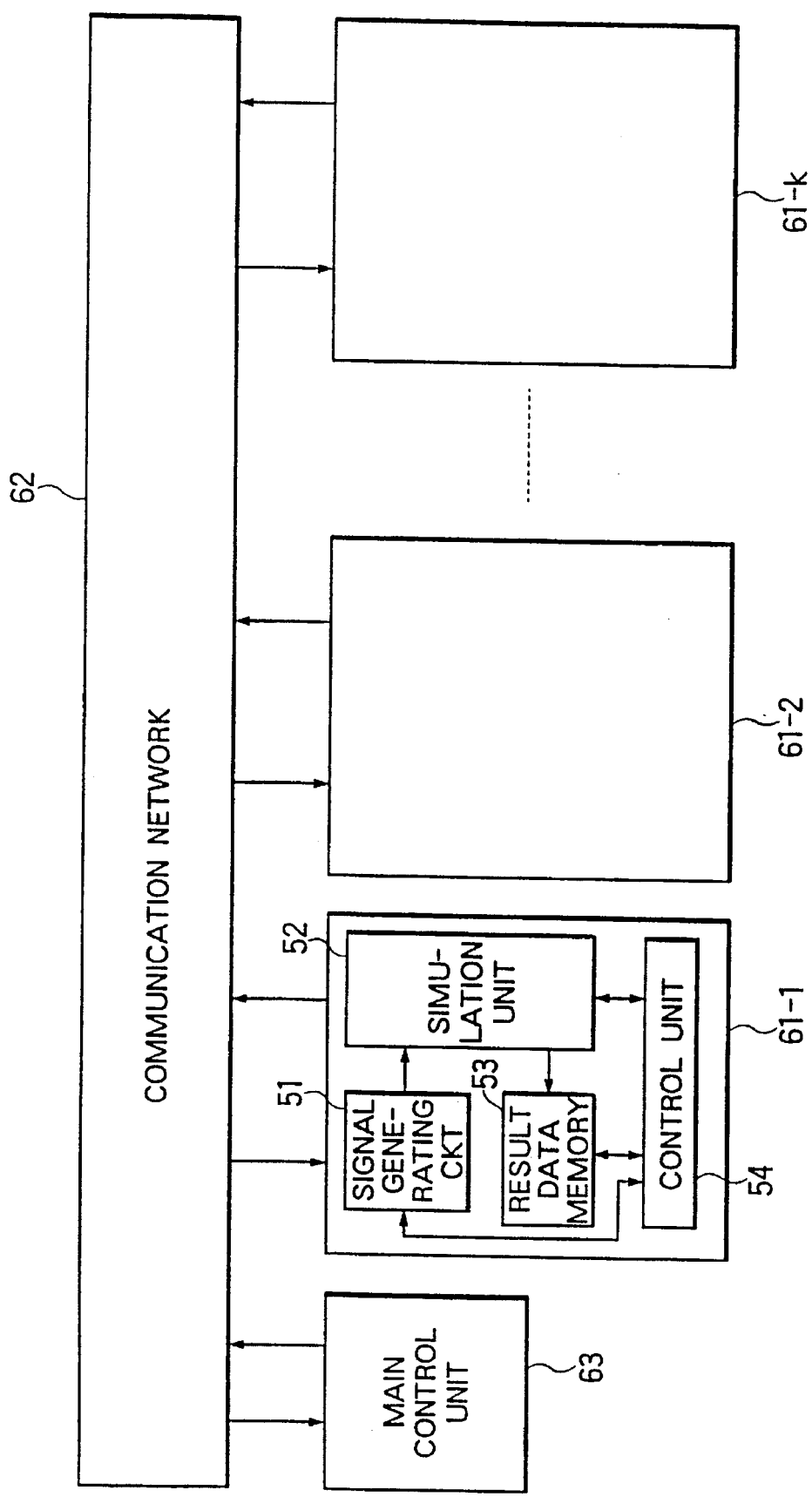
FIG. 28 is a block diagram of a simulation system according to a third embodiment of this invention.

Referring to FIG. 28, a simulation system according to a third embodiment of this invention comprises first through k-th fault simulators 61-1 to 61-k each of which is similar to that illustrated in FIG. 3 and which is connected to a communication network 62 in parallel. The communication network 62 is controlled by a main control unit 63. Like in FIG. 3, each of the first through the k-th fault simulators 61-1 to 61-k comprises the signal generating circuit 51, the simulation unit 52, the result data memory 53, and the control unit 54.

It is to be noted here that the first through the k-th fault simulators 61-1 to 61-k share simulations for a logic circuit model with one another. To this end, the logic circuit model in question is divided into a plurality of partial models which are assigned to the first through the k-th fault simulators 61-1 to 61-k. Each fault simulator executes the simulations assigned thereto at a high speed. Thus, it is possible to alleviate a burden necessary for the simulations by distributing the simulations to a plurality of the fault simulators. Such a simulation system can be applied to the fault simulator illustrated in FIG. 17 and the fault simulator comprising the simulation unit 52' illustrated in FIG. 19.

Figure 29:
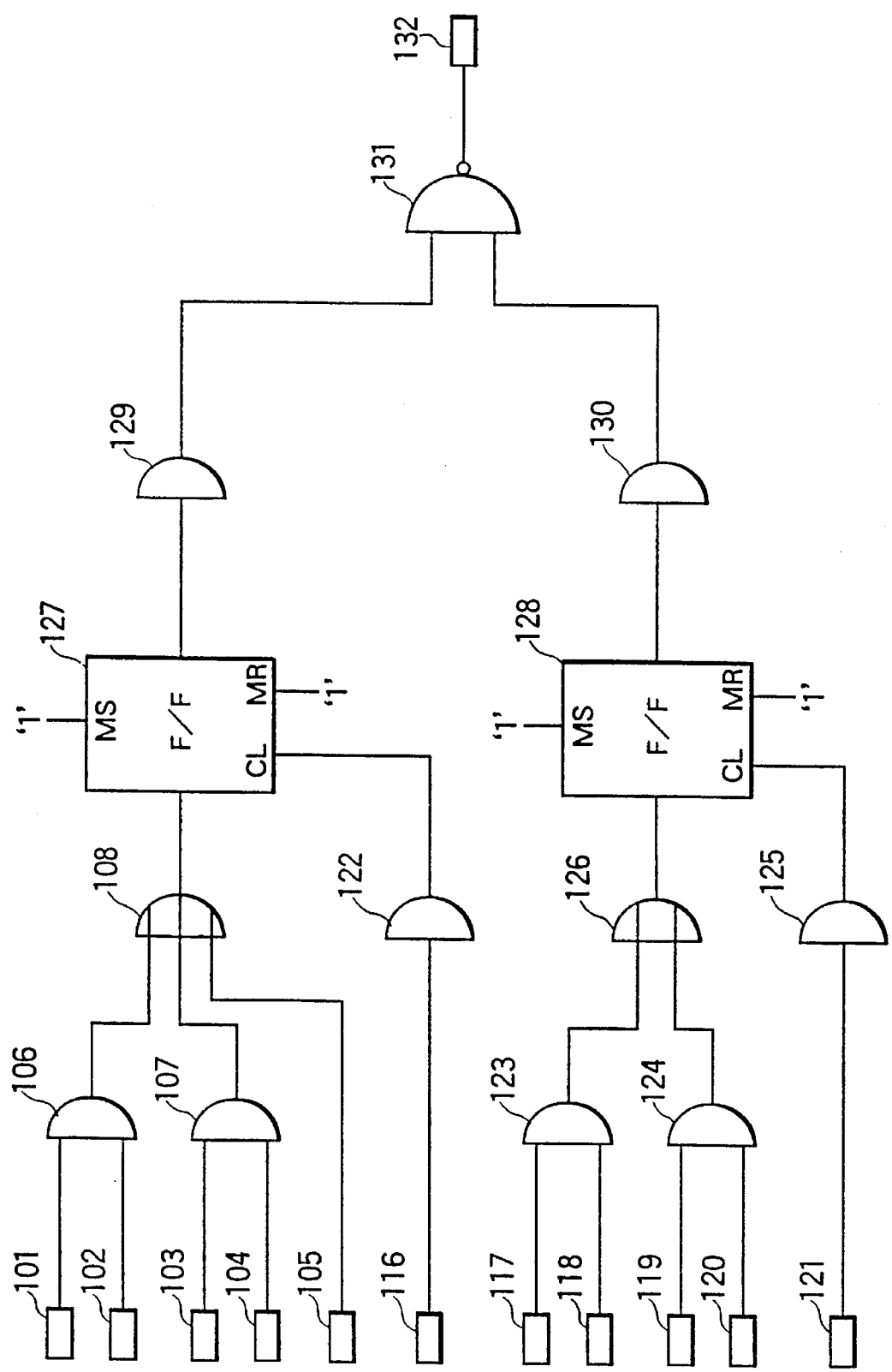
FIG. 29 shows still another logic circuit model which is applied to a simulation method according to a fourth embodiment of this invention.

Referring to FIG. 29, the description will be made as regards a logic circuit model which is applied to a simulation method according to a fourth embodiment of this invention. The simulation method is executed by the fault simulator illustrated in FIG. 3. The illustrated logic circuit model comprises the logic circuit model illustrated in FIG. 1. Therefore, the illustrated logic circuit model will be called a main logic circuit model while the logic circuit model illustrated in FIG. 1 will be called a partial logic circuit model. The main logic circuit model further comprises sixth through eleventh input terminals 116, 117, 118, 119, 120, and 121, AND gates 122, 123, 124, and 125, an OR gate 126, flip-flop circuits 127 and 128. The main logic circuit model still further comprises AND gates 129 and 130, an NAND gate 131, and an output terminal 132.

Figure 30:
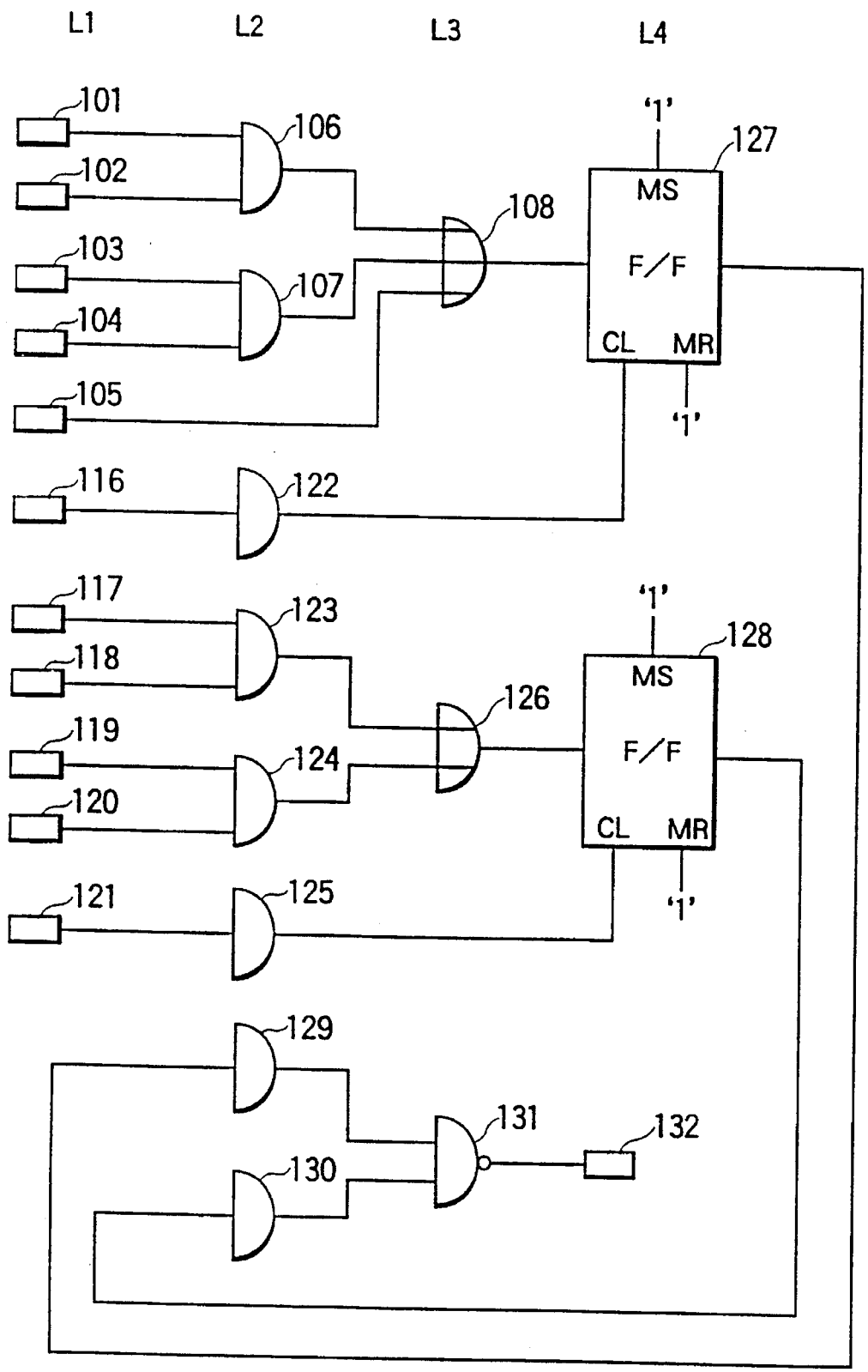
FIG. 30 shows the logic circuit model for use in describing assignment of level.

Referring to FIG. 30, such a main logic circuit model is classified into an input terminal group, a combinational group, a sequential group, and an output terminal group and is assorted into first through fourth levels L1, L2, L3, and L4. The input terminal group comprises all of the input terminals 101 to 105 and 116 to 121 which are assigned with the first level L1. The combinational group comprises all of the AND gates 106 and 107, 122 to 125, 129, and 130 all of which are assigned with the second level L2. The combinational group further comprises the OR gates 108 and 126, and the NAND gate 131 all of which are assigned with the third level L3. The sequential group comprises the flip-flop circuits 127 and 128 which are assigned with the fourth level L4. The output terminal group comprises the output terminal 132 which is assigned with the fourth level L4. It should be noted here that the assignment of level is carried out from the input terminal group to the sequential group and is further carried out from the sequential group to the output terminal group. As a result, the AND gates 129 and 130 belong to the second level L2 while the NAND gate 131 belongs to the third level L3. Furthermore, the output terminal belongs to the fourth level L4. When the operation for assignment of level is completed, the operation is succeeded by definition operation of the faults.

Figures 31, 32:
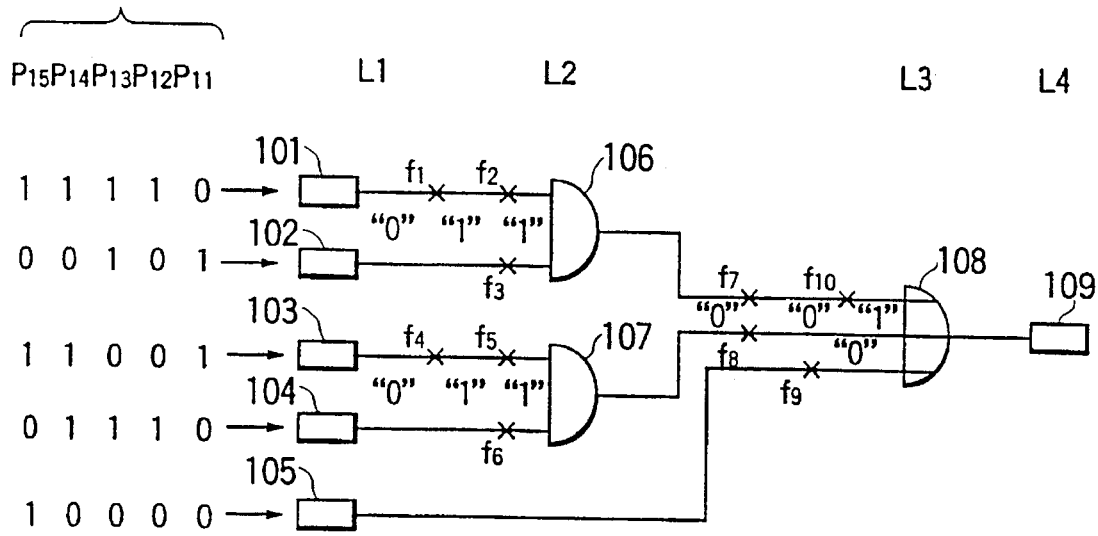
FIG. 31 shows a partial logic circuit model, together with the input pattern signals, which is a part of the logic circuit model illustrated in FIG. 29.
FIG. 32 shows an example of the detected faults and correct values which are detected by the simulation operation by the use of the input pattern signals shown in FIG. 31.

Referring to FIG. 31, the description will be made as regards the partial logic circuit model. As mentioned in conjunction with FIG. 1, the first through the tenth faults f1 to f10 are defined to the partial logic circuit model as the defined faults. Next, the operation proceeds to generation operation of the input pattern signals. Let the simulation be carried out by the use of first through fifth input pattern signals which are depicted at P11, P12, P13, P14, and P15. Although each of the input pattern signals consists of eleven bits as will become clear later, five bits, namely, first through fifth bits, of each of the input pattern signals are illustrated in FIG. 31. In addition, the first through the fifth input pattern signals P11 to P15 may preliminarily be memorized in a memory.

The simulation is carried out at first by the use of the first input pattern signal P11. In the manner mentioned in conjunction with FIGS. 24 to 27, the second and the sixth faults f2 and f6 are detected in the second level L2 as the detected faults. In the third level L3, the tenth fault f10 is detected. The correct value delivered from the output terminal 109 is the logic zero value. The correct value and the detected faults are illustrated in FIG. 32. The detected faults f2, f6, and f10 are deleted from the defined faults. It is to be noted here that the simulation is carried out in each of the first through the fourth levels L1 to L4. In other words, the simulations for the AND gates 106 and 107 are carried out at the same time because the AND gates 106 and 107 belong to the second level L2. Next, the simulation is carried out by the use of the second input pattern signal P12. As a result, the third and the fifth faults f3 and f5 are detected, as shown in FIG. 32, in the second level L2. The correct value is represented by the logic zero value as illustrated in FIG. 32. The detected faults f3 and f5 are deleted from the defined faults. As a result of the simulation by the use of the third input pattern signal P13, the first fault f1 is detected in the second level L2 as shown in FIG. 32. Furthermore, the seventh fault f7 is detected in the third level L3. In this event, the correct value is the logic one value as illustrated in FIG. 32. The detected faults f1 and f7 are deleted from the defined faults. As a result of the simulation by the use of the fourth input pattern signal P14, the fourth fault f4 is detected in the second level L2 and the eighth fault f8 is detected in the third level L3 as shown in FIG. 32. The correct value is the logic one value. The detected faults f4 and f8 are deleted from the defined faults. At the last, the simulation is carried out by the use of the fifth input pattern signal P15. As a result, the ninth fault f9 is detected in the third level L3. The correct value is the logic one value. The detected fault f9 is deleted from the defined faults. When the simulation by the use of all of the input pattern signals is completed, the simulation related to the partial logic circuit model is completed.

Figures 33, 34:
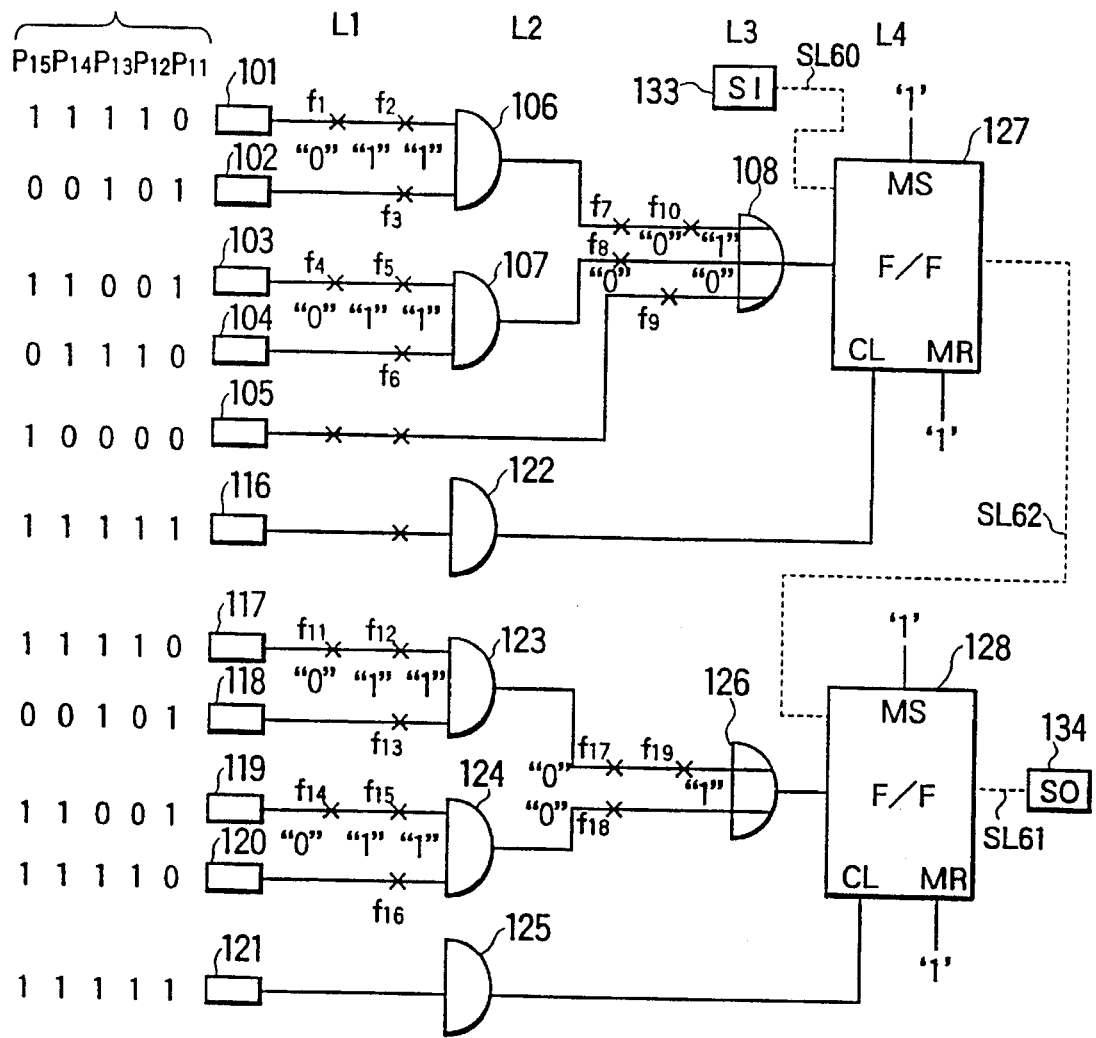
FIG. 33 shows the logic circuit model, together with the input pattern signals, which is for use in describing faults.
FIG. 34 shows an example of the detected faults and correct values which are detected by the simulation operation by the use of the input pattern signals shown in FIG. 33.

Referring to FIG. 33, the description will proceed to the simulation of the main logic circuit model. It is to be noted here that a scan-in circuit and a scan-out circuit are added to the main logic circuit model illustrated in FIG. 29. The AND gates 129 and 130, the NAND gate 131, and the output terminal 132 are deleted from the main logic circuit model for the reason described hereinunder. If the flip-flop circuits 127 and 128 have scan function, it is possible to detect the fault by the use of the flip-flop circuits 127 and 128. In other words, each of the flip-flop circuits 127 and 128 can be regarded as the output terminal. Therefore, the simulation related to the AND gates 129 and 130 and the NAND gate 131 can be omitted. In other words, the simulation may be carried out in relation to the AND gates 106 and 107, the AND gates 122 to 125, and the OR gates 108 and 126.

In FIG. 33, the scan-in circuit comprises a scan-in terminal 133 connected to the flip-flop circuit 127 through a dotted line SL60 while the scan-out circuit comprises a scan-out terminal 134 connected to the flip-flop circuit 128 through another dotted line SL61. The flip-flop circuit 127 is connected to the flip-flop circuit 128 through other dotted line SL62. Each of the flip-flop circuits 127 and 128 has a master set terminal depicted at MS, a master reset terminal depicted at MR, and a clock terminal depicted at CL. For brevity of description, it will be assumed that each of the master set and the master reset terminals is set to an activated state (set to a clamp state by the logic one value). Each of the flip-flop circuits 127 and 128 receives input data when the clock terminal CL is supplied with the logic one value.

In addition to the definition operation of the first through the tenth faults f1 to f10, eleventh through nineteenth faults f11, f12, f13, f14, f15, f16, f17, f18, and f19 are defined as illustrated in FIG. 33. The first through the fifth input pattern signals P11 through P15 consist of eleven bits and are supplied one by one to the input terminals 101 to 105 and 116 to 121 as shown in FIG. 33. For example, the first input pattern signal P11 is represented by an eleven bit pattern of "01100101101".

The simulation is carried out at first by supply of the first input pattern signal P11 to the input terminals 101 to 105 and 116 to 121. In the manner mentioned in conjunction with FIGS. 24 to 27, the second and the sixth faults f2 and f6 are detected from the flip-flop circuit 127 in the second level L2 as the detected faults. The twelfth and the sixteenth faults f12 and f16 are detected from the flip-flop circuit 128 in the second level L2. In the third level L3, the tenth fault f10 is detected from the flip-flop circuit 127 while the nineteenth fault f19 is detected from the flip-flop circuit 128. The correct value delivered from the flip-flop circuit 127 is the logic zero value while the correct value delivered from the flip-flop circuit 128 is also the logic zero value. The correct values and the detected faults are illustrated in FIG. 34. The detected faults f2, f6, f10, f12, f16, and f19 are deleted from the defined faults. As mentioned before, the simulation is carried out in each of the first through the fourth levels L1 to L4. For example, the simulations for the AND gates 106, 107, 123, and 124 are carried out at the same time because the AND gates 106, 107, 123, and 124 belong to the second level L2.

Next, the simulation is carried out by the use of the second input pattern signal P12. As a result, the third and the fifth faults f3 and f5 are detected from the flip-flop circuit 127, as shown in FIG. 34, in the second level L2. The thirteenth and the fifteenth faults f13 and f15 are detected from the flip-flop circuit 128. Each of the correct values detected from the flip-flop circuits 127 and 128 is represented by the logic zero value as illustrated in FIG. 34. The detected faults f3, f5, f13, and f15 are deleted from the defined faults. As a result of the simulation by the use the third input pattern signal P13, the first fault f1 is detected from the flip-flop 127 in the second level L2 as shown in FIG. 32. Furthermore, the seventh fault f7 is detected from the flip-flop 127 in the third level L3. On the other hand, the eleventh fault f11 is detected from the flip-flop circuit 128 in the second level L2. The seventeenth fault f17 is detected from the flip-flop 128 in the third level L3. In this event, both the correct values delivered from the flip-flop circuits 127 and 128 are the logic one value as illustrated in FIG. 34. The detected faults f1, f7, f11, and f17 are deleted from the defined faults.

As a result of simulation by the use of the fourth input pattern signal P14, the fourth fault f4 is detected from the flip-flop circuit 127 in the second level L2 and the eighth fault f8 is detected from the flop-flop circuit 127 in the third level L3 as shown in FIG. 34. On the other hand, the fourteenth fault f14 is detected from the flip-flop circuit 128 in the second level L2 while the eighteenth fault f18 is detected from the flip-flop circuit 128 in the third level L3 as illustrated in FIG. 34. The correct values delivered from the flip-flop circuits 127 and 128 are represented by the logic one value as illustrated in FIG. 34. The detected faults f4, f8, f14, and f18 are deleted from the defined faults.

At the last, the simulation is carried out by the use of the fifth input pattern signal P15. In this event, the ninth fault f9 is detected from the flip-flop 127 in the third level L3. The correct value is the logic one value. The detected fault f9 is deleted from the defined faults. When the simulation by the use of all of the input pattern signals is completed, the simulation of the main logic circuit model is completed. If the flip-flop circuits 127 and 128 have no scan function, the simulation can be carried out in the manner described above.

Figure 35:
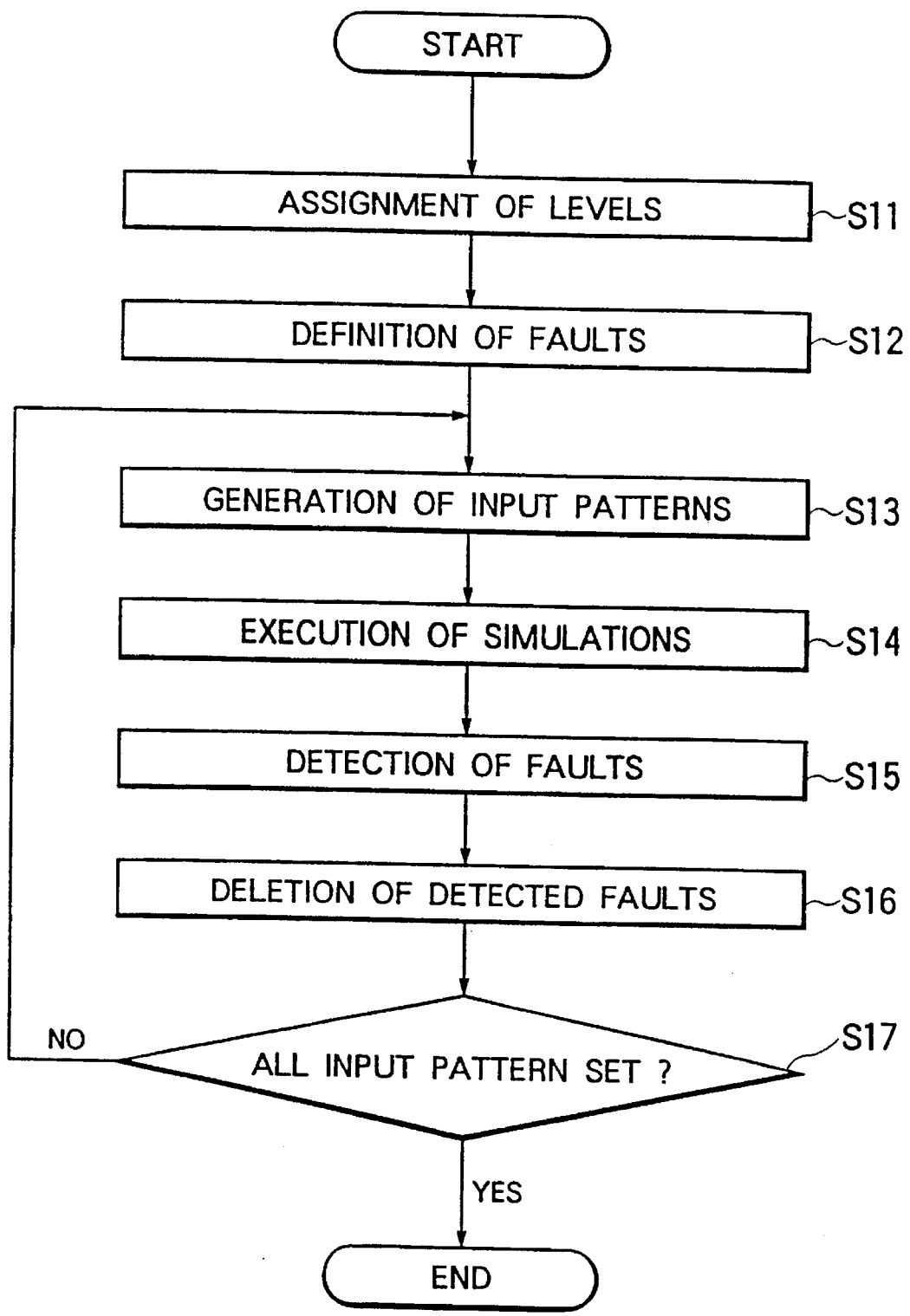
FIG. 35 shows a flow chart for use in describing simulation steps of the simulation method according to this invention.

Referring to FIG. 35, the above-mentioned simulation method is characterized by first through seventh steps S11, S12, S13, S14, S15, S16, and S17.

At the first step S11, the first through the fourth levels L1 to L4 are assigned, as the defined faults, to the main logic circuit model as illustrated in FIG. 30. At the second step S12, the first through the nineteenth faults f1 to f19 are defined to each of the logic elements in the main circuit model. As the third step S13, the first through the fifth input pattern signals P11 to P15 are generated by the signal generating circuit 51 (FIG. 3). Then, the first input pattern signal P11 is supplied to the input terminals 101 to 105 and 116 to 121 of the main logic circuit model. At the fourth step S14, the simulation of the main logic circuit model is executed by the simulation unit 52 by the use of the first input pattern signal P11.

At the fifth step S15, the simulation unit 52 detects propagation faults as detected faults when the simulation proceeds to the fourth level L4 assigned to the flop-flop circuits 127 and 128. At the sixth step S16, the detected faults are deleted by the control unit 54 from the defined faults. At the seventh step S17, the control unit 54 detects whether or not all of the first through the fifth input pattern signals P11 to P15 are supplied to the input terminals. If all of the first through the fifth input pattern signals P11 to P15 are supplied to the input terminals, the simulation is completed. When the input pattern signal remains, the operation turns back to the third step S13. In the third step S13, the second input pattern signal P12 is supplied to the input terminals. Then, the third through the seventh steps S13 to S17 are repeated until the fifth input pattern signal P15 is supplied to the input terminals. In addition, if the normal event or the fault event does not take place in the middle of the first through the fourth levels L1 to L4, the operation turns back to the third step S13. For example, if the normal event or the fault event does not take place in the third level L3, the operation does not proceed to the fourth level L4 and turns back to the third step S13.

Figure 36:
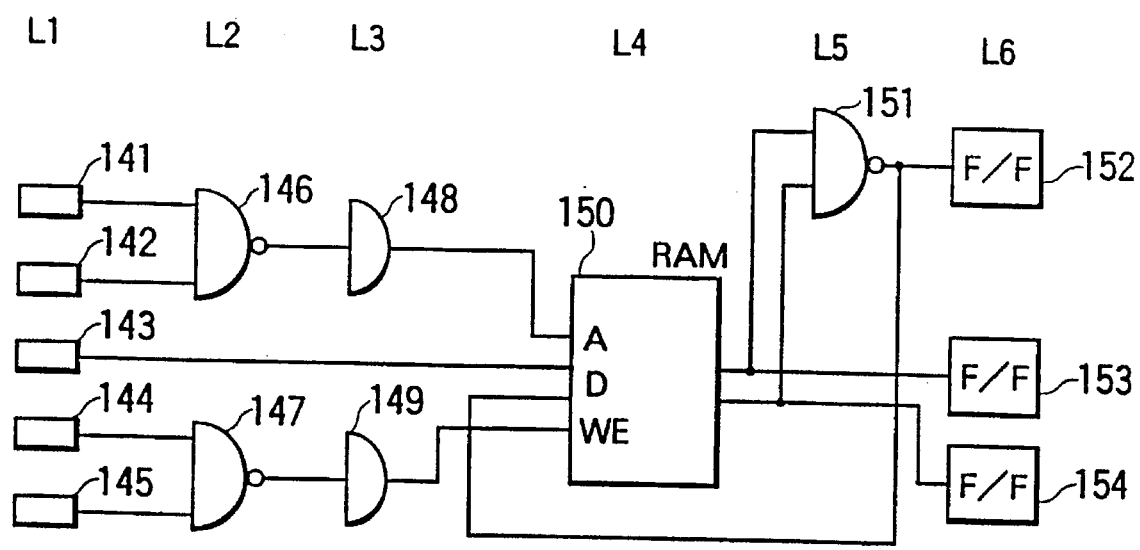
FIG. 36 shows a logic circuit model comprising a random access memory, which is applied to the simulation method according to a fifth embodiment of this invention.

Referring to FIG. 36, the description will be made as regards the assignment of level for a logic circuit model which comprises a memory, such as random access memory, having read-write function.

In FIG. 36, the illustrated logic circuit model comprises input terminals 141, 142, 143, 144, and 145, NAND gates 146 and 147, inverter gates 148 and 149, a random access memory 150, an NAND gate 151, flip-flop circuits 152, 153, and 154. The random access memory 150 has an address data input terminal A for receiving address data, a data input terminal D for receiving input data, and a write-enable terminal WE for receiving a write-enable signal. In the manner mentioned in conjunction with FIG. 1, the level L1 is assigned to the input terminals 141 to 145. The level L2 is assigned to the NAND gates 146 and 147 while the third level L3 is assigned to inverter gates 148 and 149. The random access memory 150 belongs to the fourth level L4 while the NAND gate 151 belongs to the fifth level L5. The flip-flop circuits 152 to 154 are assigned with the sixth level L6. It is to be noted here that an output signal delivered from the NAND gate 151 turns back to the data input terminal D. In other words, the logic circuit model has a feedback loop which turns back from the fifth level L5 to the fourth level L4. This means that the random access memory 150 is influenced by the output signal of the NAND gate 151 that belongs to the fifth level L5 which is higher than the fourth level L4. In order to remove influence of the output signal of the NAND gate 151, this invention adopts a method described hereinunder.

Figure 37:
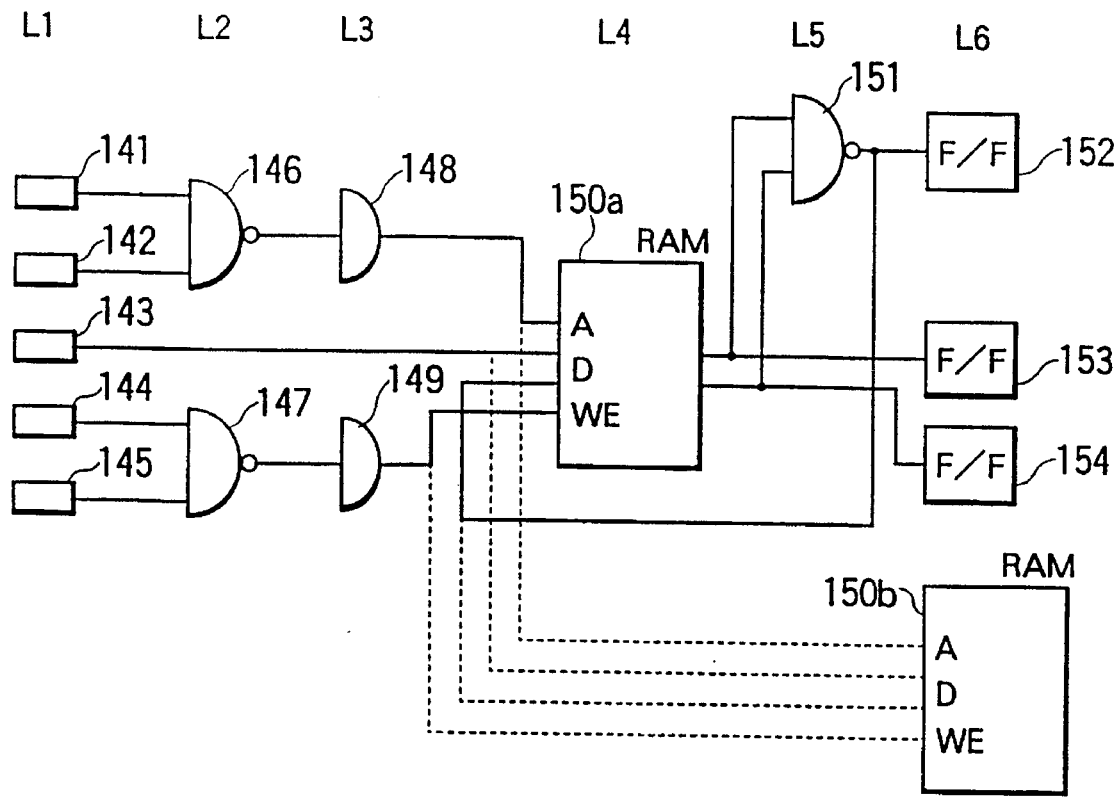
FIG. 37 shows the logic circuit model illustrated in FIG. 36 for use in describing assignment of level.

In the method according to this invention, the random access memory 150 is virtually divided into a read-out part (element) 150a and a write-in part (element) 150b as shown in FIG. 37. The read-out part 150a is assigned with the fourth level L4 while the write-in part 150b is assigned with the last level, namely, the sixth level L6. In such a logic circuit model, write-in operation can be carried out after the address data and the input data veered to a stable state. Under the circumstances, the simulation is carried out in each of the read-out part 150a and the write-in part 150b. Briefly, if the normal or the fault event occurs after the simulation related to the fifth level L5 has been carried out, the simulation turns back to the fourth level L4. In this case, if the simulation is limitlessly repeated between the fourth level L4 and the fifth level L5, the operation is regarded as oscillation and is stopped. According to this method, miss operation can be prevented even if the random access memory 150 receives the output signal of the NAND gate 151 which belongs to the fifth level L5.

While this invention has thus far been described in conjunction with a few embodiments thereof, it will readily be possible for those skilled in the art to put this invention into practice in various other manners.

What is claimed is:

1. A fault simulation method for simulating a logic circuit model containing a plurality of logic circuit elements, said logic circuit model including logic circuit-type data for each logic circuit in said logic circuit model, logic circuit-connection data for each logic circuit in said logic circuit model, and an initial state of said logic circuit model, said method comprising the steps of:

(a) storing said logic circuit-type data in a logic circuit-type memory;

(b) storing said logic circuit-connection data in a logic circuit-connection data memory;

(c) storing said initial state of said logic circuit model in an initial state memory;

(d) assigning a level to each logic circuit element of said logic circuit model;

(e) storing said level of each logic circuit element in a control data memory;

(f) identifying a plurality of fault types in said logic circuit model based on said logic circuit-type data, said logic-connection data, and said level of each logic circuit element, wherein each fault type causes a fault data simulation result to differ from a corresponding fault-free data simulation result;

(g) generating a sequence of random test input pattern signals for detecting said fault types, wherein each random test input pattern signal comprises a plurality of binary bits;

(h) adjusting bit lengths of said random test input pattern signals to have a bit-length equal in number to a number of inputs of said logic circuit model;

(i) determining, for each of said random test input pattern signals, fault-free data simulation results of said logic circuit model resulting from inputting each of said random test input pattern signals into the inputs of said logic circuit model;

(j) storing said fault-free data simulation results in a normal event memory;

(k) determining, for each of said fault types, fault data simulation results of said logic circuit model resulting from inputting said random test input pattern signals into the inputs of said logic circuit model;

(l) storing said fault data simulation results in a fault event memory;

(m) comparing said fault data simulation results to said fault-free data simulation results for each of said random test input pattern signals;

(n) identifying, for each of said fault types, which of said random test input pattern signals produce a fault data simulation result which is not equal to its corresponding fault-free data simulation result; and (o) repeating steps (g) through (n) until each of said random pattern test input pattern signals produce a fault data simulation result which is not equal to a corresponding fault-free data simulation result.

2. A fault simulation method as claimed in claim 1, wherein said fault types are modeled by fixing a signal line of said logic elements to a logic zero level to represent a stuck-at-zero fault and by fixing a signal line of said logic elements to a logic one to represent a stuck-at-one fault.

3. A fault simulation method as claimed in claim 1, wherein said logic circuit model comprises combinational logic circuit elements and sequential circuit elements.

4. A fault simulation method as claimed in claim 1, wherein said random test input pattern signals are generated in a hardware random pattern generating circuit.

5. A fault simulation method as claimed in claim 1, wherein said fault data simulation results comprise said logic circuit-connection data and a plurality of fault identification numbers.

6. A fault simulation method as claimed in claim 1, wherein said correct data simulation results comprise said logic circuit-connection data and a plurality of input pin numbers representative of a plurality of input pins of said logic circuit elements.

7. A fault simulation method as claimed in claim 1, wherein said normal event memory is a First In First Out (FIFO) memory.

8. A fault simulation method as claimed in claim 1, wherein said fault event memory is a First In First Out (FIFO) memory.

9. A fault simulation method as claimed in claim 1, wherein said logic-circuit type data represents a logical type of said logic elements and an output value of said logic elements.

10. A fault simulation method as claimed in claim 1, wherein an event flag memory stores a flag indicative of a said comparison of said fault data simulation results to said fault-free data simulation results for each of said logic elements.

11. A fault simulation method as claimed in claim 1, wherein said logic circuit model is divided into a plurality of partial logic circuit models and said fault simulation method is performed at a same time on each of said partial logic circuit models.

12. A fault simulation method for simulating a logic circuit model containing a plurality of logic circuit elements, said logic circuit model including logic circuit-type data for each logic circuit in said logic circuit model, logic circuit-connection data for each logic circuit in said logic circuit model, and an initial state of said logic circuit model, said method comprising the steps of:

(a) storing said logic circuit-type data in a logic circuit-type memory;

(b) storing said logic circuit-connection data in a logic circuit-connection data memory;

(c) storing said initial state of said logic circuit model in an initial state memory;

(d) assigning a level to each logic circuit element of said logic circuit model;

(e) storing said level of each logic circuit element in a control data memory;

(f) identifying a plurality of fault types in said logic circuit model based on said logic circuit-type data, said logic-connection data, and said level of each logic circuit element, wherein said fault types cause a fault data result to differ from a corresponding fault-free data result;

(g) calculating a predetermined fault-rate for said logic circuit model;

(h) generating a sequence of random test input pattern signals for detecting said fault types, wherein each random test input pattern signal comprises a plurality of binary bits;

(i) adjusting the lengths of said random test input pattern signals to have a bit-length equal in number to the number of inputs of said logic circuit model;

(j) determining, for each of said fault types, said fault-free data simulation result of said logic circuit model resulting from inputting at least one of said random test input pattern signals into the inputs of said logic circuit model;

(k) storing said fault-free data simulation results in a normal event memory;

(l) determining, for each of said fault types, a fault data simulation result of said logic circuit model resulting from inputting said at least one of said random test input pattern signals into the inputs of said logic circuit model;

(m) storing said fault data simulation results in a fault event memory;

(n) comparing said fault data simulation results to said fault-free data simulation results for each of said at least one of said random test input pattern signals;

(o) calculating an actual fault rate based on the comparison of said fault data simulation results to said fault-free data simulation results; and (p) repeating steps (h) through (o) until said calculated actual fault rate is not less than said predetermined fault-rate.

13. A fault simulation unit to carry out first through p-th simulations of a logic circuit model, in response to first through n-th input pattern signals, said logic circuit model including a plurality of circuit elements and a plurality of logic elements, said plurality of circuit elements and said plurality of logic elements being divisible into first through m-th levels, according to a signal flow, the first through m-th levels being logically related to one another, said fault simulation unit comprising:

a preprocessor configured to assign said first through said m-th levels to said plurality of circuit elements and said plurality of logic elements and to obtain logical type data of said plurality of logic elements, input state data of said plurality of logic elements, level control data related to said first through said m-th levels, fault-free event data related to a fault-free execution of said first through said p-th simulations, fault event data related to a faulty execution of said first through said p-th simulations, and fault set data related to said fault event data;

a simulation execute circuit connected to said preprocessor to execute first through p-th fault-free simulations and first through p-th fault simulations, as said first through said p-th simulations, by the use of said logical type data, said input state data, said level control data, said fault-free event data, said fault event data, and said fault set data, said simulation execute circuit producing first through p-th fault-free result signals which are representative of said first through said p-th fault-free simulations, respectively, and producing first through p-th fault result signals which are representative of said first through said p-th fault simulations, respectively; and a postprocessor supplied with said first through said p-th fault-free result signals and said first through said p-th fault result signals to detect whether or not a fault-free event or a fault event occurs in one of said plurality of logic elements, said postprocessor propagating fault-free data to said preprocessor when said fault-free event occurs and fault data to said preprocessor when said fault event occurs, said fault-free data being related to said first through said p-th fault-free simulations, said fault data being related to said first through said p-th fault simulations;

wherein said preprocessor comprises:

a fault-free event memory to store said fault-free event data as stored fault-free event data;

a fault event memory to store said fault event data as stored fault event data;

a control data memory to memorize said level control data as stored level control data and to store element data related to said plurality of circuit elements and said plurality of logic elements as stored element data;

a logical type memory to store said logical type data as stored logical data;

a fault set data generating circuit connected to said fault event memory to generate said fault set data in compliance with said stored fault event data, said fault set data generating circuit generating new fault set data when fault event data are not stored in said fault event memory;

an input state memory connected to said fault-free event memory and supplied with said first through said n-th input pattern signals to store said input state data as memorized input state data; and a selector;

wherein said postprocessor comprises:

a fault-free simulation result memory connected to said simulation execute circuit to store said first through said p-th fault-free result signals as first through p-th stored fault-free result data;

a fault-free event monitoring circuit connected to said simulation execute circuit and said fault-free simulation result memory to monitor whether or not said fault-free event occurs in each of said first through said p-th fault-free simulations, said fault-free event monitoring circuit producing a fault-free event detection signal representative of each fault-free event occurrence;

a fault-free data memory connected to said fault-free event monitoring circuit and said control data memory to store said fault-free data as stored fault-free data when said fault-free data memory is supplied with said fault-free event detection signal;

a fault data memory connected to said simulation execute circuit to store said fault data as stored fault data;

a connection data memory connected to said fault-free data memory and said fault data memory to store connection data, as stored connection data, representative of a connection destination of each of said circuit elements and said logic elements; and a propagation data generating circuit connected to said fault-free data memory, said fault data memory, and said connection data memory to generate propagation data in compliance with said stored fault-free data, said stored fault data, and said stored connection data, said propagation data comprising at least one of said stored fault-free data and said stored fault data; and wherein said selector of said preprocessor is connected to said propagation data generating circuit to select one of said stored fault-free data and said stored fault data as selected data from said propagation data, said selector supplying said selected data as said fault-free event data to said fault-free event memory on selection of said stored fault-free data, said selector supplying said selected data as said fault event data to said fault event memory on selection of said stored fault data.

14. A fault simulation unit as claimed in claim 13, wherein said preprocessor further comprises:

an event flag memory connected to said fault-free and said fault event memories and supplied respectively with said stored fault-free and said stored fault event data, said event flag memory storing flags indicative of whether a fault-free or a fault event takes place in each of said plurality of logic elements in response to said stored fault-free and stored fault event data.

* * * * *